(12) United States Patent
Shibata et al.

(10) Patent No.: US 6,815,868 B2
(45) Date of Patent: Nov. 9, 2004

(54) SURFACE ACOUSTIC WAVE APPARATUS AND COMMUNICATION UNIT

(75) Inventors: Osamu Shibata, Ishikawa-ken (JP); Yuichi Takamine, Kanazawa (JP); Hiroki Watanabe, Ishikawa-ken (JP); Masaru Yata, Ishikawa-ken (JP); Yoichi Sawada, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 178 days.

(21) Appl. No.: 10/118,358

(22) Filed: Apr. 9, 2002

(65) Prior Publication Data

US 2002/0145361 A1 Oct. 10, 2002

(30) Foreign Application Priority Data

| Apr. 9, 2001 | (JP) | 2001-110277 |
| Apr. 9, 2001 | (JP) | 2001-110290 |
| Apr. 17, 2001 | (JP) | 2001-118809 |
| Jun. 1, 2001 | (JP) | 2001-167364 |
| Sep. 7, 2001 | (JP) | 2001-272427 |
| Oct. 22, 2001 | (JP) | 2001-323950 |
| Dec. 11, 2001 | (JP) | 2001-377490 |
| Mar. 5, 2002 | (JP) | 2002-059407 |

(51) Int. Cl.[7] ............................................. H03H 9/25
(52) U.S. Cl. ........................... 310/313 D; 310/313 C
(58) Field of Search ....................... 310/313 B–313 C, 310/313 R, 313 D; 333/193–196

(56) References Cited

U.S. PATENT DOCUMENTS

| 4,322,651 A | * | 3/1982 | Inoue et al. ............. 310/313 B |
| 5,818,310 A | * | 10/1998 | Solie .......................... 333/196 |
| 5,835,990 A | * | 11/1998 | Saw et al. ............... 310/313 D |
| 6,104,260 A | * | 8/2000 | Yamada et al. ............. 333/193 |
| 6,246,150 B1 | * | 6/2001 | Mitobe ..................... 31/313 B |

FOREIGN PATENT DOCUMENTS

| CN | 1245366 | 2/2000 |
| CN | 1286485 | 3/2001 |
| JP | 55-005573 A | 1/1980 |
| JP | 6-204781 A | 7/1994 |
| JP | 10-117123 | 5/1998 |
| JP | 10-126211 | 5/1998 |
| JP | 10-290141 | 10/1998 |
| JP | 11-205073 | 7/1999 |
| JP | 2001-217680 | 8/2001 |
| JP | 2002-314370 | 10/2002 |

* cited by examiner

*Primary Examiner*—Thomas M. Dougherty
*Assistant Examiner*—Karen Beth Addison
(74) *Attorney, Agent, or Firm*—Keating & Bennett

(57) ABSTRACT

A surface acoustic wave apparatus includes three longitudinally-coupled-resonator-type interdigital transducers (IDTs) having a balanced-to-unbalanced conversion function, which are provided on a piezoelectric substrate in a direction in which a surface acoustic wave (SAW) propagates. Weighting is applied to at least one of the IDTs. For example, among the electrode fingers of the IDT located on the left side, an apodization-weighted electrode finger is provided for one of the electrode fingers positioned adjacent to the central IDT.

54 Claims, 73 Drawing Sheets

(a)

SURFACE ACOUSTIC WAVE APPARATUS AND COMMUNICATION UNIT

BACKGROUND OF THE INVENTION

1. Field of the Invention

The present invention relates to a surface acoustic wave (SAW) apparatus for use in, for example, a filter having an unbalanced-to-balanced conversion function, and also relates to a communication unit using the SAW apparatus described above.

2. Description of the Related Art

There has been significant technological progress in decreasing the size and weight of communication units, such as cellular telephones. As the frequency used in cellular telephones is increased, smaller SAW apparatuses are used for filters in the communication units. Additionally, multifunctional components are being developed to reduce the size and the number of the individual components in communication units.

In view of the above background, research is being actively conducted on SAW filters provided with a balanced-to-unbalanced conversion function, i.e., a so-called "balun function", used in the RF stage of cellular telephones. Such SAW filters are used mostly in Global System for Mobile communications (GSM) cellular telephones.

A known SAW filter having a balanced-to-unbalanced conversion function and an input impedance and output impedance that are substantially the same is shown in FIG. 67.

In the SAW filter apparatus shown in FIG. 67, an interdigital transducer (hereinafter referred to as an "IDT") 101 is provided on a piezoelectric substrate 100. IDTs 102 and 103 are provided on the left and right sides of the IDT 101 (in a SAW propagating direction). With this configuration, a three-IDT-type longitudinally-coupled-resonator-type SAW apparatus having a balanced-to-unbalanced conversion function is provided.

In the above-described SAW apparatus, reflectors 104 and 105 are arranged to sandwich the IDTs 102, 101, and 103 therebetween. Terminals 106 and 107 are provided as balanced signal terminals, and a terminal 108 is provided as an unbalanced signal terminal.

Another type of SAW apparatus, which is provided with a balanced-to-unbalanced conversion function and has an input impedance and output impedance that differ by, for example, four times, is disclosed in, for example, Japanese Unexamined Patent Application Publication No. 10-117123.

The SAW apparatus disclosed in the above-identified publication includes, as shown in FIG. 68, a first SAW filter device 111 and a second SAW filter device 112 provided on a piezoelectric substrate. An output signal of the first SAW filter device 111 is 180° out of phase with an output signal of the second SAW filter device 112. The piezoelectric substrate is not shown in FIG. 68. With this configuration, the above-described SAW filter apparatus provides not only a filtering function, but also a balanced-to-unbalanced conversion function.

The first SAW filter device 111 includes cascade-connected three-IDT-type longitudinally-coupled-resonator-type SAW filters 118 and 124 which are symmetrical to each other with respect to the symmetrical line extending along the SAW propagating direction. That is, the first SAW filter device 111 is defined by two stages of filters.

In the longitudinally-coupled-resonator-type SAW filter 118, IDTs 114 and 115 are arranged to sandwich a central IDT 113 on the left and right sides thereof (along the SAW propagating direction), and reflectors 116 and 117 are arranged to sandwich the IDTs 114, 113, and 115. Similarly, in the longitudinally-coupled-resonator-type SAW filter 124, IDTs 120 and 122 are arranged to sandwich a central IDT 119 from the left and right sides, and reflectors 122 and 123 are arranged such that they sandwich the IDTs 120, 119, and 121.

The second SAW filter device 112 includes a cascade-connected longitudinally-coupled-resonator-type SAW filter 128, which is the same type as the longitudinally-coupled-resonator-type SAW filter 124, and a longitudinally-coupled-resonator-type SAW filter 127. The longitudinally-coupled-resonator-type SAW filter 127 is provided with a central IDT 133 whose phase is inverted (i.e., about 180°) by inverting the direction of the central IDT 113 of the longitudinally-coupled-resonator-type SAW filter 118.

One terminal 129 of the first SAW filter device 111 and one terminal 130 of the second SAW filter device 112 are electrically connected in parallel to each other, and the other terminals 131 and 132 are electrically connected in series to each other. The parallel-connected terminals 129 and 130 define an unbalanced terminal 108, while the series-connected terminals 131 and 132 define balanced terminals 107 and 108.

In the SAW apparatus having a balanced-to-unbalanced conversion function, the transmission characteristics within the pass band between the unbalanced terminal 108 and each of the balanced terminals 106 and 107 must have equal amplitude characteristics and 180°-out-of-phase characteristics. Such amplitude characteristics and phase characteristics are referred to as "the amplitude balance level" and "the phase balance level", respectively.

The amplitude balance level and the phase balance level are defined as follows. When the above-described SAW apparatus having a balanced-to-unbalanced conversion function is a three-port device, and when the unbalanced input terminal is port 1 and the balanced output terminals are port 2 and port 3, the amplitude balance level $|A|$ and the phase balance level $|B|$ are defined as follows:

$$A = |20\log(S21)| - |(20\log(S31)| \quad (1)$$

$$B = |\angle S21 - \angle S31| \quad (2)$$

where S21 indicates the transfer factor from port 1 to port 2, and S31 indicates the transfer factor from port 1 to port 3. Ideally, in the pass band of a SAW apparatus, the amplitude balance level is 0 dB, and the phase balance level is 180 degrees.

In the above-described SAW apparatus having balanced signal terminals, the balance levels between the balanced signal terminals are reduced. One of the reasons for this is as follows. The distance (indicated by 109 in FIG. 67) between the electrode finger connected to the balanced signal terminal 106 and the signal electrode finger of the IDT 102 is different from the distance (indicated by 110 in FIG. 67) between the electrode finger connected to the balanced signal terminal 107 and the signal electrode finger of the IDT 103 by 0.5 times the wavelength, which is determined by the pitch of the electrode fingers.

Then, the total capacitance of the electrode fingers connected to the balanced signal terminal 106 is different from that of the electrode fingers connected to the balanced signal terminal 107, and the conversion efficiency between an electrical signal and a SAW also is different between the balanced signal terminals 106 and 107. As a result, the balance levels are reduced.

Accordingly, as shown in FIG. 70, the amplitude characteristics of the frequency output from the balanced signal terminal 106 shown in FIG. 67 were measured by grounding the balanced signal terminal 107. As shown in FIG. 71, the amplitude characteristics of the frequency output from the balanced signal terminal 107 were measured by grounding the balanced signal terminal 106 shown in FIG. 67. The difference between the amplitude characteristics output from the balanced signal terminal 106 and the amplitude characteristics output from the balanced signal terminal 107 is shown in FIG. 69. FIG. 69 shows that there is a large difference between the amplitude characteristics, and this difference causes a reduction in the balance levels.

In the SAW apparatus having cascade-connected filter devices shown in FIG. 68, the polarities of adjacent electrode fingers of two adjacent IDTs are not symmetrical between the first SAW filter device 111 and the second SAW filter device 112. This further reduces the balance levels.

More specifically, in the IDT 113, the portions located adjacent to the IDTs 114 and 115 (indicated by 125 in FIG. 68), i.e., the adjacent outermost electrode fingers between the IDTs 113 and 114, and the adjacent outermost electrode fingers between the IDTs 113 and 115 are ground electrode fingers. However, in the IDT 133, the adjacent outermost electrode fingers between the IDTs 133 and 134 (indicated by 126 in FIG. 68) and between the IDTs 133 and 135 (also indicated by 126 in FIG. 68) are a signal electrode finger and a ground electrode finger. If the polarities of the outermost electrode fingers between the adjacent IDTs are different between the left and right sides, the frequency and the amplitude level of the resonance mode shown in FIGS. 72A and 72B are changed by the conversion between an electrical signal and a SAW.

If a SAW apparatus having a balanced-to-unbalanced conversion function including two longitudinally-coupled-resonator-type SAW filter devices having different combinations of the outer electrode fingers of the adjacent IDTs, as in the SAW apparatus shown in FIG. 68, a change in the resonance mode reduces the balance levels between the balanced signal terminals.

A change in the resonance mode is also produced in a SAW filter apparatus defined by a single longitudinally-coupled-resonator-type SAW filter device, such as that shown in FIG. 73, thereby reducing the balance levels between the balanced signal terminals.

SUMMARY OF THE INVENTION

In order to overcome the above-described problems, preferred embodiments of the present invention provide a SAW apparatus having a balanced-to-unbalanced conversion function which has outstanding balance levels between balanced signal terminals by offsetting a difference between the balanced signal terminals, and a communication unit including such a novel SAW apparatus.

According to one preferred embodiment of the present invention, a SAW apparatus includes at least one SAW filter having at least two IDTs arranged on a piezoelectric substrate in a SAW propagating direction, and an input signal terminal and an output signal terminal for the SAW filter. At least one of the input signal terminal and the output signal terminal is connected to a balanced signal terminal, and weighting is provided to at least a portion of electrode fingers of the SAW filter.

With this configuration, by applying weighting to at least a portion of the electrode fingers of the SAW filter, balance characteristics (at least one of the amplitude balance, the phase balance, and the transmission characteristics) between balanced signal terminals can be adjusted. Thus, the balance characteristics are greatly improved.

In the aforementioned SAW apparatus, the above-described weighting is preferably applied to at least a portion of the electrode fingers so as to improve at least one of the amplitude balance level and the phase balance level between a pair of the balanced signal terminals.

The weighting may be applied to a few electrode fingers including the outermost electrode finger of at least one of the IDTs located adjacent to the other IDT.

The weighting may be applied to a few electrode fingers in the vicinity of the outermost electrode finger of at least one of the IDTs located adjacent to the other IDT.

The weighting may be applied to the electrode fingers located within one half of a length in the SAW propagating direction from the outermost electrode finger of at least one of the IDTs located adjacent to the other IDT.

The weighting may be applied to the outermost electrode finger of at least one of the IDTs adjacent to the other IDT.

The electrode fingers located in a portion between the adjacent IDTs may be a ground electrode finger and a signal electrode finger, and the weighting may be applied to at least one of the ground electrode finger and the signal electrode finger.

The weighting may be applied to a signal electrode finger of the SAW filter.

The weighting may be applied to at least part of the electrode fingers of the IDT connected to the balanced signal terminal of the SAW filter.

The phase of at least one of the IDT may be inverted with respect to the phase of the other IDT, and the weighting may be applied to at least part of the electrode fingers of the phase-inverted IDT.

The above-described weighting may be withdrawal weighting.

A dummy electrode may preferably be provided for a bus bar which faces a bus bar connected to the withdrawal-weighted electrode finger.

The weighting may be applied to at least two continuous ground electrode fingers including the outermost electrode finger of at least one of the IDT connected to the input signal terminal and the IDT connected to the output signal terminal, the ground electrode fingers being located such that they are adjacent the other IDT.

A ground connecting portion may be provided to connect the electrode fingers of the adjacent IDTs which are connected to a ground via the dummy electrode.

The above-described weighting may be apodization weighting in which the interdigital length of at least a portion of the electrode fingers is differentiated from the interdigital length of the other electrode fingers.

The above-described apodization weighting is preferably applied at the approximate center of the interdigital length.

The apodization weighting may further be applied to the electrode finger adjacent to the apodization-weighted electrode finger, and a bending dummy electrode may be arranged such that it faces each of the two apodization-weighted electrode fingers.

The apodization-weighted electrode finger may be the outermost electrode finger of one of the adjacent IDTs, and a dummy electrode may be provided for the other IDT such that the dummy electrode faces the apodization-weighted electrode finger.

The dummy electrode may be grounded.

The above-described weighting may be duty weighting in which the duty of at least a portion of the electrode fingers is different from the duty of the other electrode fingers.

In the aforementioned SAW apparatus, the SAW filter may include at least three IDTs, and withdrawal-weighting may be applied to at least one of the adjacent IDTs, and the weighting applied to the IDT on one side of the SAW filter may be different from the weighting applied to the IDT on the other side of the SAW filter.

In the aforementioned SAW apparatus, two SAW filters may be provided in which withdrawal-weighting is applied to each of the SAW filters, and the weighting applied to one of the SAW filter is different from the weighting applied to the other SAW filter.

The SAW filter may include at least three adjacent IDTs, in which apodization-weighting is applied to a few electrode fingers other than the outermost electrode finger of at least one of the adjacent IDTs on one side of the SAW filter, and withdrawal-weighting is applied to the outermost electrode finger of at least one of the adjacent IDTs on the other side of the SAW filter. A dummy electrode connected to a bus bar which faces a bus bar connected to the withdrawal-weighted electrode finger is provided in the withdrawal-weighted portion.

The SAW filter may include at least three adjacent IDTs, in which duty-weighting is applied to the outermost electrode finger of at least one of the adjacent IDTs on one side of the SAW filter such that the duty of the outermost electrode finger is different from the duty of the other electrode fingers, and withdrawal-weighting is applied to the outermost electrode finger of at least one of the adjacent IDTs on the other side of the SAW filter. A dummy electrode connected to a bus bar which faces a bus bar connected to the withdrawal-weighted electrode finger is provided in the withdrawal-weighted portion.

In the aforementioned SAW apparatus, two SAW filters may be provided, in which apodization-weighting is applied to a few electrode fingers other than the outermost electrode finger of at least one of the adjacent IDTs of one of the SAW filters, and withdrawal-weighting is applied to the outermost electrode finger of at least one of the adjacent IDTs of the other SAW filter. A dummy electrode connected to a bus bar which faces a bus bar connected to the withdrawal-weighted electrode finger is provided in the withdrawal-weighted portion.

The SAW filter may be constructed such that it has a balanced-signal-input and balanced-signal-output filtering function.

The SAW filter may be constructed such that it has a balanced-signal-input and unbalanced-signal-output filtering function or an unbalanced-signal-input and balanced-signal-output filtering function.

At least one of the IDTs may be divided into two portions in the direction of the interdigital length of the IDT.

A pair of the balanced signal terminals may be connected to comb-like electrodes of one of the IDTs.

At least one of the IDTs may be divided into two portions in the direction in which the SAW propagates.

A grounded electrical neutral point is not necessarily provided between a pair of the balanced signal terminals.

In the aforementioned SAW apparatus, two SAW filters may be provided such that they have a balanced-signal-input and balanced-signal output filtering function.

The two SAW filters may be arranged such that an output signal of one of the SAW filter is about 180° out of phase with an output signal of the other SAW filter, and the SAW filters are constructed such that they have a balanced-signal-input and unbalanced-signal-output filtering function or an unbalanced-signal-input and balanced-signal-output filtering function.

A SAW filter may be cascade-connected to the unbalanced signal terminal.

The SAW filter may be a longitudinally-coupled-resonator-type SAW filter.

The above-described longitudinally-coupled-resonator-type SAW filter may include an odd number of IDTs.

The longitudinally-coupled-resonator-type SAW filter may include three IDTs.

The total number of electrode fingers of at least one of the IDTs of the longitudinally-coupled-resonator-type SAW filter may be an even number.

In the aforementioned SAW apparatus, at least three IDTs may be provided, and the total number of the electrode fingers of at least the IDT connected to the balanced signal terminal being an even number.

In the aforementioned SAW apparatus, three IDTs may be provided, and the total number of the electrode fingers of at least the IDT located at the approximate center of the IDTs being an even number.

At least one SAW resonator may be connected in series to or in parallel with the SAW filter.

The SAW filter may include at least two cascade-connected SAW filter portions.

According to another preferred embodiment of the present invention, a SAW apparatus includes an input IDT having a plurality of electrode fingers and an output IDT having a plurality of electrode fingers. The input IDT and the output IDT are arranged on a piezoelectric substrate in a SAW propagating direction so as to define a longitudinally-coupled-resonator-type. Weighting is applied to an inner electrode finger other than the outermost electrode finger of at least one of the input IDT and the output IDT.

One of the input IDT and the output IDT is preferably connected to a balanced side, and the input IDT or the output IDT connected to the balanced side preferably includes the weighted electrode finger. The SAW apparatus is provided with an unbalanced-to-balanced conversion function.

With this configuration, by providing a weighted electrode finger for at least one of the input IDT and the output IDT, balance characteristics (amplitude balance, phase balance, and transmission characteristics) between output signals, in particular, between balanced output signals, can be adjusted. As a result, the balance characteristics are greatly improved.

In the aforementioned SAW apparatus, the weighted electrode finger may be located within one half of a total width of all the electrode fingers of the corresponding IDT from the outermost electrode finger of the IDT.

At least two ground electrode fingers including the outermost electrode finger of at least one of the input IDT and the output IDT are preferably sequentially provided, the outermost electrode finger being located such that it faces the other IDT.

With this arrangement, for example, the balanced output signals can be easily and reliably set about 180° out of phase with each other.

The weighted electrode finger may be preferably set such that it controls the area of a no-electric-field portion provided between adjacent ground electrode fingers of at least one of the input IDT and the output IDT.

One of the input IDT and the output IDT may be connected to a balanced side, and the area of the no-electric-field portion of one of the two balanced IDTs may be substantially equal to the area of the non-electric-field portion of the other balanced IDT.

With this arrangement, the conversion balance from SAW energy to electric energy between the IDTs, in particular, between the output IDTs, can be adjusted, thereby greatly improving balance characteristics.

A first grounded balance electrode finger is preferably arranged to extend toward the weighted electrode finger such that the length of the first grounded balance electrode finger is substantially equal to the length of the weighted electrode finger.

With this arrangement, the first grounded balance electrode finger compensates for the no-electrode-finger portion provided by the shorter weighted electrode finger. Thus, a reduction in the balance characteristics caused by the no-electrode-finger portion is prevented.

A second grounded balance electrode finger may be arranged to extend in a direction different form the direction of the weighted electrode finger such that the length of the second grounded balance electrode finger is substantially equal to the length of the weighted electrode finger, and a bending dummy electrode is arranged to face the second grounded balance electrode finger and the weighted electrode finger.

With this arrangement, by providing a dummy electrode, the transmission characteristics are greatly improved while maintaining a high level of balance characteristics.

According to a further preferred embodiment of the present invention, a communication unit including one of the above-described SAW apparatuses is provided. By including the SAW apparatus having outstanding transmission characteristics, the communication unit also has outstanding transmission characteristics.

Other features, elements, characteristics and advantages of the present invention will become more apparent from the following detailed description of preferred embodiments thereof with reference to the attached drawings.

BRIEF DESCRIPTION OF THE DRAWINGS

FIG. 72A is a graph illustrating the frequency of the resonance modes; and FIG. 72B illustrates the current distribution of the resonance modes.

DETAILED DESCRIPTION OF PREFERRED EMBODIMENTS

The present invention is described in detail below with reference to FIGS. 1 through 66 through illustration of preferred embodiments.

Figure 1:
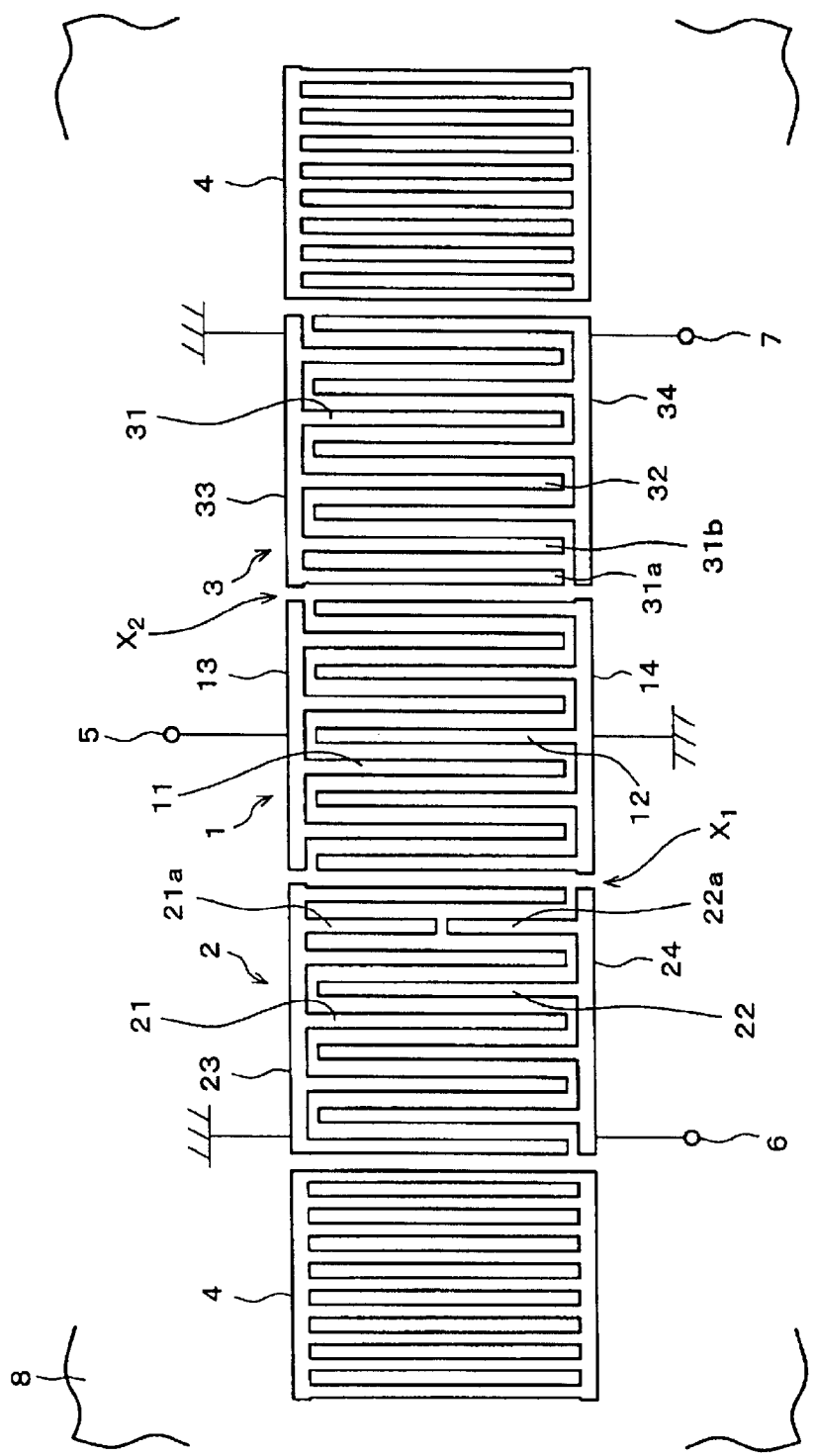
FIG. 1 is a schematic diagram illustrating a SAW apparatus according to a first preferred embodiment of the present invention.

FIG. 1 illustrates a SAW apparatus constructed in accordance with a first preferred embodiment of the present invention. The SAW apparatus shown in FIG. 1 has an unbalanced-to-balanced conversion function and a filtering function, and includes an input IDT 1, output IDTs 2 and 3 provided on the left and right sides of the input IDT 1 (along a SAW propagating direction), and reflectors 4 provided outside the output IDTs 2 and 3 on a piezoelectric substrate 8. The input side and the output side are interchangeable.

More specifically, the output IDTs 2 and 3 are arranged such that they sandwich the input IDT 1 therebetween. The reflectors 4 are arranged such that they sandwich the IDTs 2, 1, and 3 therebetween, to reflect a propagating SAW. The piezoelectric substrate 8 is made of, for example, a 40±5° Y-cut X-propagating $LiTaO_3$, although other substrates may also be used.

Each of the IDTs 1, 2, and 3 includes a strip-shaped base portion (bus bar) and two electrode portions provided with a plurality of strip-shaped electrode fingers. The electrode fingers extend substantially perpendicularly from one side of the base portion such that they are substantially parallel to each other with substantially uniform gaps disposed therebetween. The electrode fingers also interdigitate with each other such that the sides thereof face each other.

In the above-described IDTs 1, 2, and 3, the signal conversion characteristics and the pass band are determined by setting the length and the width of each electrode finger, the pitch between adjacent electrode fingers, and the length by which the interdigitated electrode fingers face each other (hereinafter referred to as the "interdigital length"). In an example of the first preferred embodiment, the number of electrode fingers of the IDT 1 is 39, and the number of electrode fingers of each IDT 2 or 3 is 23.

The electrode fingers, the bus bars, and the reflectors 4 are made of, for example, an aluminum (Al) electrode (foil), formed on the piezoelectric substrate 8 by, for example, a photolithographic technique or other suitable process.

In the first preferred embodiment, in order to input an unbalanced signal and to output balanced signals, in the input IDT 1, signal electrode fingers 11 connected to an unbalanced input terminal 5 and ground electrode fingers 12 are interdigitated with each other as described above.

In the above-described IDT 1, the ground electrode fingers 12 are arranged such that the outermost electrode fingers, which are located at both ends in a SAW propagating direction, of the IDT 1 define ground electrode fingers 12. The outermost electrode fingers are arranged to face one of the outermost electrode fingers of the IDT 2 and one of the outermost electrode fingers of the IDT 3.

In the IDT 2, signal electrode fingers 22 connected to a balanced output terminal 6 and ground electrode fingers 21 are interdigitated with each other as described above. A bus bar 23 connected to the ground electrode fingers 21 is substantially aligned with a bus bar 13 connected to the signal electrode fingers 11 of the input IDT 1. The outermost electrode fingers of the IDT 2, which are arranged at both ends in a SAW propagating direction, define the ground electrodes 21.

In the IDT 3, signal electrode fingers 32 connected to a balanced output terminal 7 and ground electrode fingers 31 are interdigitated with each other as described above. A bus bar 33 connected to the ground electrode fingers 31 is substantially aligned with the bus bar 13 connected to the signal electrode fingers 11 of the input IDT 1.

A bus bar 14 connected to the ground electrode fingers 12 of the IDT 1 is substantially aligned with a bus bar 24 of the signal electrode fingers 22 of the IDT 2 and to a bus bar 34 of the signal electrode fingers 32 of the IDT 3.

In the first preferred embodiment, the output IDTs 2 and 3 are structurally inverted with respect to each other. More specifically, in the IDT 2, the ground electrode fingers 21 and the signal electrodes 22 are alternately arranged, such as a ground electrode finger, a signal electrode finger, a ground electrode finger, and so on, starting from the electrode finger adjacent to the IDT 1. In contrast, in the IDT 3, the signal electrode fingers 32 and the ground electrode 31 fingers are alternately arranged, such as a signal electrode finger, a ground electrode finger, a signal electrode finger, and so on, starting from the electrode finger adjacent to the IDT 1.

With this arrangement, the amplitude difference between the IDTs 2 and 3 is approximately 0, and the phase difference therebetween is approximately 180°. Accordingly, the SAW apparatus performs a balanced-to-unbalanced conversion function.

In the first preferred embodiment, withdrawal weighting is applied to the outermost electrode finger of the IDT 3 adjacent to the IDT 1. A ground dummy electrode 31a is provided at a location at which the outermost electrode finger is withdrawal-weighted. In this specification withdrawal weighting means that an electrode finger is withdrawn, and another electrode finger is replaced. Accordingly, two ground electrodes, i.e., the dummy electrode 31a and a ground electrode finger 31b, are sequentially arranged in the IDT 3 adjacent to the IDT 1.

Additionally, in the first preferred embodiment, an apodization-weighted electrode finger 22a is provided at the location at which the signal electrode finger 22 next to the ground electrode finger 21 (outermost electrode finger) adjacent to the input IDT 1 is located. In this specification, apodization weighting means that the interdigital length of an electrode finger is changed. The length of the apodization-weighted electrode finger 22a is about one half the length of the other signal electrode fingers 22. That is, the interdigital length is adjusted.

A strip-shaped dummy electrode, which is an offset electrode finger, (first balance electrode finger) 21a extending from the grounded bus bar 23 is provided to fill in a space generated by the apodization-weighted electrode finger 22a. The dummy electrode 21a extends toward the forward end of the apodization-weighted electrode finger 22a such that it is substantially parallel to the adjacent ground electrode fingers 21 with substantially uniform gaps disposed therebetween.

Figure 2:
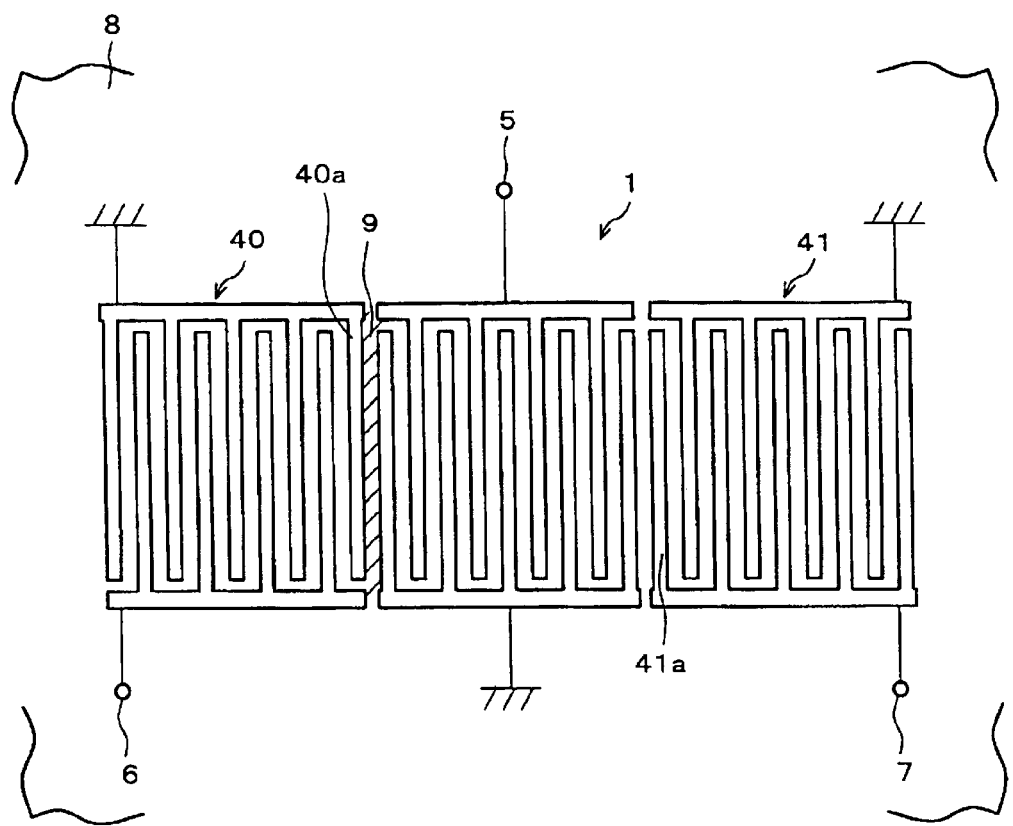
FIG. 2 illustrates the essential configuration of a SAW apparatus of a first comparative example.

The operation and the advantages of the first preferred embodiment are as follows. For comparison, the schematic configuration of IDTs, which are not withdrawal-weighted or apodization-weighted, of a SAW apparatus having a balanced-to-unbalanced conversion function is shown in FIG. 2 as a first comparative example. In the configuration of the first comparative example, ground electrode fingers are provided between the IDT 1 and an IDT 40, while a signal electrode finger and a ground electrode finger are provided between the IDT 1 and an IDT 41. Accordingly, a no-electric-field portion 9 in which the conversion between an electrical signal and a SAW is not performed is provided between the IDT 1 and the IDT 40. In contrast, the conversion between an electrical signal and a SAW is performed between the IDTs 1 and 41. Thus, the frequency and the amplitude level of a signal output from the balanced signal terminal 6 is different from those of a signal output from the balanced signal terminal 7. Additionally, the signals output from the balanced signal terminals 6 and 7 are not substantially 180° out of phase with each other. As a result, the balance levels between the balanced signal terminals 6 and 7 are reduced.

Figure 3:
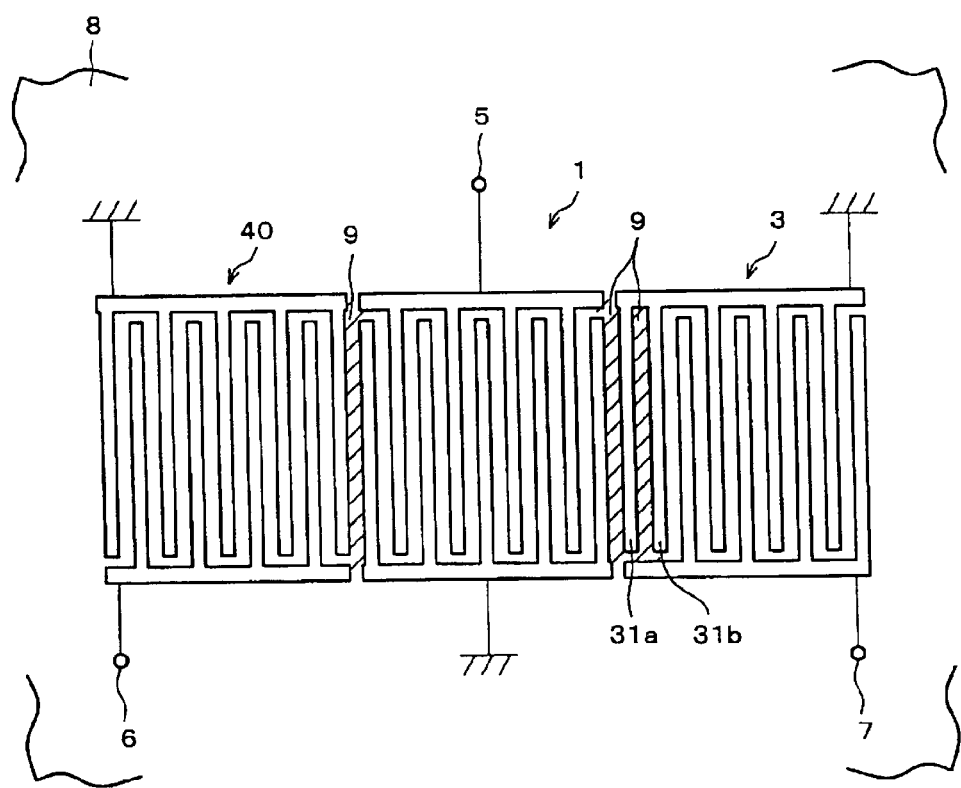
FIG. 3 is a schematic diagram illustrating a SAW apparatus according to a modification of the first preferred embodiment of the present invention.

In the first preferred embodiment, the signal electrode finger of the IDT 41 adjacent to the ground electrode of the IDT 1 is withdrawal-weighted, as shown in FIG. 3, and the dummy electrode 31a is provided at the position in which the signal electrode finger is withdrawal-weighted. That is, the two ground electrode fingers are provided in the IDT 3 adjacent to the IDT 1. Accordingly, a difference of the conversion efficiency between an electrical signal and a SAW between the IDTs 1 and 3 and the IDTs 1 and 40 is offset. Thus, a SAW apparatus having greatly improved balance levels between the balanced signal terminals 6 and 7 is provided.

The provision of the dummy electrode 31a also prevents an increase in the loss caused by converting a SAW into a bulk wave. Thus, a SAW apparatus having very low insertion loss within the pass band is provided. The dummy electrode 31a does not have to be grounded, and may be a floating electrode. In this case, however, the balance levels between the balanced signal terminals 6 and 7 are slightly reduced. Thus, the electrode 31a is preferably grounded.

Figure 4:
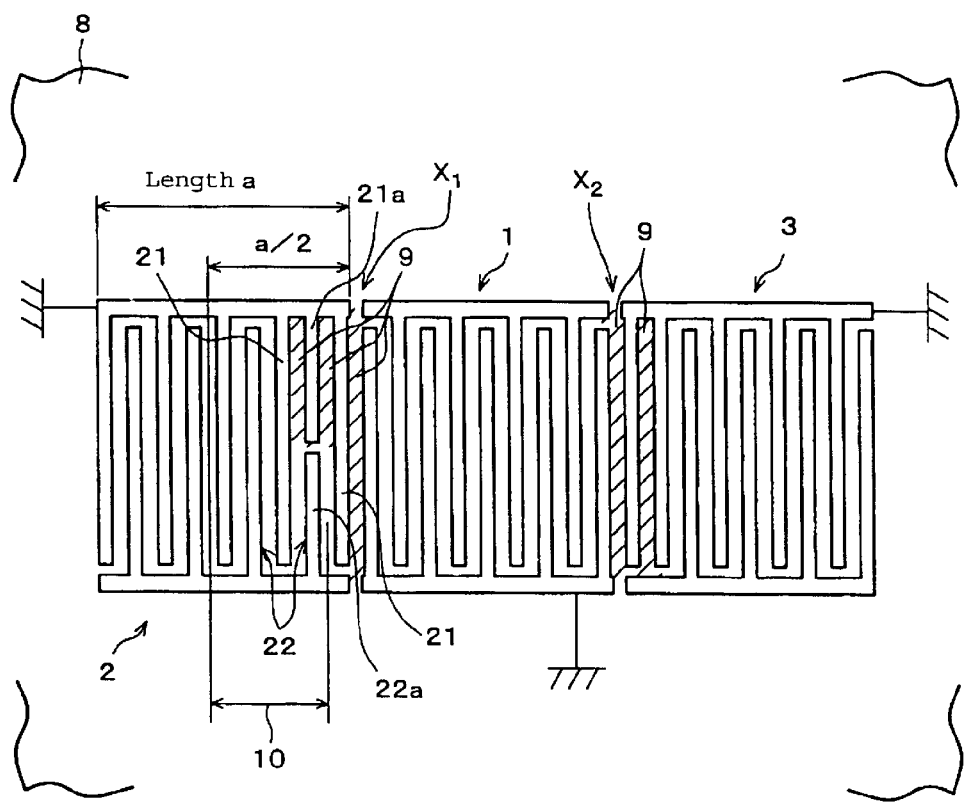
FIG. 4 is a schematic diagram illustrating a weighted area of the SAW apparatus of the first preferred embodiment of the present invention.

In the configuration shown in FIG. 3, however, the no-electric-field portion 9 provided in the IDTs 1 and 3 is larger than that provided in the IDTs 1 and 40. Accordingly, sufficient balance levels between the balanced signal terminal 6 and 7 are not obtained. Thus, the apodization-weighted electrode finger 22a is provided, as shown in FIG. 4, at the position in which the signal electrode finger 22 adjacent to the outermost electrode finger 21 is located, and the dummy electrode 21a is also provided. Accordingly, the size of the no-electric-field portion 9 in a boundary area X1 between the IDTs 1 and 2 is substantially equal to that in a boundary area X2 between the IDTs 1 and 3. Thus, a SAW apparatus having further improved balance levels between the balanced signal terminals 6 and 7 is provided.

The dummy electrode 21a also prevents an increase in the loss caused by converting a SAW into a bulk wave. Thus, a SAW apparatus having very low insertion loss within the pass band is provided.

The grounded dummy electrodes 21a and 31a define the no-electric-field portions 9 with the adjacent ground electrode fingers 21 and 31b, respectively. Accordingly, the size of the no-electric-field portion 9 (an area in which the capacitance is formed) is controlled by providing the dummy electrodes 21a and 31a, which is discussed in detail below.

Concerning the above-described apodization weighting, since a smaller weight is required for the signal electrode fingers, the no-electric-field portion 9 is adjusted more efficiently by weighting the signal electrode fingers. However, apodization weighting may be applied to the ground electrodes.

Figure 72A:
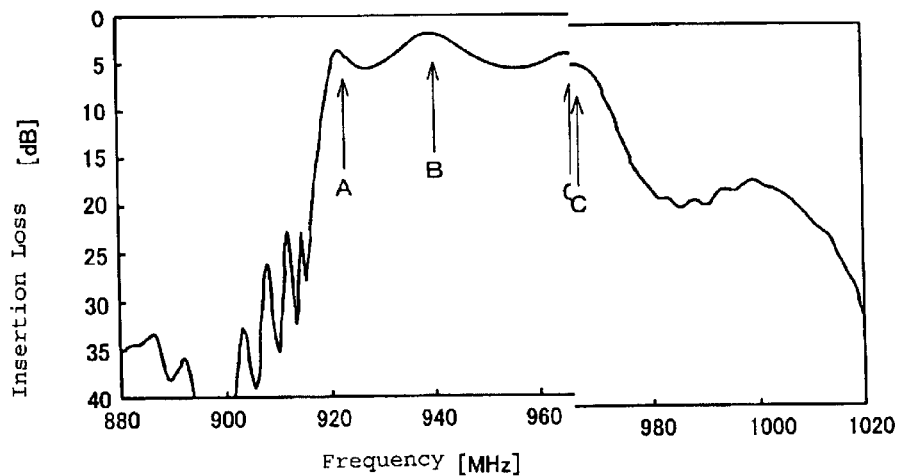
FIGS. 72A and 72B illustrate resonance modes in a SAW apparatus.
Figure 72B:
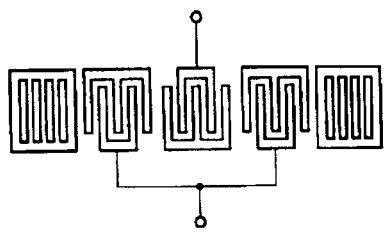
Figure 72B:
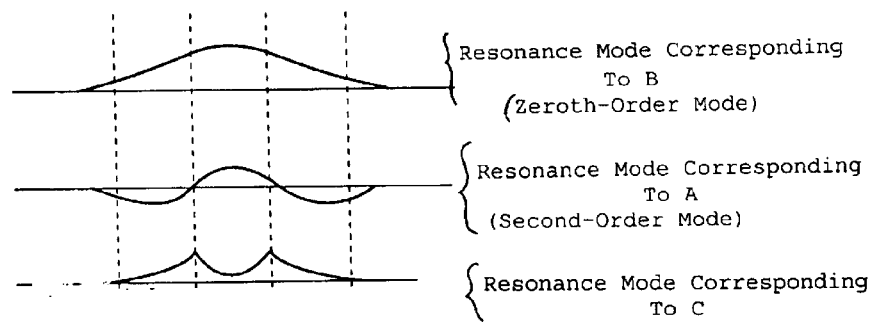
Figure 73:
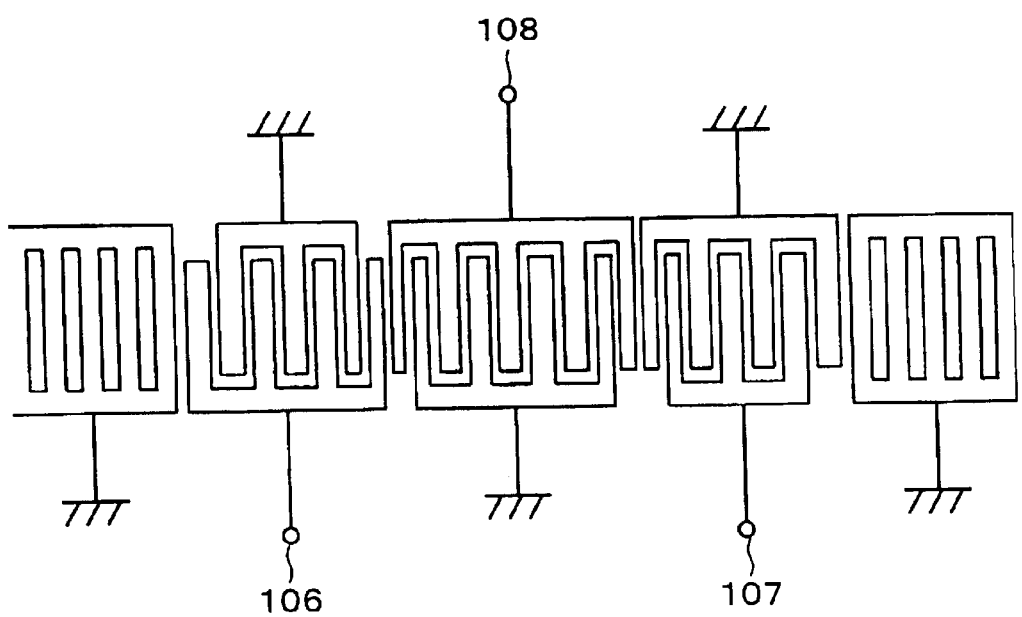
FIG. 73 is a schematic diagram illustrating the SAW apparatus of the third comparative example.

Although, in the first preferred embodiment, a weight is applied to the outermost electrode finger of the IDT 3, and a weight is applied to the electrode finger adjacent to the outermost electrode finger of the IDT 2, a weight may be applied to any electrode finger. However, in the resonance mode in the highest frequency range of the pass band (resonance mode indicated by C in FIGS. 72A and 72B), which is most vulnerable to a difference in polarity between electrode fingers of adjacent IDTs, the current is most sharply changed at the electrode fingers between the adjacent IDTs, as shown in FIG. 72B. Thus, it is more effective, as shown in FIG. 4, to apply the weight within a range of about ½ of the SAW propagation length "a" in the IDT 2 from the outermost electrode finger adjacent to the IDT 1.

In the first preferred embodiment, apodization weighting is performed by providing the apodization-weighted electrode finger 22a, having a length that is about one half the signal electrode finger 22. However, the amount apodization weighting may be adjusted as required. For example, the signal electrode finger 22 close to the IDT 1 may be apodization-weighted by about one fourth, and the subsequent signal electrode finger 22 may be apodization-weighted by about one fourth. In this case, advantages similar to those obtained by the first preferred embodiment are achieved.

Figure 5:
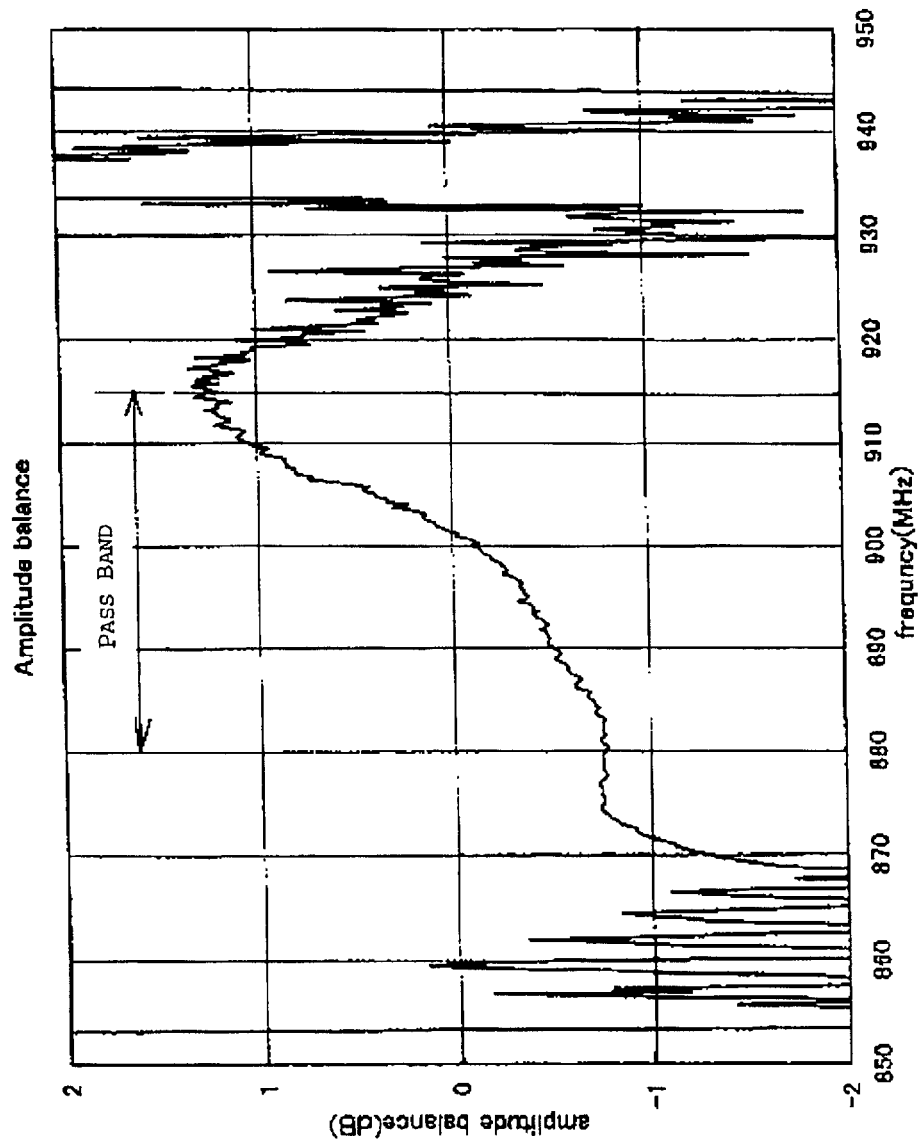
FIG. 5 is a graph illustrating the amplitude balance level (amplitude balance) of the SAW apparatus of the first preferred embodiment of the present invention.
Figure 6:
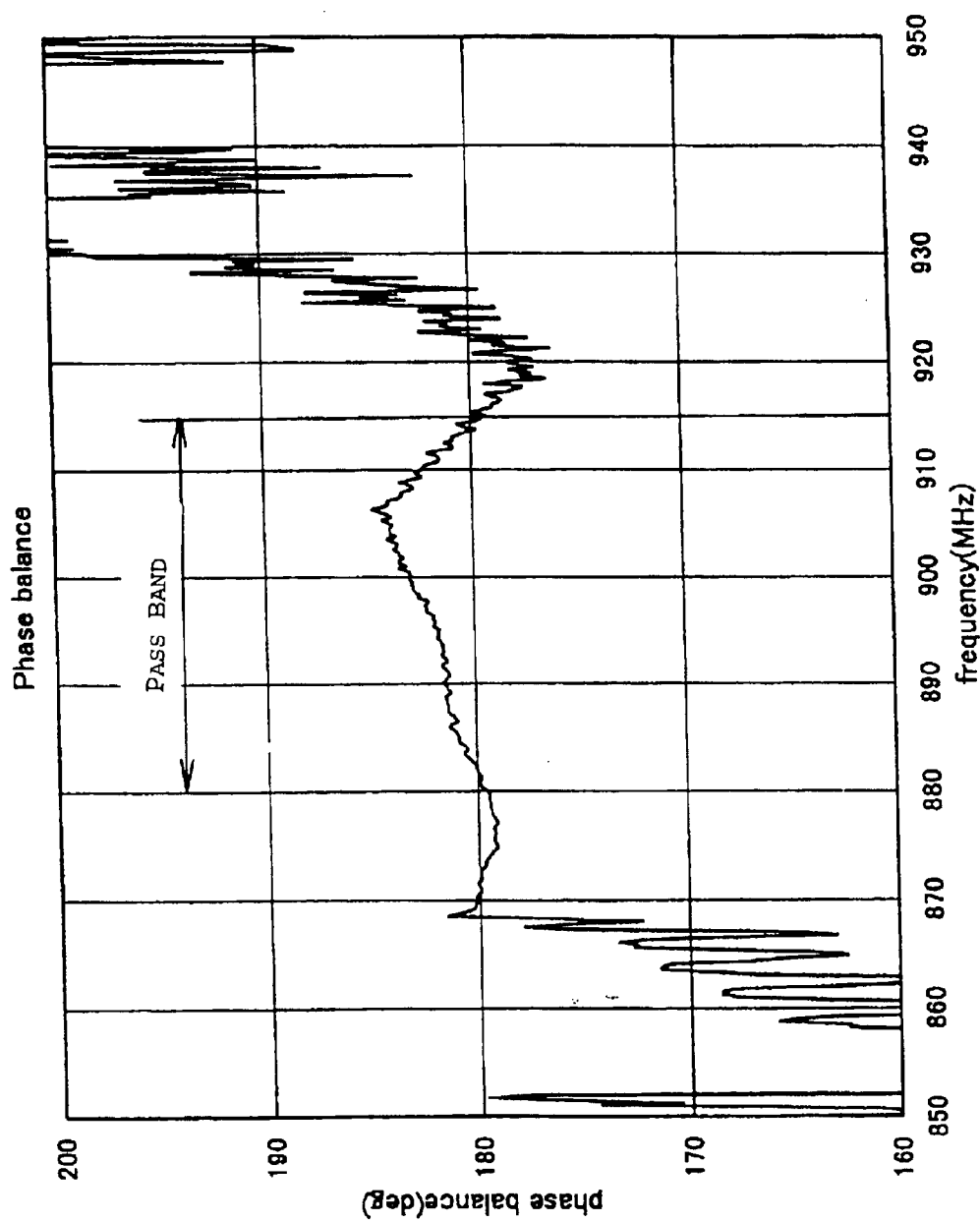
FIG. 6 is a graph illustrating the phase balance level (phase balance) of the SAW apparatus of the first preferred embodiment of the present invention.
Figure 7:
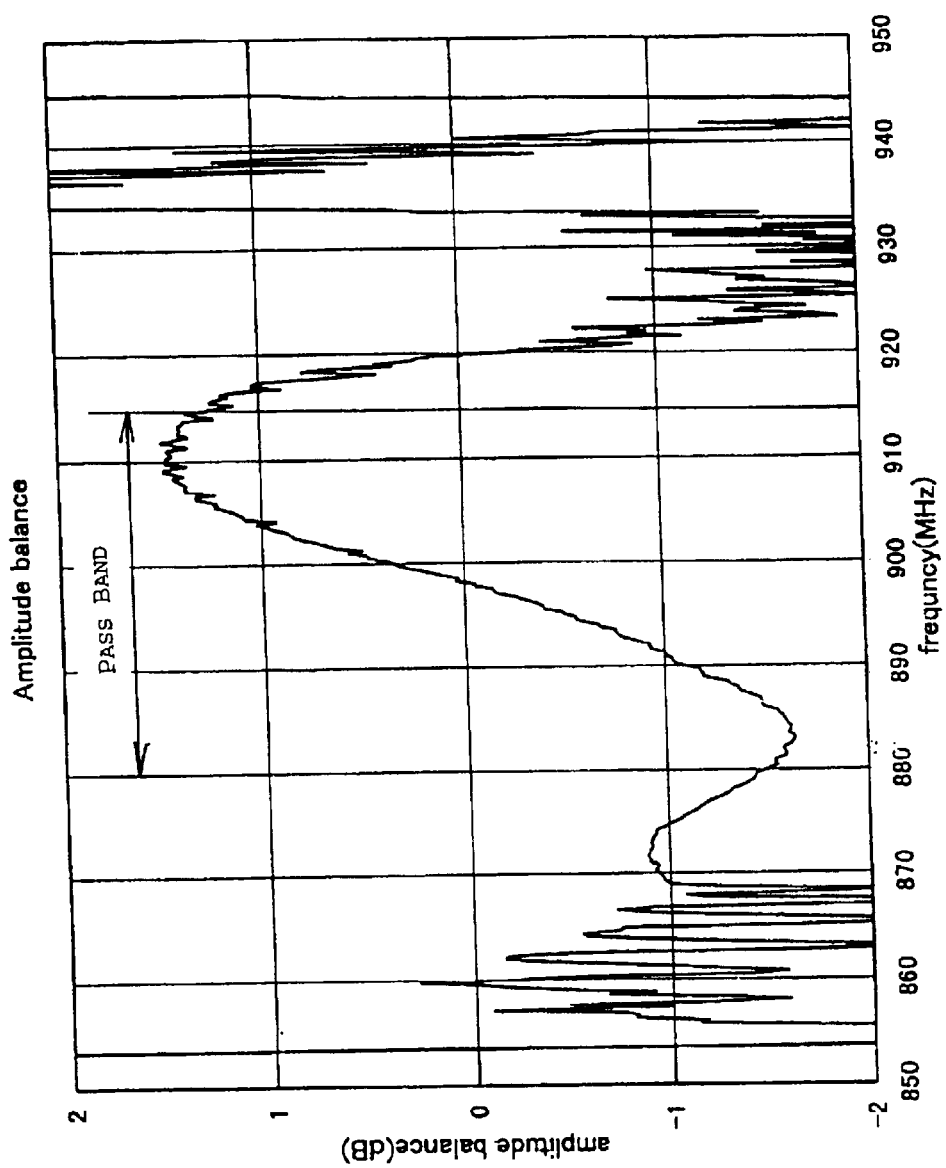
FIG. 7 is a graph illustrating the amplitude balance level (amplitude balance) of the SAW apparatus of the first comparative example.
Figure 8:
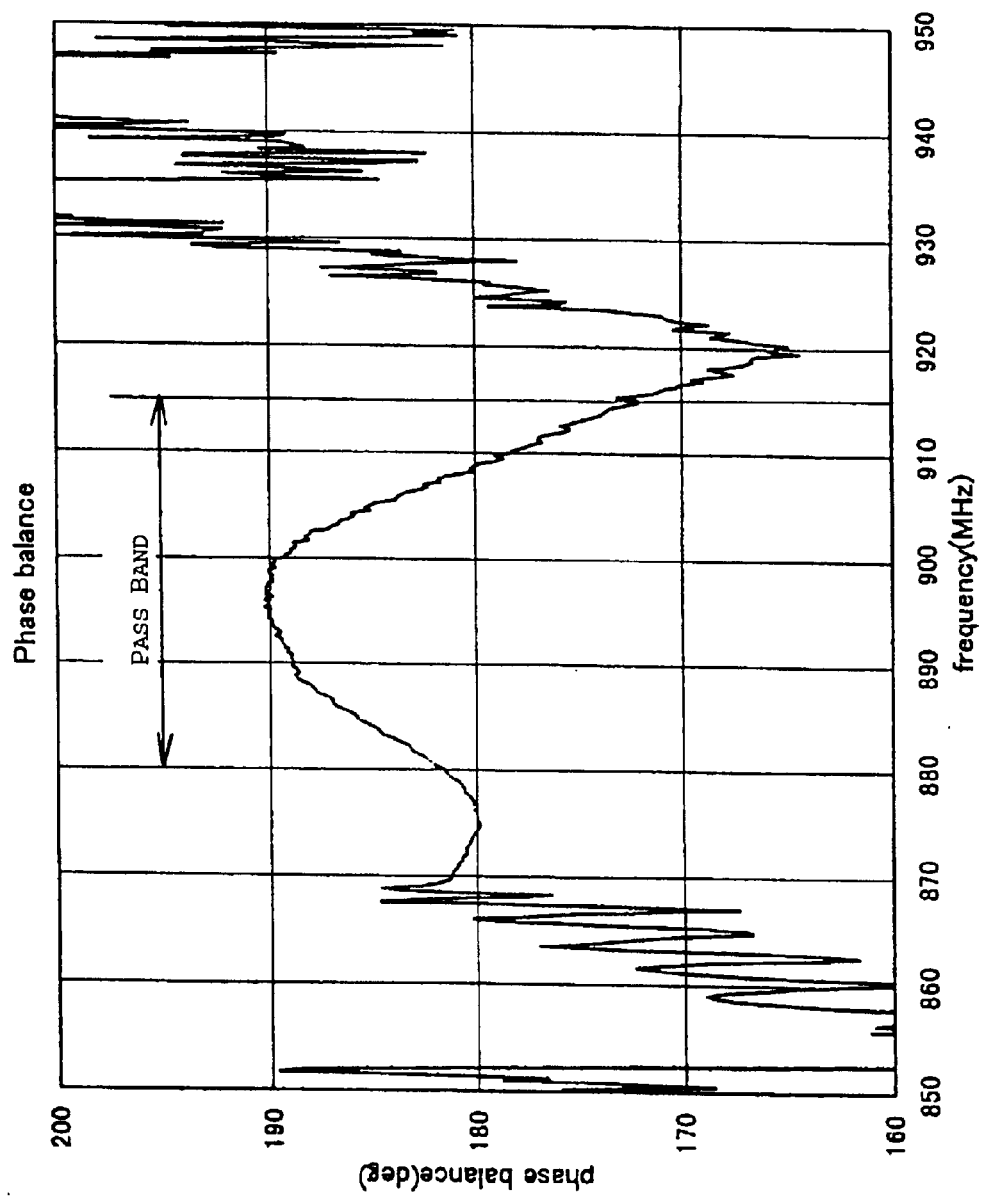
FIG. 8 is a graph illustrating the phase balance level (phase balance) of the SAW apparatus of the first comparative example.

The amplitude balance level and the phase balance level between the balanced signal terminals 6 and 7 with respect to the frequency obtained by the first preferred embodiment are shown in FIGS. 5 and 6, respectively. For comparison, the amplitude balance level and the phase balance level between the balanced signal terminals 6 and 7 with respect to the frequency in the first comparative example shown in FIG. 2 are shown in FIGS. 7 and 8, respectively. The frequency range of the pass band for Extended Global System for Mobile Communication (EGSM) transmission filters is 880 MHz to 915 MHz.

The amplitude balance level between the balanced signal terminals 6 and 7 with respect the above-mentioned frequency range ranges from −1.6 dB to +1.5 dB (having a deviation of 3.1 dB) for the first comparative example, while the corresponding amplitude balance level ranges from about −0.7 dB to about +1.2 dB (having a deviation of 1.9 dB) for the first preferred embodiment. The level of the amplitude balance level is greatly improved with a reduced deviation. Thus, in the first preferred embodiment, the amplitude balance level is improved by about 1.2 dB. The phase balance level between the balanced signal terminals 6 and 7 for the first comparative example ranges from 172° to 189° (having a deviation of 17°), while the corresponding phase balance for the first preferred embodiment ranges from 178° to 184° (having a deviation of 6°). The level of the phase balance level is greatly improved with a reduced deviation. Thus, in the first preferred embodiment, the phase balance level is improved by about 11°.

As described above, in the first preferred embodiment, weighting is applied to the SAW apparatus having the balanced-to-unbalanced conversion function by using a single longitudinally-coupled-resonator-type SAW filter device. Thus, a SAW apparatus having greatly improved balance levels between the balanced signal terminals 6 and 7 over known SAW apparatuses is provided.

In the first preferred embodiment, a single three-IDT-type longitudinally-coupled-resonator-type SAW filter device is used. However, the present invention is not restricted to this configuration, and the SAW apparatus may be configured in any manner as long as it is provided with the balanced signal terminals 6 and 7. In this case, advantages similar to those obtained by the first preferred embodiment can be achieved.

Figure 9:
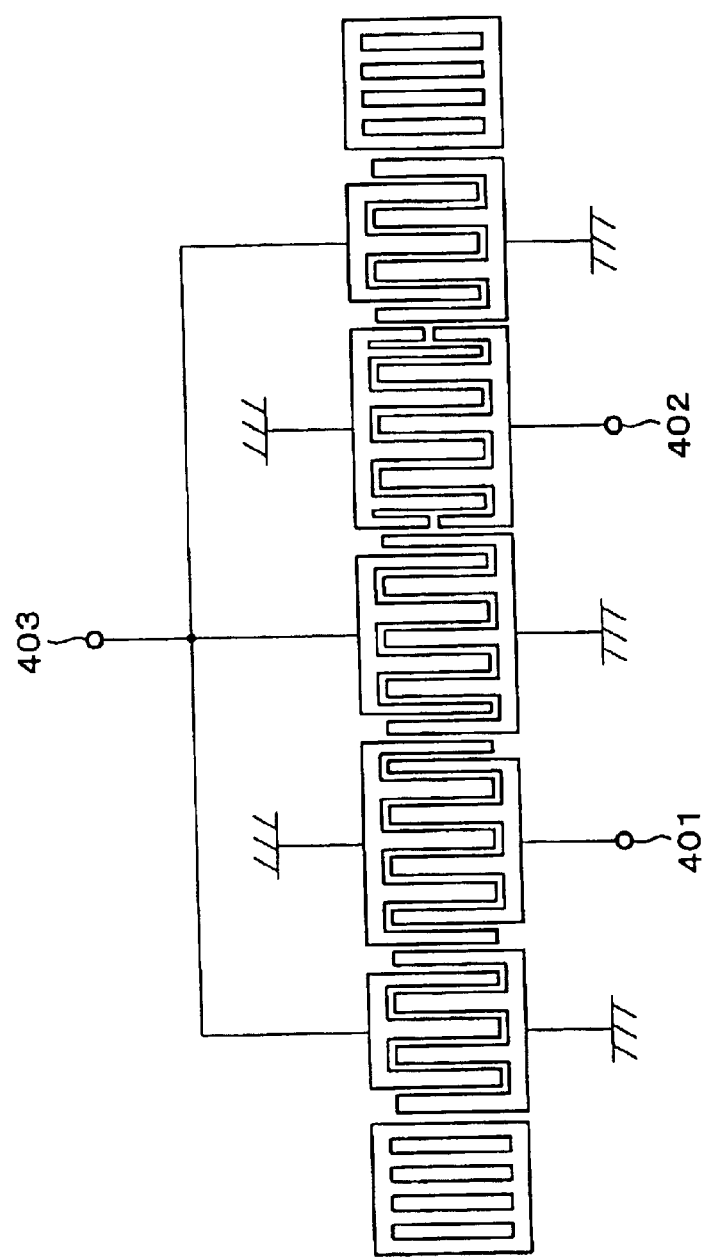
FIG. 9 is a schematic diagram illustrating another modification made to the first preferred embodiment of the present invention.

For example, FIG. 9 illustrates a SAW apparatus having a balanced-to-unbalanced conversion function using a longitudinally-coupled-resonator-type SAW filter having five IDTs (balanced signal terminals 401 and 402, and an unbalanced signal terminal 403). As in this type of SAW apparatus, in a SAW apparatus using a longitudinally-coupled-resonator-type SAW filter having more than three-IDTs or having two IDTs, the same advantages of the present invention are achieved. The type of filter used in the present invention is not limited to a longitudinally-coupledresonator-type SAW filter, and a transversal SAW filter or a length-coupled-resonator-mode SAW filter may be provided, in which case, advantages similar to those obtained by the first preferred embodiment are achieved.

Figure 10:
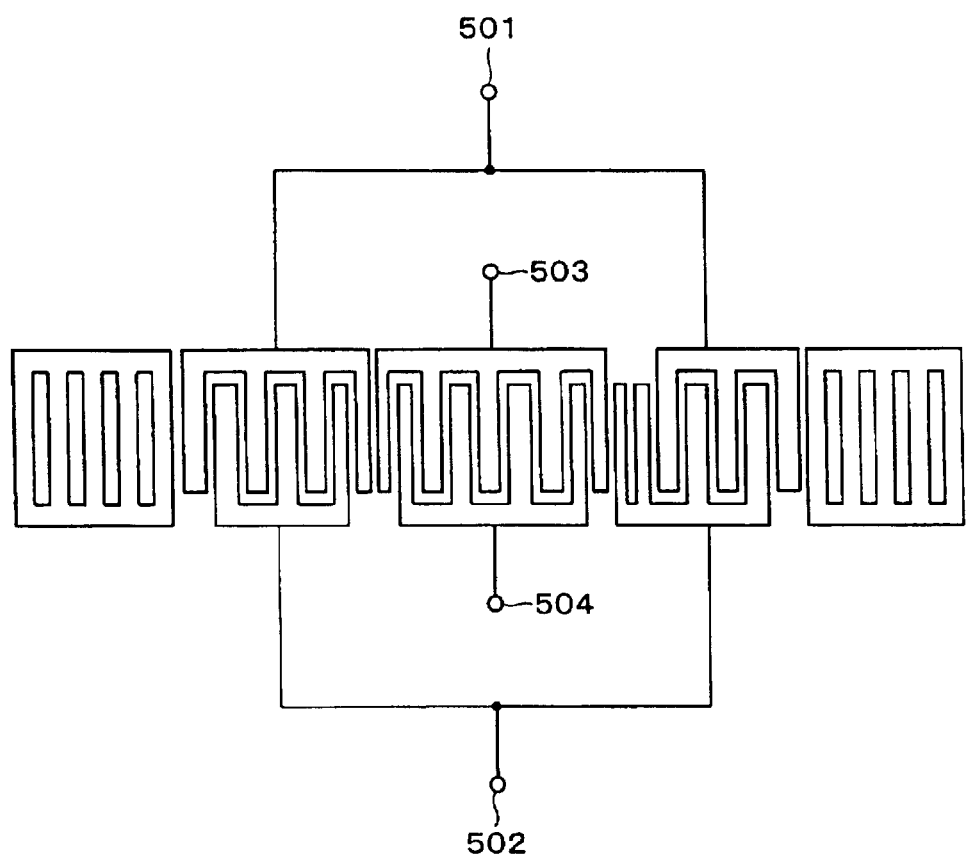
FIG. 10 is a schematic diagram illustrating still another modification made to the first preferred embodiment of the present invention.
Figure 11:
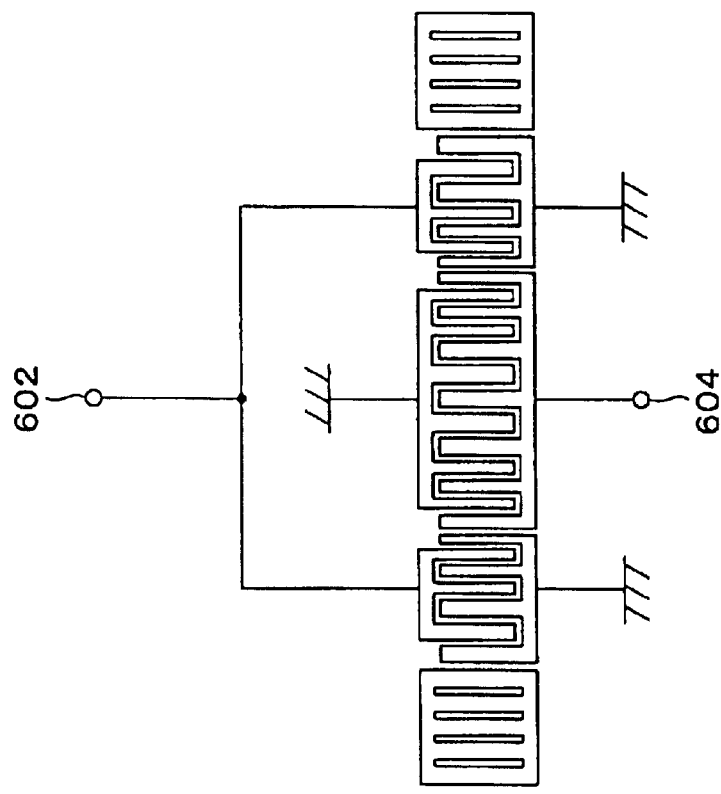
FIG. 11 is a schematic diagram illustrating a further modification made to the first preferred embodiment of the present invention.
Figure 11:
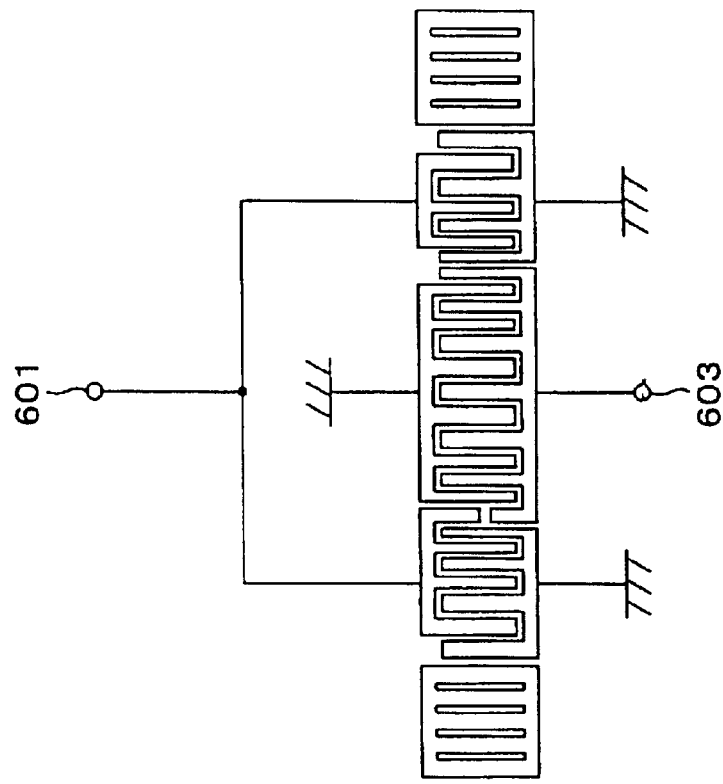

In the first preferred embodiment, the SAW apparatus is provided with a balanced-to-unbalanced conversion function. However, as in SAW apparatuses shown in FIGS. 10 and 11, a balanced signal may be input and a balanced signal may be output. More specifically, in FIG. 10, balanced signal terminals 501 and 502 define a pair, and balanced signal terminals 503 and 504 define a pair. In FIG. 11, balanced signal terminals 601 and 602 define a pair, and balanced signal terminals 603 and 604 define a pair. In this case, advantages similar to those obtained by the first preferred embodiment are achieved.

In the first preferred embodiment, the SAW apparatus having a balanced-to-unbalanced conversion function is configured to include a single longitudinally-coupled-resonator-type filter. However, the present invention is not restricted to this type of configuration.

Figure 12:
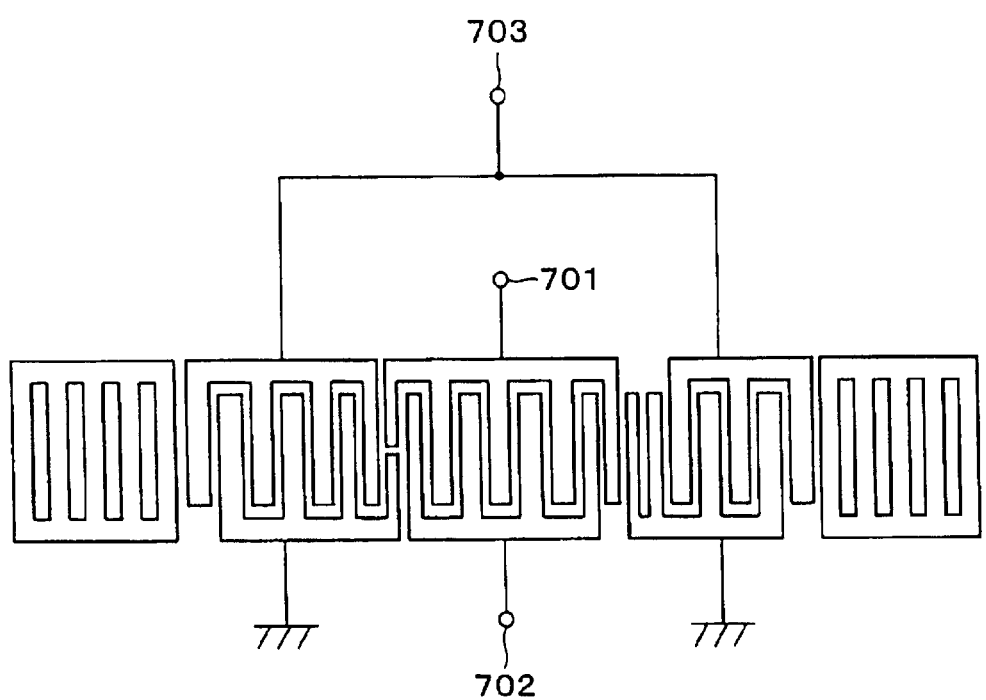
FIG. 12 is a schematic diagram illustrating a further modification made to the first preferred embodiment of the present invention.
Figure 13:
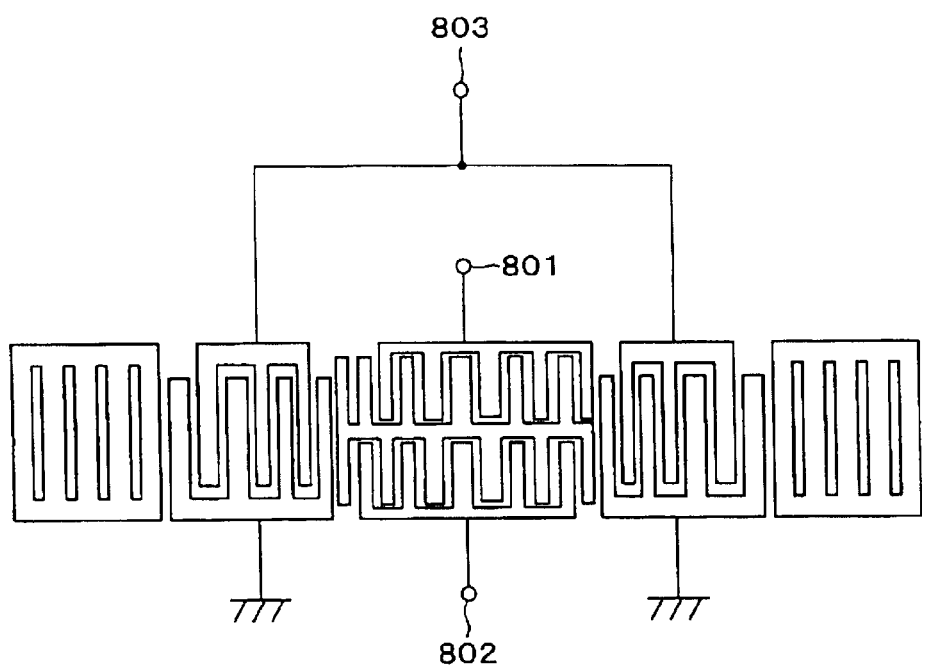
FIG. 13 is a schematic diagram illustrating a further modification made to the first preferred embodiment of the present invention.
Figure 14:
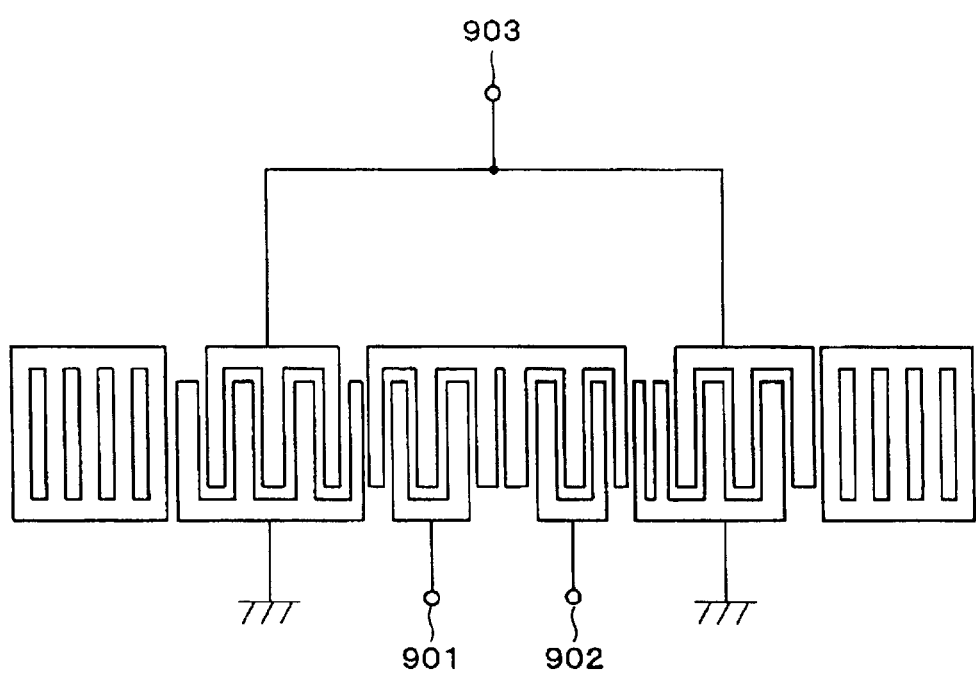
FIG. 14 is a schematic diagram illustrating a further modification made to the first preferred embodiment of the present invention.

For example, as shown in FIG. 12, balanced signal terminals 701 and 702 may be connected to comb-like electrodes of a single IDT in a single longitudinally-coupled-resonator-type SAW filter. Thus, the configuration shown in FIG. 12 does not have an electrical neutral point. In FIG. 12, reference numeral 703 indicates an unbalanced signal terminal. As shown in FIG. 13, one IDT is divided in the direction of the interdigital length so as to change the impedance. In FIG. 13, reference numerals 801 and 802 indicate balanced signal terminals, and reference numeral 803 indicates an unbalanced signal terminal. In FIG. 14, one IDT is divided in a SAW propagating direction, and balanced signal terminals 901 and 902 are connected to the divided comb-like electrodes. In FIG. 14, reference numeral 903 designates an unbalanced signal terminal. With these modifications, advantages similar to those obtained by the first preferred embodiment are achieved.

Figure 15:
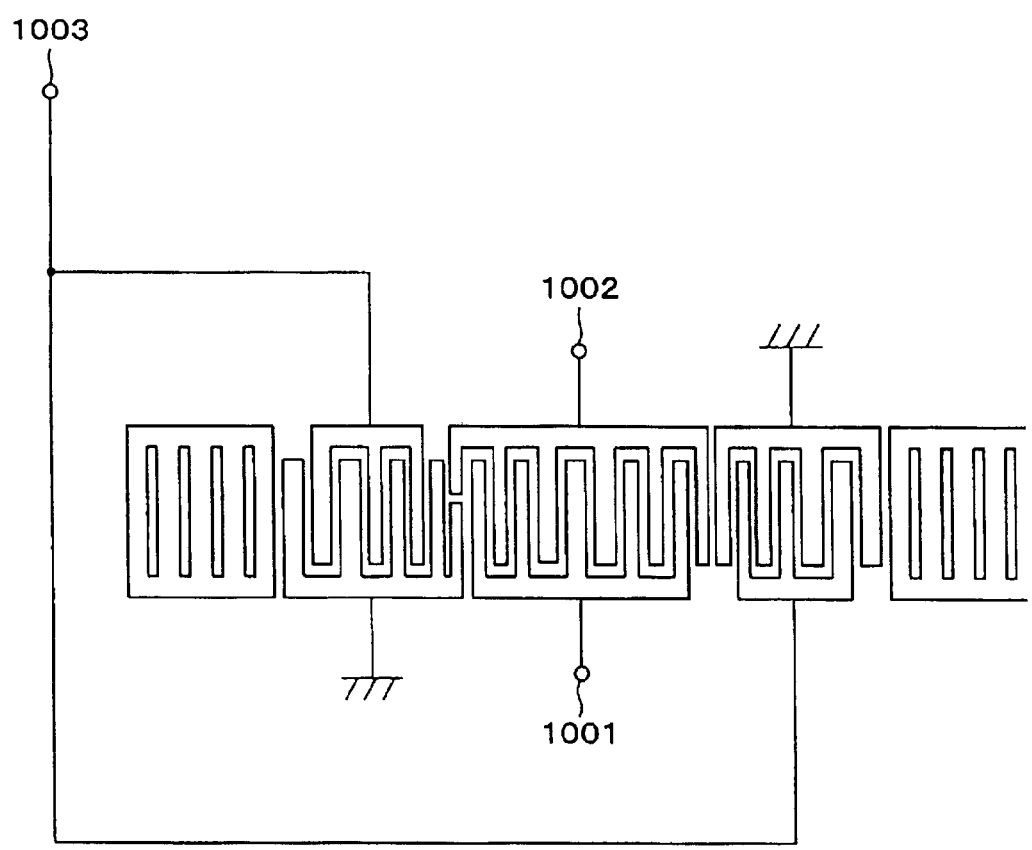
FIG. 15 is a schematic diagram illustrating a further modification made to the first preferred embodiment of the present invention.

As shown in FIG. 15, an unbalanced signal terminal 1003 is connected to inverted comb-like electrodes of IDTs on the left and right sides. Thus, a SAW apparatus having an improved attenuation outside the pass band is provided. In FIG. 15, reference numerals 1001 and 1002 designate balanced signal terminals.

Additionally, a plurality of longitudinally-coupled-resonator-type SAW filters may be combined to define a SAW apparatus having a balanced-to-unbalanced conversion function. In this case, advantages similar to those obtained by the first preferred embodiment are achieved.

Figure 16:
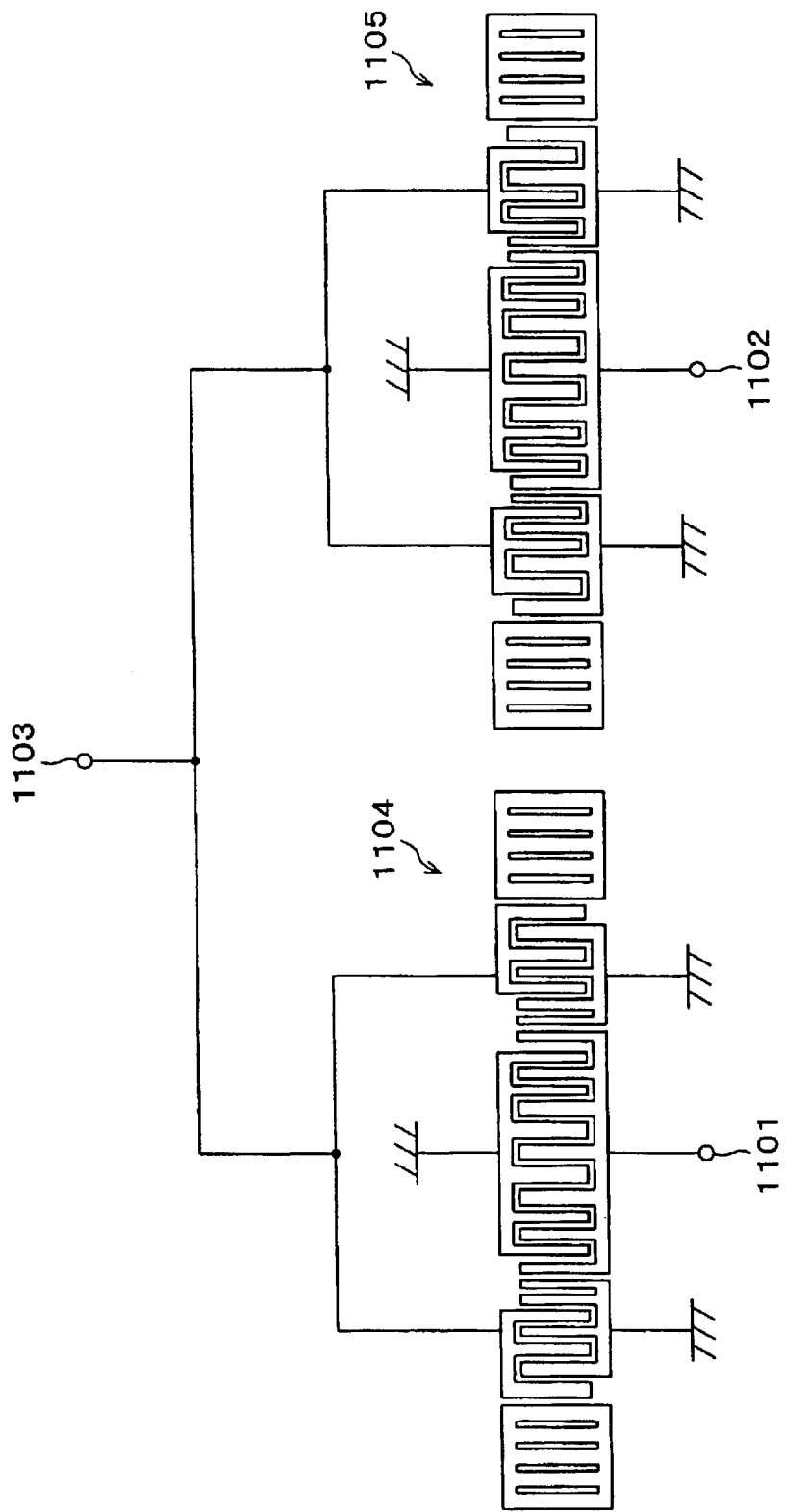
FIG. 16 is a schematic diagram illustrating a further modification made to the first preferred embodiment of the present invention.
Figure 17:
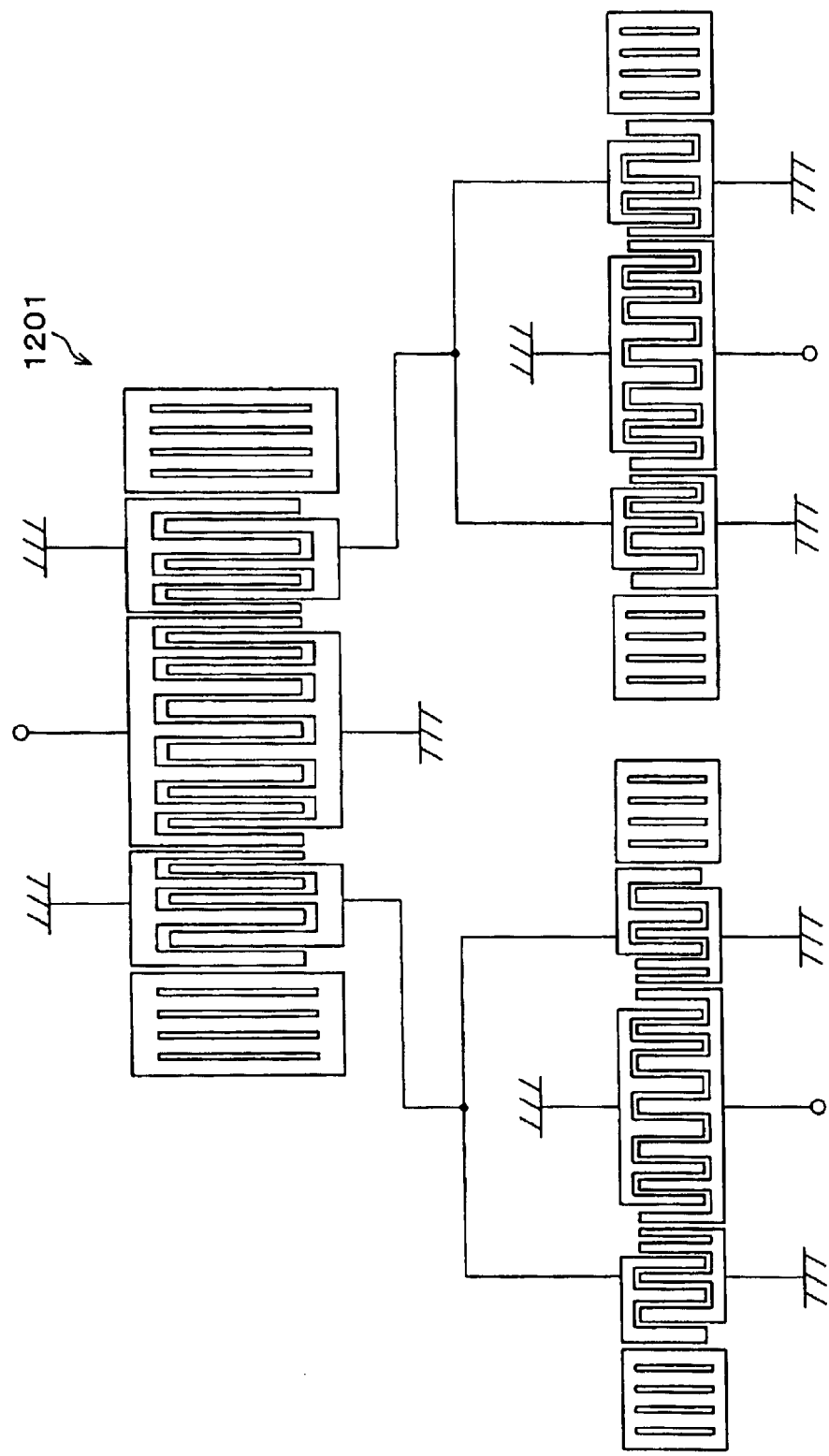
FIG. 17 is a schematic diagram illustrating a further modification made to the first preferred embodiment of the present invention.
Figure 18:
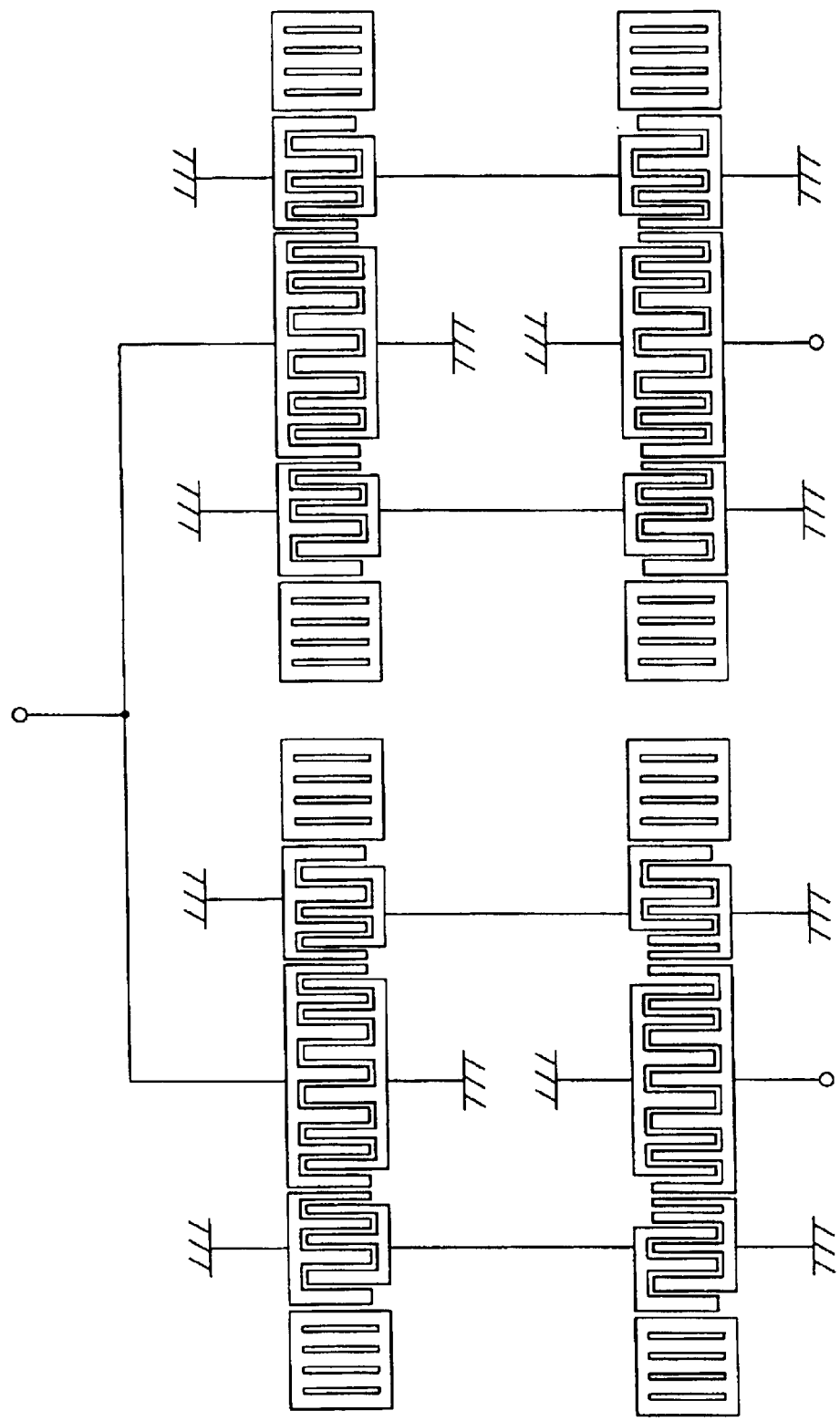
FIG. 18 is a schematic diagram illustrating a further modification made to the first preferred embodiment of the present invention.

For example, as shown in FIG. 16, two longitudinally-coupled-resonator-type SAW filters 1104 and 1105 are provided such that output signals from the SAW filters 1104 and 1105 are about 180° out of phase with each other. IDTs connected to balanced signal terminals 1101 and 1102 are connected in series to each other, and IDTs connected to an unbalanced signal terminal 1103 are connected in parallel to each other. As shown in FIG. 17, a single longitudinally-coupled-resonator-type SAW filter 1201 is cascade-connected to the configuration shown in FIG. 16. As shown in FIG. 18, weights are applied to the configuration shown in FIG. 68. With these modifications, advantages similar to those obtained by the first preferred embodiment are achieved.

Figure 19:
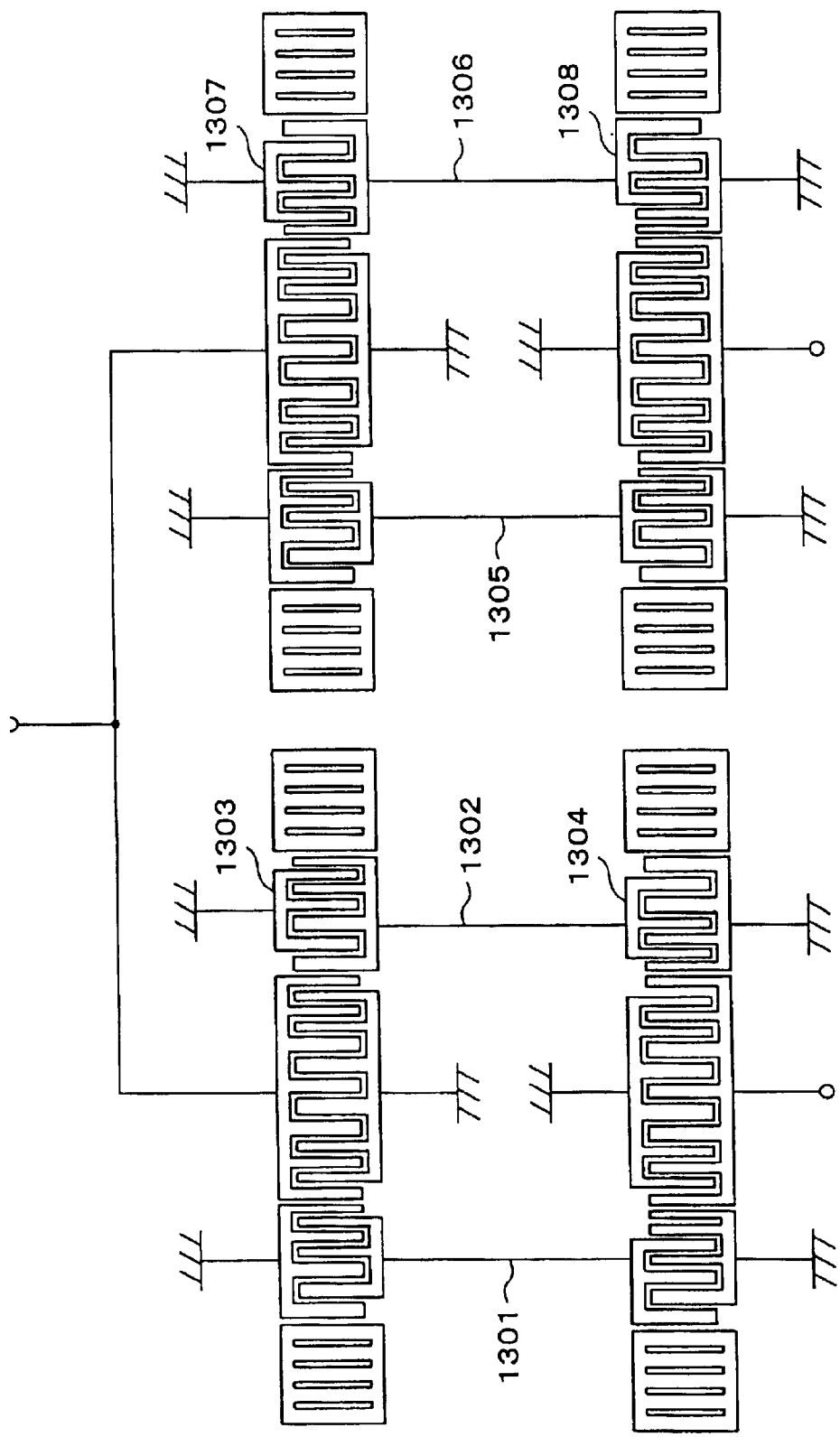
FIG. 19 is a schematic diagram illustrating a further modification made to the first preferred embodiment of the present invention.

In the configuration in which longitudinally-coupled-resonator-type SAW filters are cascade-connected, not only the balance levels between balanced signal terminals are improved, but also, the attenuation outside the pass band is increased. In this case, as shown in FIG. 19, IDTs 1303 and 1304 are inverted with respect to each other such that electrical signals transmitting in signal lines 1301 and 1302 used for cascade-connecting two longitudinally-coupled-resonator-type SAW filters are about 180° out of phase with each other. Similarly, IDTs 1307 and 1308 may be inverted with respect to each other such that electrical signals transmitting in signal lines 1305 and 1306 are about 180° out of phase with each other. With this arrangement, a SAW apparatus having further improved balance levels between balanced signal terminals are obtained.

Figure 20:
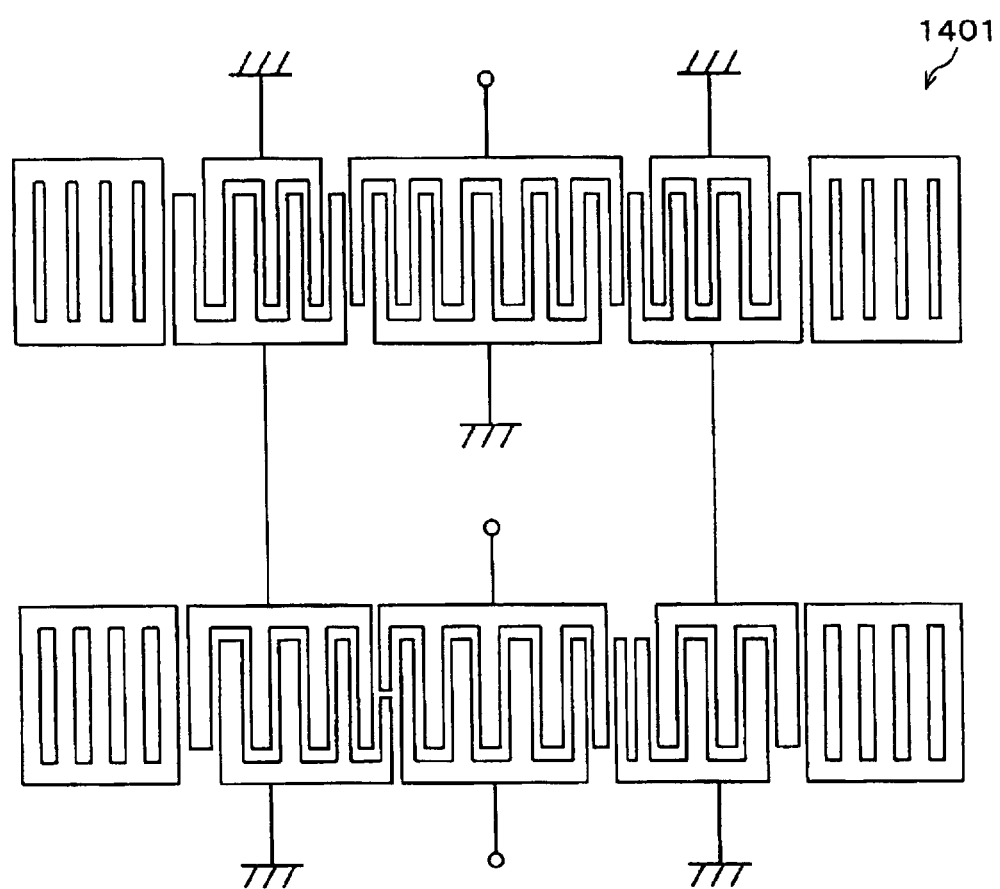
FIG. 20 is a schematic diagram illustrating a further modification made to the first preferred embodiment of the present invention.
Figure 21:
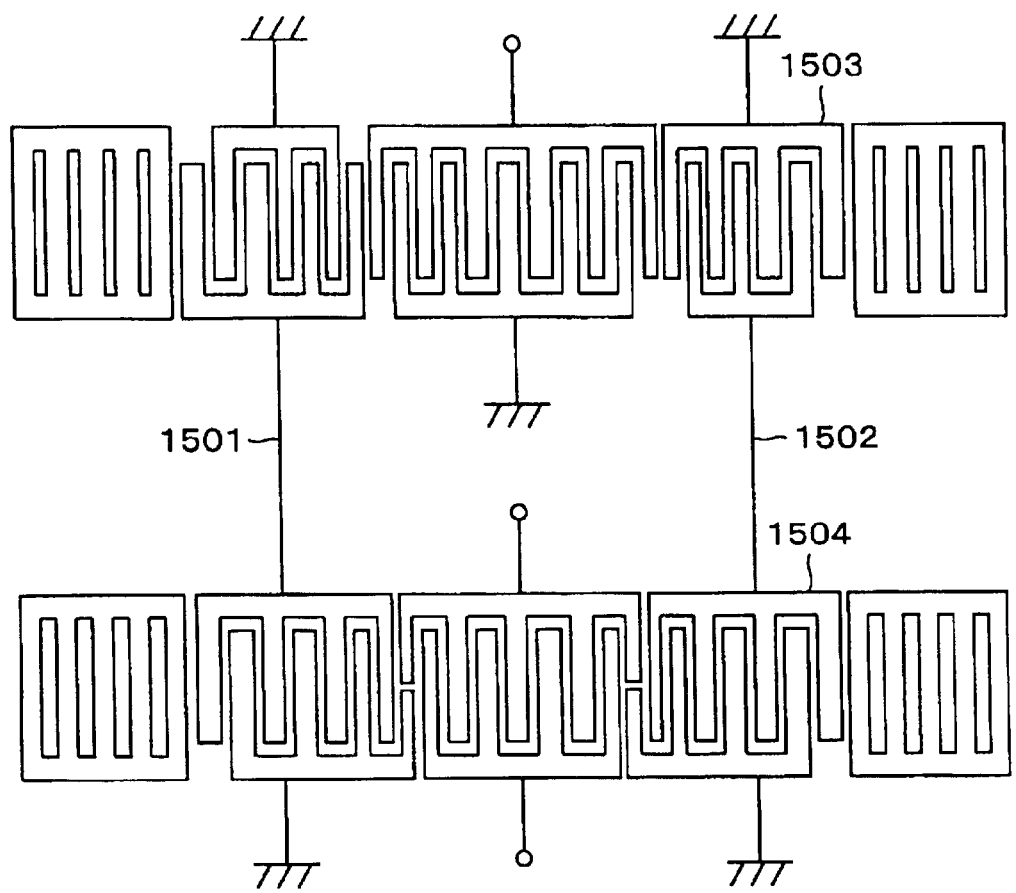
FIG. 21 is a schematic diagram illustrating a further modification made to the first preferred embodiment of the present invention.

Additionally, as shown in FIG. 20, a single longitudinally-coupled-resonator-type SAW filter 1401 is cascade-connected to the SAW apparatus shown in FIG. 12, in which case, advantages similar to those obtained by the first preferred embodiment are achieved. With this configuration, a SAW apparatus having not only improved balance levels between balanced signal terminals, but also an increased attenuation outside the pass band is obtained. In this case, as shown in FIG. 21, IDTs 1503 and 1504 are inverted with respect to each other such that electrical signals transmitting in signal lines 1501 and 1502 are about 180° out of phase with each other, as in the configuration shown in FIG. 19. Thus, a SAW apparatus having further improved balance levels between balanced signal terminals is provided.

When cascade-connecting two or more longitudinally-coupled-resonator-type SAW filters, the same type of longitudinally-coupled-resonator-type SAW filter is not necessarily used. For example, for adjusting the input impedance and the output impedance, the interdigital length may be different between SAW filters. For increasing the attenuation outside the pass band, the number of pairs of electrode fingers of an IDT, the center-to-center distance between adjacent IDTs, or the center-to-center distance between an IDT and a reflector may be different between SAW filters. Accordingly, different designs of SAW filters may be used.

Figure 22:
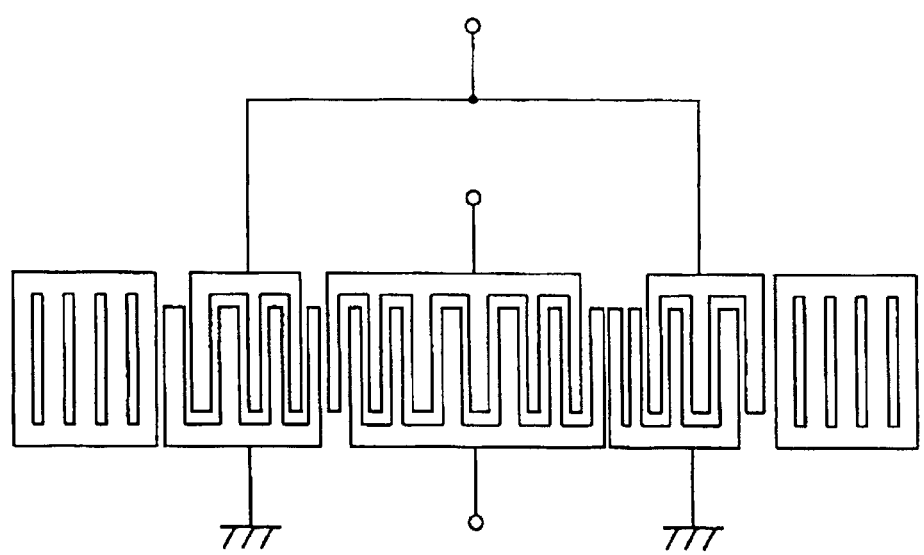
FIG. 22 is a schematic diagram illustrating a further modification made to the first preferred embodiment of the present invention.

Although in the first preferred embodiment the total number of electrode fingers of each IDT is preferably an odd number, the total number of electrode fingers may be an even number. In particular, as shown in FIG. 22, the total number of electrode fingers of the central IDT connected to balanced signal terminals is preferably an even number. With this modification, advantages similar to those obtained by the first preferred embodiment are also achieved.

In this case, the horizontal symmetrical characteristics with respect to the center of the longitudinally-coupled-resonator-type SAW filter is greatly improved, and the number of electrode fingers connected to one balanced signal terminal is equal to that connected to the other balanced signal terminal. Thus, a SAW apparatus having further improved balance levels between balanced signal terminals is provided.

Figure 23:
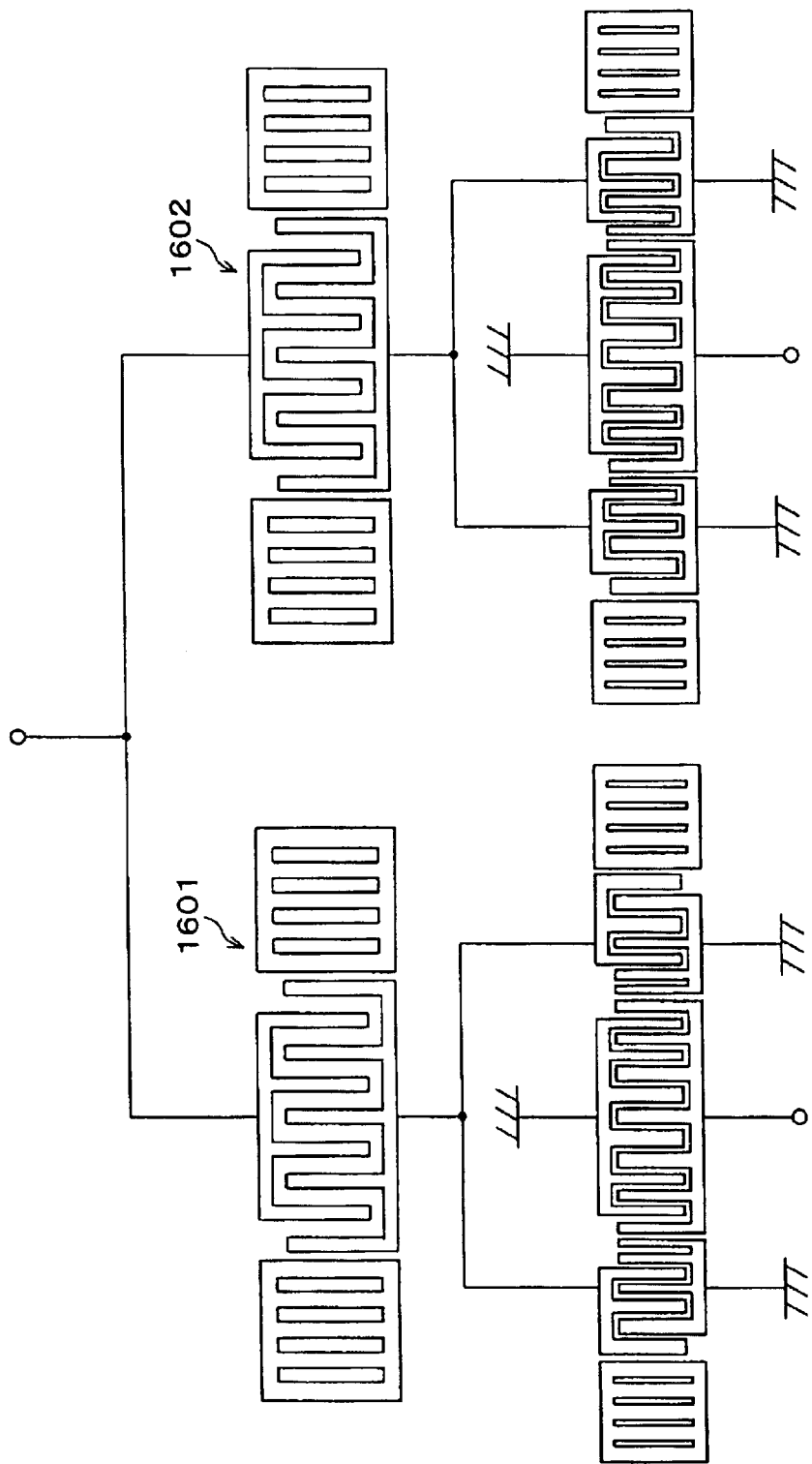
FIG. 23 is a schematic diagram illustrating a further modification made to the first preferred embodiment of the present invention.

As shown in FIG. 23, SAW resonators 1601 and 1602 are connected in series to each other. Alternatively, although not shown, SAW resonators may be connected in parallel to each other. Alternatively, series-connected SAW resonators and parallel-connected SAW resonators may be connected to each other. In this case, a SAW apparatus having not only improved balance levels between balanced signal terminals, but also an increased attenuation in a range in the vicinity of the pass band is obtained.

A second preferred embodiment of the present invention is described below with reference to FIGS. 24 through 28. In the second preferred embodiment, components having functions similar to those of the SAW apparatus shown in FIG. 1 are indicated by like reference numerals, and an explanation thereof is thus omitted.

Figure 24:
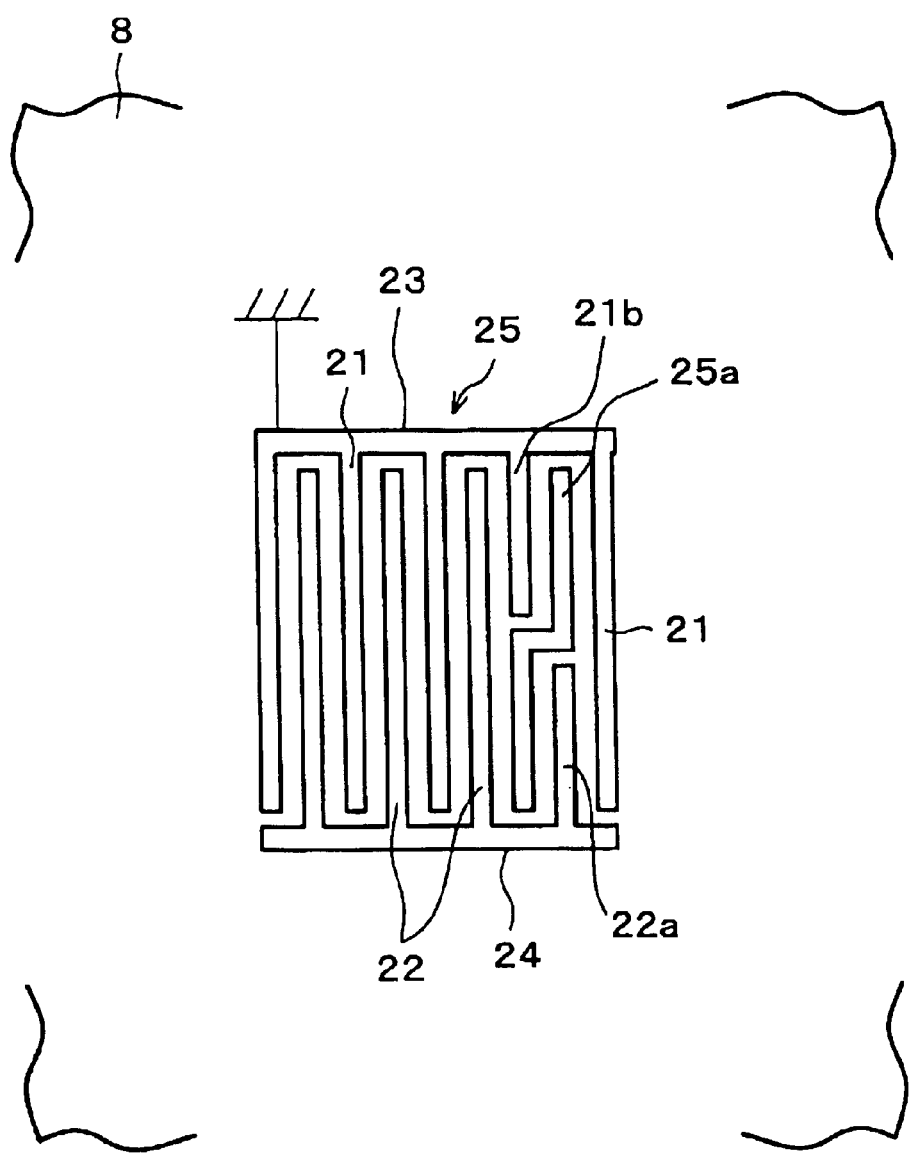
FIG. 24 is schematic diagram illustrating a SAW apparatus according to a second preferred embodiment of the present invention.

In a SAW apparatus according with the second preferred embodiment of the present invention, instead of performing withdrawal weighting or apodization weighting used in the first preferred embodiment, series weighting is applied, as shown in FIG. 24. That is, an IDT 25 is substituted for the IDT 2 used in the first preferred embodiment.

In the IDT 25, instead of the dummy electrode finger 21a of the IDT 2, an apodization-weighted electrode finger 21b, which is arranged subsequent to the apodization-weighted electrode finger 22a and is shorter than in the apodization-weighted electrode finger 22a, is provided. A dummy electrode finger (second balance electrode finger) 25a is arranged such that it is separated from the apodization-weighted electrode fingers 22a and 21b (i.e., the dummy electrode finger 25a is floating).

The dummy electrode finger 25a is preferably substantially the same length as the apodization-weighted electrode finger 22a between and substantially in parallel to the apodization-weighted electrode finger 22a and the subsequent signal electrode finger 22, passes between the forward end of the apodization-weighted electrode finger 22a and the forward end of the apodization-weighted electrode finger 21b, and is extended between and substantially in parallel to the apodization-weighted electrode finger 21b and the outermost ground electrode finger 21.

Figure 25:
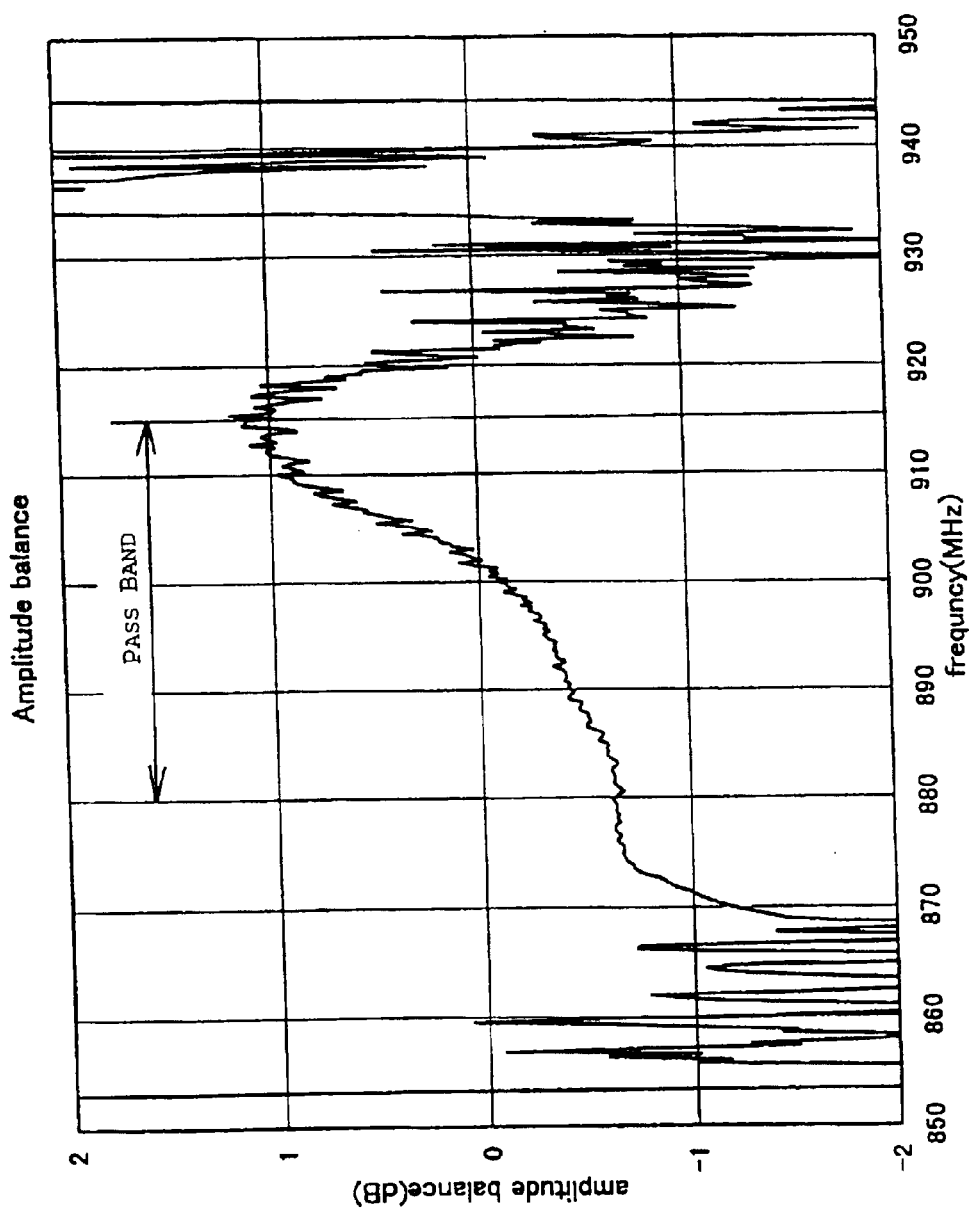
FIG. 25 is a graph illustrating the amplitude balance level (amplitude balance) of the SAW apparatus of the second preferred embodiment of the present invention.
Figure 26:
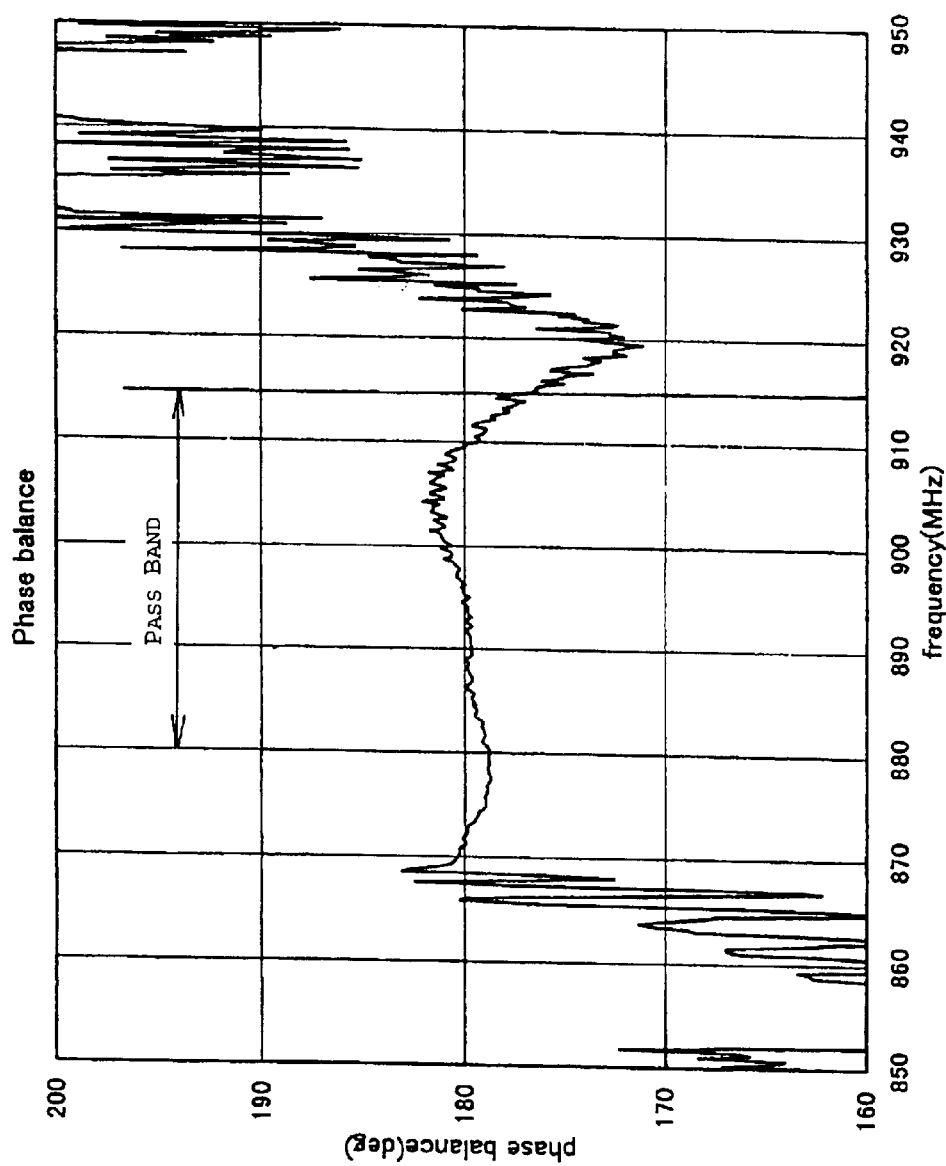
FIG. 26 is a graph illustrating the phase balance level (phase balance) of the SAW apparatus of the second preferred embodiment of the present invention.

In a SAW apparatus including the IDT 25, the amplitude balance level and the phase balance level in the vicinity of the pass band were measured. The results are shown in FIGS. 25 and 26, respectively. FIG. 25 shows that the amplitude balance level between the balanced signal terminals in a frequency range of the pass band used for EGSM transmission filters ranges from −0.7 dB to +1.2 dB (having a deviation of 1.9 dB), which is the same result as the first preferred embodiment. FIG. 26 shows that the phase balance level between the balanced signal terminals ranges from 177° to 182° (having a deviation of 5°). Accordingly, the balance level is improved over the first preferred embodiment by 1°.

Figure 27:
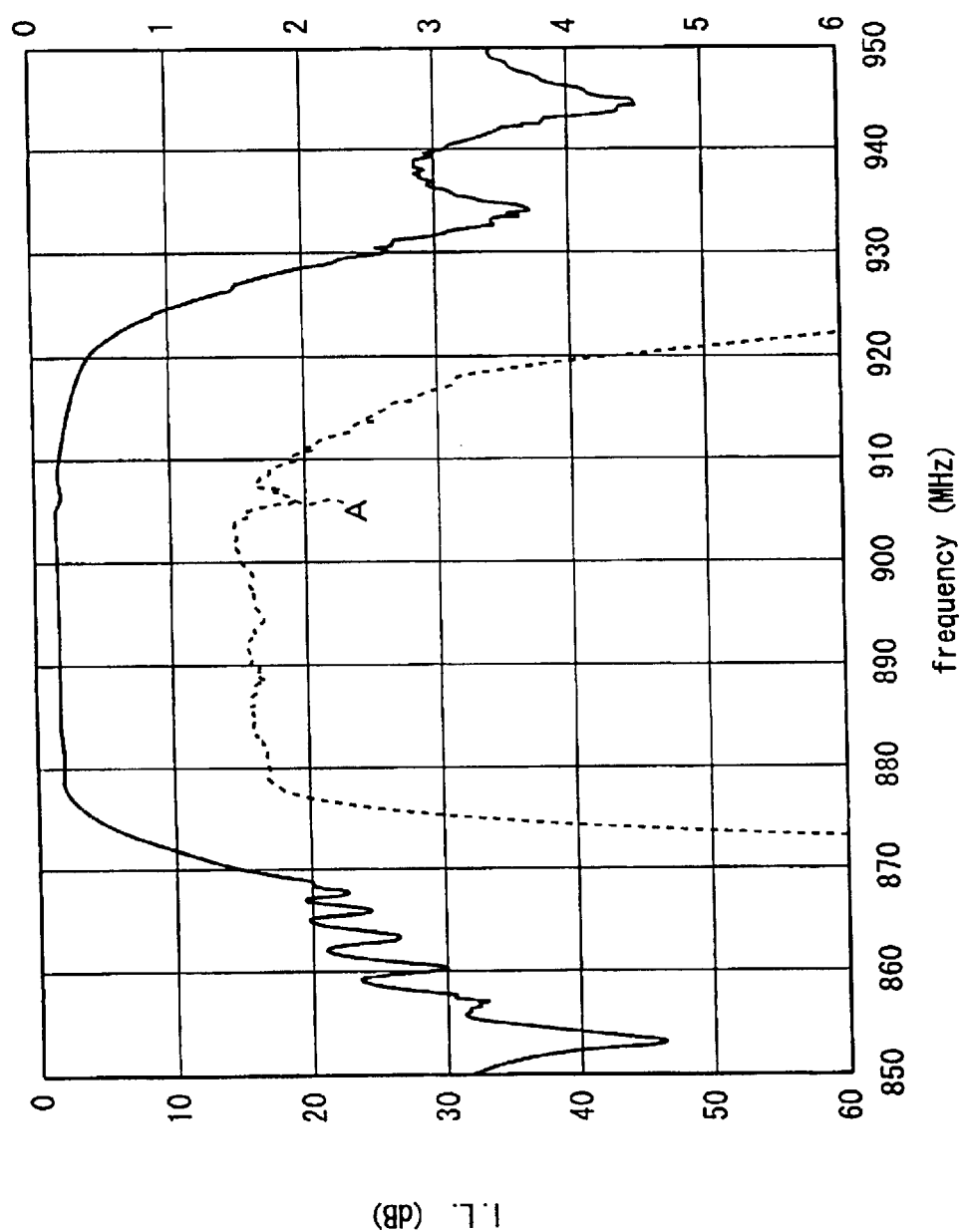
FIG. 27 is a graph illustrating transmission characteristics of the SAW apparatus of the first preferred embodiment of the present invention.
Figure 28:
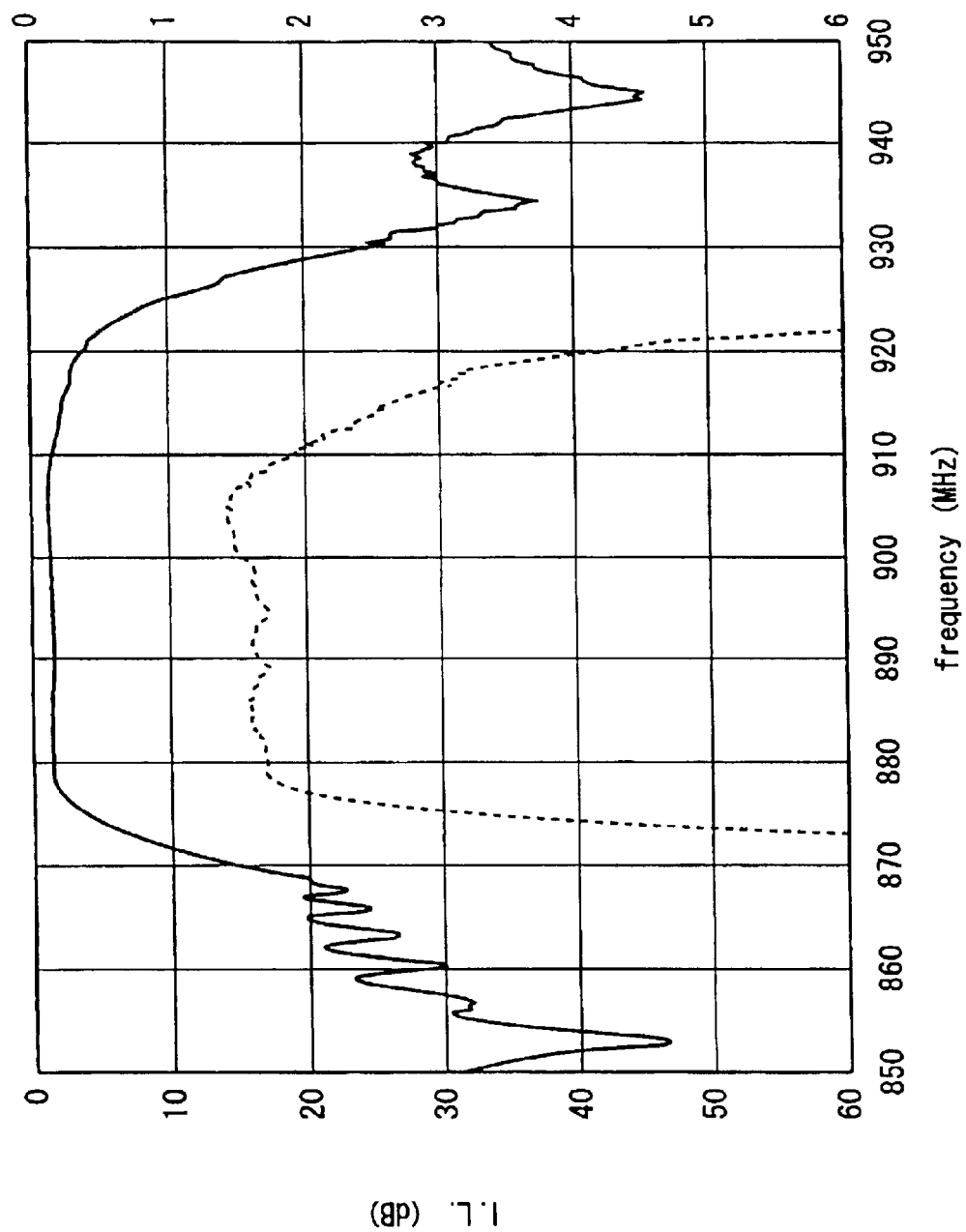
FIG. 28 is a graph illustrating transmission characteristics of the SAW apparatus of the second preferred embodiment of the present invention.

The transmission characteristics within the pass band with respect to the frequency obtained by the first preferred embodiment are shown in FIG. 27, and the transmission characteristics within the pass band with respect to the frequency obtained by the second preferred embodiment are shown in FIG. 28. For comparing the two transmission characteristics, ripple A is generated (see FIG. 27) within the pass band in the first preferred embodiment, while ripple A is not generated (see FIG. 28) within the pass band in the second preferred embodiment. Thus, in the second preferred embodiment, the deviation is smaller within the pass band.

As described above, by performing series weighting, which is a modification of apodization weighting, a SAW apparatus having improved balance levels between the balanced signal terminals and a smaller deviation within the pass band is obtained.

Additionally, in the second preferred embodiment, the generation of ripples is prevented in the transmission characteristics, and thus, the SAW apparatus of the second preferred embodiment exhibits further improved transmission characteristics.

Figure 29:
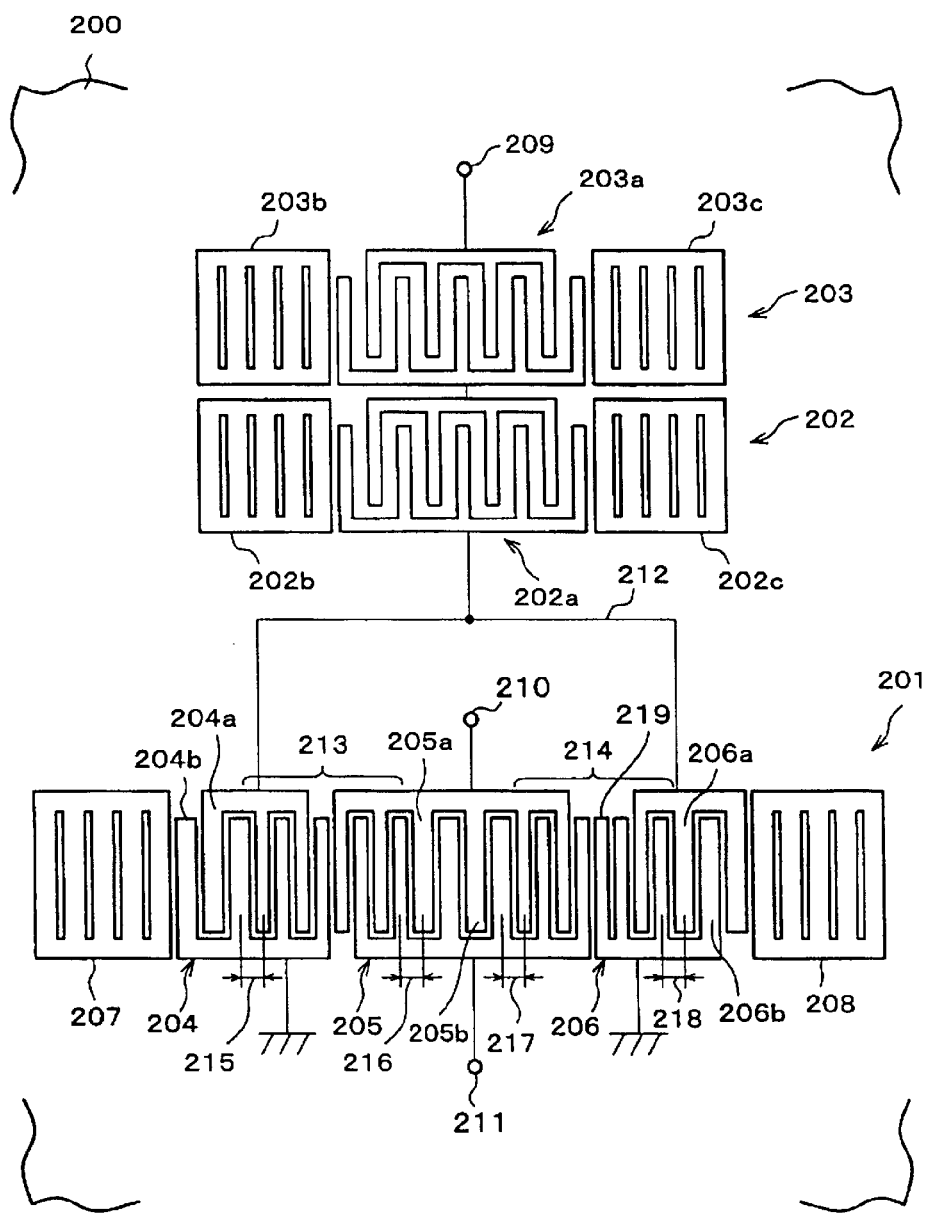
FIG. 29 is a schematic diagram illustrating a SAW apparatus according to a third preferred embodiment of the present invention.

A third preferred embodiment of the present invention is discussed in detail below with reference to FIGS. 29 through 32. FIG. 29 illustrates a SAW apparatus according to the third preferred embodiment of the present invention. In the third preferred embodiment, the present invention is described with reference to a PCS receiving filter.

In the SAW apparatus of the third preferred embodiment, on a piezoelectric substrate 200, a three-IDT-type longitudinally-coupled-resonator-type SAW filter 201, and SAW resonators 202 and 203, which are connected in series to the SAW filter 201, are preferably formed of an Al electrode (foil) by, for example, a photolithographic technique or other suitable process. The piezoelectric substrate 200 is preferably a 40±5° Y-cut X-propagating LiTaO$_3$ although other substrates may be used. The SAW filter 201 is substantially the same as that shown in FIG. 10.

In the SAW filter 201, IDTs 204 and 206 are arranged such that they sandwich a central IDT 205, which is connected to balanced signal terminals 210 and 211, from the left and right sides (along a SAW propagating direction). Reflectors 207 and 208, which reflect SAWs from the IDTs 204, 205, and 206, are provided outside the IDTs 204 and 206, respectively (along a SAW propagating direction). That is, the IDTs 204, 205, and 206 and the reflectors 207 and 208 are arranged on the SAW propagation path such that the lengths of the electrode fingers are substantially parallel to the SAW propagating direction.

In the SAW filter 201, the pitch between some electrode fingers in a portion (indicated by 213 in FIG. 29) between the adjacent IDTs 204 and 205, and the pitch between some electrode fingers in a portion (indicated by 214 in FIG. 29) between the adjacent IDTs 204 and 206 are narrower than the pitch between the other electrode fingers.

In the above-described SAW apparatus, reference numeral 209 designates an unbalanced signal terminal. Accordingly, the IDTs 204 and 206 are connected to the unbalanced signal terminal 209. The IDT 204 includes signal electrode fingers 204a and ground electrode fingers 204b, and the IDT 206 includes signal electrode fingers 206a and ground electrode fingers 206b. The IDT 205 is connected to the balanced signal terminals 210 and 211, and includes signal electrode fingers 205a and 205b. Thus, in the third preferred embodiment, weighting is applied to a SAW apparatus which does not include an electrical neutral point.

The SAW resonators 202 and 203 are connected between and in series to the unbalanced signal terminal 209 and the IDTs 204 and 206 via a signal line 212. The SAW resonator 202 includes an IDT 202a, and reflectors 202b and 202c which are arranged such that they sandwich the IDT 202a along a SAW propagating direction. The SAW resonator 203 includes an IDT 203a, and reflectors 203b and 203c which are arranged such that they sandwich the IDT 203a along a SAW propagating direction.

The features of the third preferred embodiment are as follows. Withdrawal weighting is applied to an electrode finger 219 of the IDT 206 adjacent to the IDT 205. Additionally, the signal electrode finger 206a of the IDT 206 adjacent to the IDT 205 is withdrawal-weighted.

In the third preferred embodiment, in order to maintain proper spacing between the IDTs 205 and 206, the interdigital length, the pitch, the duty, and the width of the electrode finger 219 are preferably substantially the same as those of the narrower-pitch ground electrode fingers 206b. With this arrangement, in the IDT 206, a plurality of (for example, two) ground electrode fingers 206b is sequentially provided at the portion adjacent to the IDT 205.

When the wavelength determined by the narrower pitch of the electrode fingers is indicated by $\lambda I_2$ (indicated by 213 and 214 in FIG. 29), and when the wavelength determined by the pitch of the other electrode fingers is indicated by $\lambda I_1$, detailed designs of the SAW filter 201 are as follows (the number in parentheses indicates the number of narrower-pitch electrode fingers):

interdigital length W: 60.6 $\lambda I_1$;

number of pairs of electrode fingers of IDT 204: 29(4);

number of pairs of electrode fingers of IDT 205: (4)44(4);

number of pairs of electrode fingers of IDT 206: (4)29;

IDT wavelength $\lambda I_1$: 2.06 μm;

IDT wavelength $\lambda I_2$: 1.88 μm;

reflector wavelength λR: 2.07 μm;

number of electrode fingers of reflector: 100;

IDT pitch: 0.50 $\lambda I_2$;

pitch between wider pitch electrode finger ($\lambda I_1$) and narrower-pitch electrode finger ($\lambda I_2$) (indicated by 215, 216, 217, and 218): 0.25 $\lambda I_1$+0.25 $\lambda I_2$;

pitch between IDT and reflector: 0.47 λR;

duty (for IDT and reflectors): 0.60; and electrode thickness: 0.080 $\lambda I_1$.

Detailed design configuration of the SAW resonator 202 are shown as follows:

interdigital length W: 40.6 λ;

number of pairs of electrode fingers of IDT: 241;

wavelength λ (for IDT and reflectors): 1.97 μm;

number of electrode fingers of reflectors: 30 center-to-center distance between IDT and reflector: 0.50 λ;

duty (for IDT and reflectors): 0.60; and electrode thickness: 0.084 λ.

Detailed designs of the SAW resonator 203 are as follows:

interdigital length W: 49.1 λ;

number of pairs of electrode fingers of IDT: 401;

wavelength λ (for IDT and reflectors): 2.04 μm;

number of electrode fingers reflectors: 30;

center-to-center distance between IDT and reflector: 0.50 λ;

duty (for IDT and reflectors): 0.60; and electrode thickness: 0.080 λ.

Figure 30:
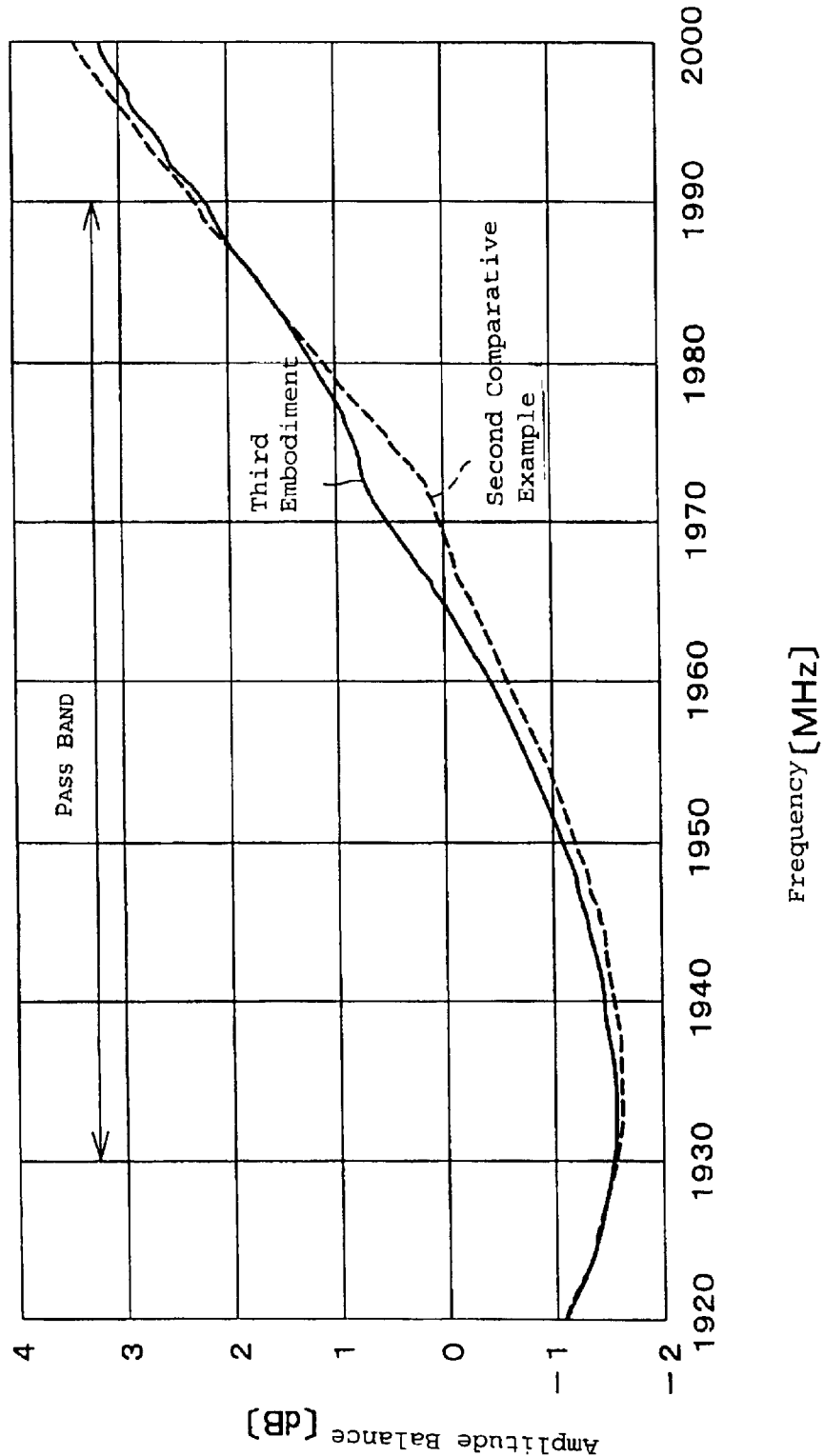
FIG. 30 is a graph illustrating the amplitude balance level (amplitude balance) of the third preferred embodiment of the present invention and that of a second comparative example.
Figure 31:
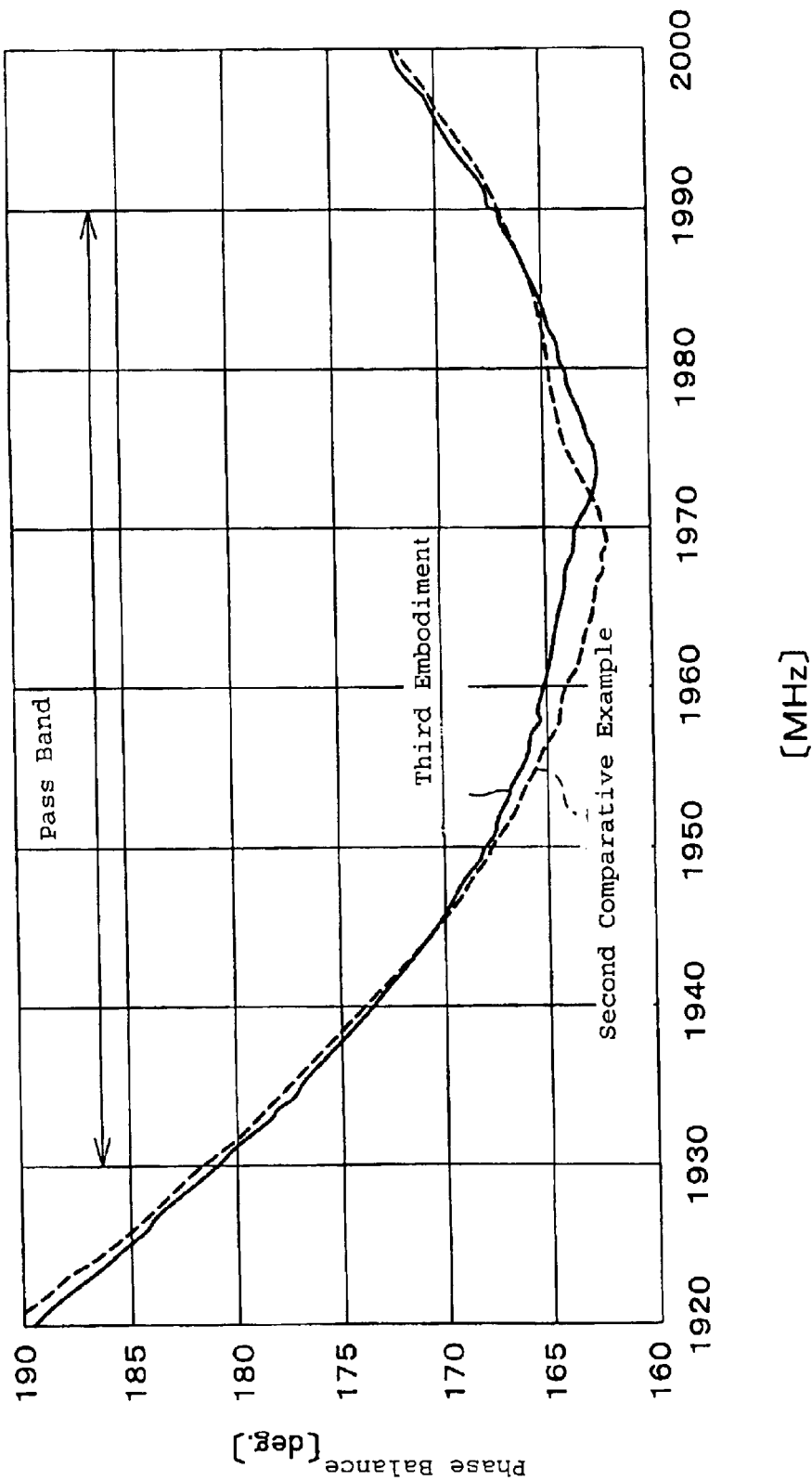
FIG. 31 is a graph illustrating the phase balance level (phase balance) of the third preferred embodiment of the present invention and that of the second comparative example.

The characteristics of the third preferred embodiment were measured, and the results are shown in FIGS. 30 and 31. More specifically, the amplitude balance level between the balanced signal terminals with respect to the frequency obtained by the third preferred embodiment is shown in FIG. 30, and the phase balance level obtained by the third preferred embodiment are shown in FIG. 31.

Figure 32:
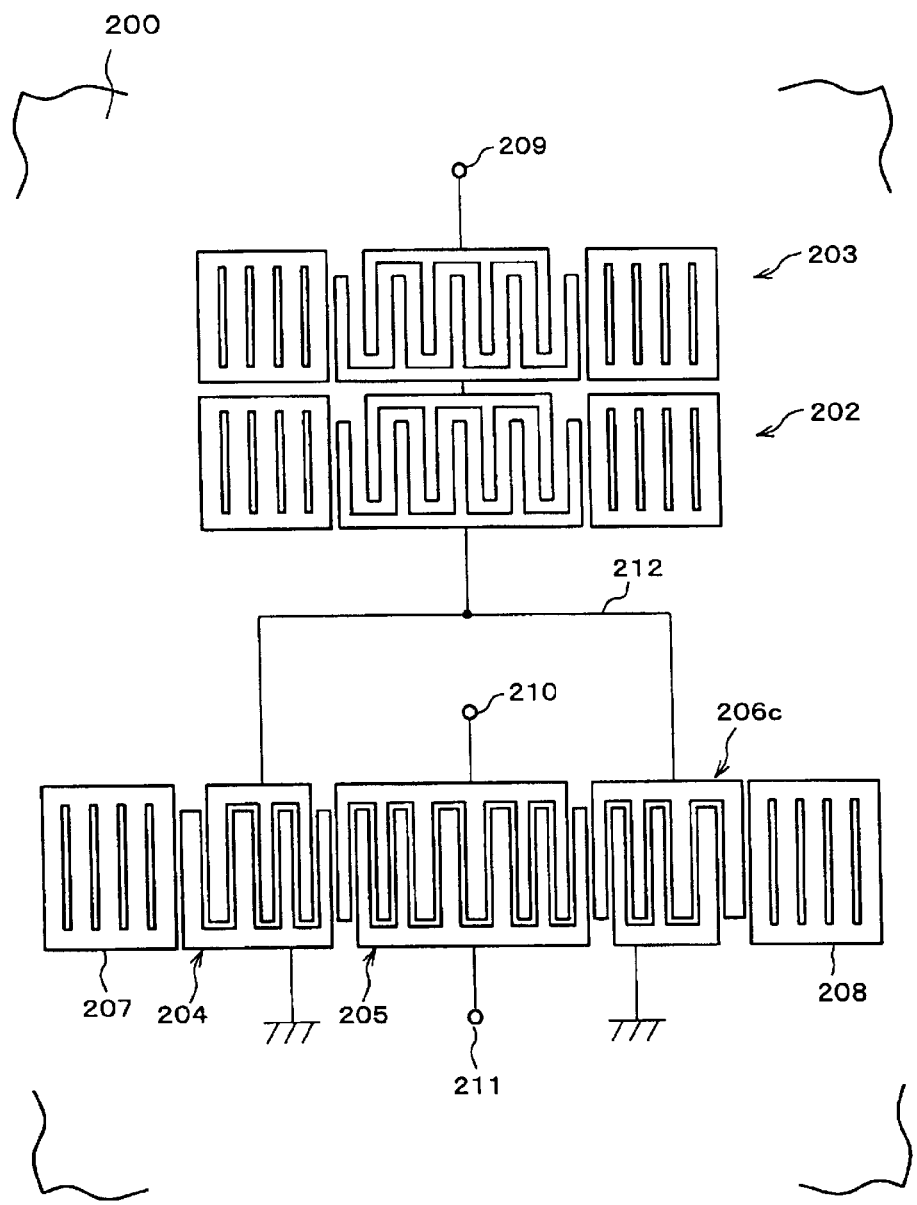
FIG. 32 is a schematic diagram illustrating a SAW apparatus of the second comparative example.

For comparison, the amplitude balance level and the phase balance level of a SAW filter having an IDT 206c shown in FIG. 32 instead of the IDT 206 are shown FIGS. 30 and 31 as a second comparative example. In the IDT 206c, withdrawal weighting is not provided at the portion between two adjacent IDTs.

The configuration of the SAW apparatus of the second comparative example is the same as that of the third preferred embodiment, except that the IDT 206c, which is not withdrawal-weighted, is used instead of the IDT 206. The frequency range of the pass band used for PCS receiving filters is 1930 MHz to 1990 MHz.

The maximum amplitude balance level in this range of the second comparative example ranges form −1.6 dB to +0.7 dB (having a deviation of 2.3 dB). In contrast, the maximum amplitude balance level of the third preferred embodiment ranges from −1.5 dB to +0.7 dB (having a deviation of 2.2 dB). Accordingly, the amplitude balance level is improved by about 0.1 dB. The phase balance level of the second comparative example ranges from 162° to 182° (having a deviation of 20°), while the phase balance level of the third preferred embodiment ranges from 162° to 181° (having a deviation of 19°). Accordingly, the phase balance level is improved by about 1°.

Thus, the balance levels of the third preferred embodiment are improved over the second comparative example. The reason for this is as follows. In the second comparative example, the polarities between the IDTs 206 and 205 are the same (positive), i.e., signal electrode fingers are provided between the IDTs 206 and 205. However, by applying withdrawal weighting in the third preferred embodiment, the polarities between the IDTs 206 and 205 are negative and positive, as in the polarities between the IDTs 204 and 205. Thus, symmetrical characteristics of the SAW filter are improved in the third preferred embodiment.

As described above, in the third preferred embodiment, the electrode fingers provided at the portion between two adjacent IDTs are withdrawal-weighted. Thus, a SAW filter having improved balance levels between balanced signal terminals over known SAW filters is obtained.

A fourth preferred embodiment of the present invention is described in detail below with reference to FIGS. 33 through 41. In the fourth preferred embodiment, the present invention is discussed in the context of an EGSM receiving filter.

Figure 33:
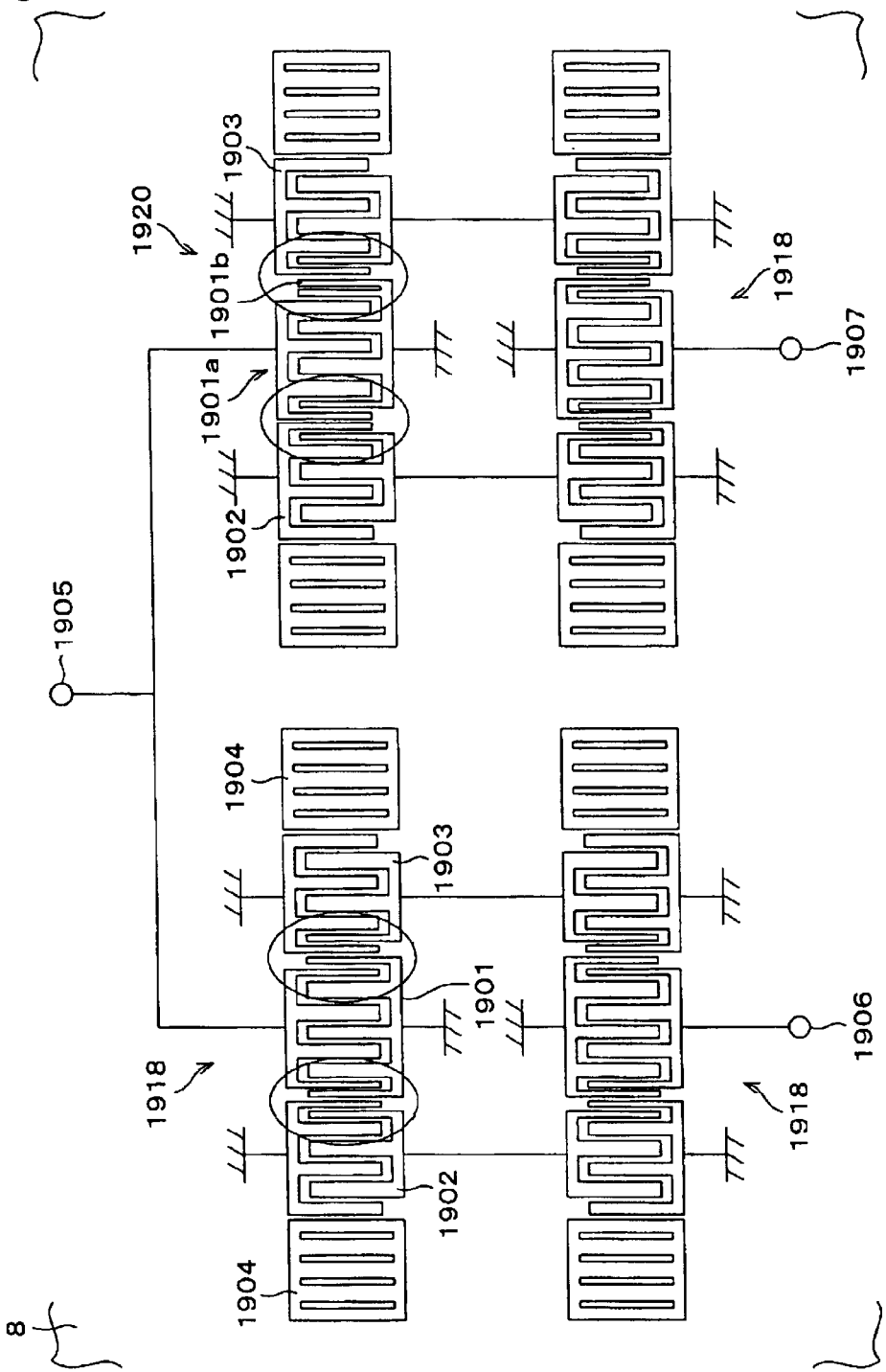
FIG. 33 is a schematic diagram illustrating a SAW apparatus according to a fourth preferred embodiment of the present invention.

A SAW apparatus according to the fourth preferred embodiment shown in FIG. 33 includes two longitudinally-coupled-resonator-type SAW filters 1918 and 1920, having output signals that are about 180° out of phase with each other. One terminal of the SAW filter 1918 and one terminal of the SAW filter 1920 are connected in parallel to each other so as to define an unbalanced signal terminal 1905, and the other terminals of the SAW filters 1918 and 1920 are connected in series to each other so as to define balanced signal terminals 1906 and 1907. With this arrangement, the SAW apparatus is provided with a balanced-to-unbalanced conversion function. Additionally, an extra longitudinally-coupled-resonator-type SAW filter 1918 is cascade-connected to each of the SAW filters 1918 and 1920, respectively. Withdrawal weighting is applied to the SAW filter 1920 by providing a dummy electrode 1901b.

In the fourth preferred embodiment, the four longitudinally-coupled-resonator-type SAW filters 1918 and 1920 are preferably defined by AL electrodes provided on a piezoelectric substrate 8. The four SAW filters 1918 and 1920 are designed similarly, except that the output signals from the SAW filters 1918 and the output signal from the SAW filter 1920 are about 180° out of phase with each other, and that the SAW filter 1920 is withdrawal-weighted. As in the third preferred embodiment, a few narrower-pitch electrode fingers are provided between two adjacent IDTs. The configuration of the fourth preferred embodiment is similar to that of the second comparative example shown in FIG. 68, except for weighting.

When the wavelength determined by the narrower pitch of the electrode fingers is indicated by $\lambda I_2$, and when the wavelength determined by the pitch of the other electrode fingers is indicated by $\lambda I_1$, detailed designs of the SAW filter 1918 are as follows (the number in parentheses indicates the number of narrower-pitch electrode fingers):

interdigital length W:25.2 $\lambda I_1$;

number of pairs of electrode fingers of IDT 1902: 23(4);

number of pairs of electrode fingers of IDT 1901: (4)26 (4);

number of pairs of electrode fingers of IDT 1903: 23(4);

IDT wavelength $\lambda I_1$: 4.204 μm;

IDT wavelength $\lambda I_2$: 3.854 μm;

reflector wavelength $\lambda R$: 4.279 μm;

number of electrode fingers of reflector: 90;

IDT pitch:

pitch between wider-pitch electrode finger ($\lambda I_1$) and narrower-pitch electrode finger ($\lambda I_2$) (indicated by 215, 216, 217, and 218): 0.25 $\lambda I_1$+0.25 $\lambda I_2$;

pitch between narrower-pitch electrode fingers ($\lambda I_2$): 0.50 $\lambda I_2$ pitch between IDT and reflector: 0.470 $\lambda R$;

IDT duty: 0.720 reflector duty: 0.55; and electrode thickness: 0.080 $\lambda I_1$.

The fourth preferred embodiment includes the dummy electrode 1901b. More specifically, in order to invert the phase of an output signal from the SAW filter 1920 from that of the SAW filter 1918, the direction of an IDT 1901a of the SAW filter 1920 is inverted with respect to the IDT 1901 of the SAW filter 1918. One side of the IDT 1901a is withdrawal-weighted, and the dummy electrode 1901b is then provided in the weighted portion and is grounded.

Figure 34:
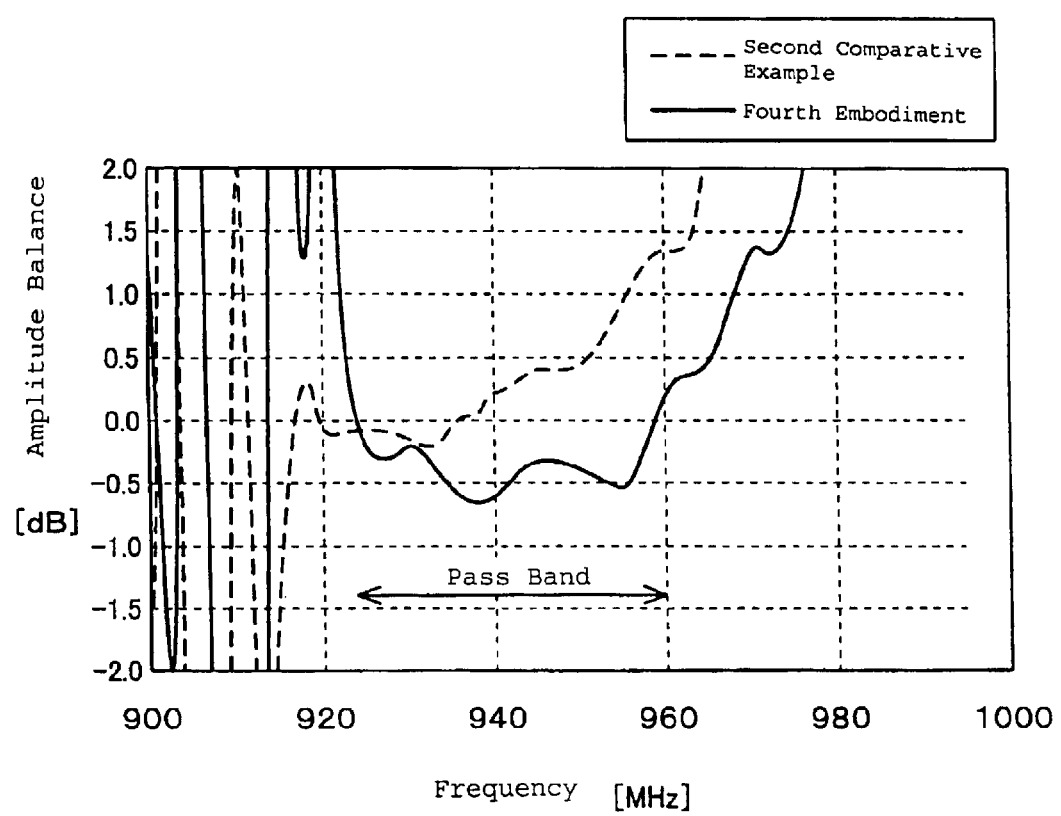
FIG. 34 is a graph illustrating the amplitude balance level (amplitude balance) of the SAW apparatus of the fourth preferred embodiment of the present invention and that of the second comparative example.
Figure 68:
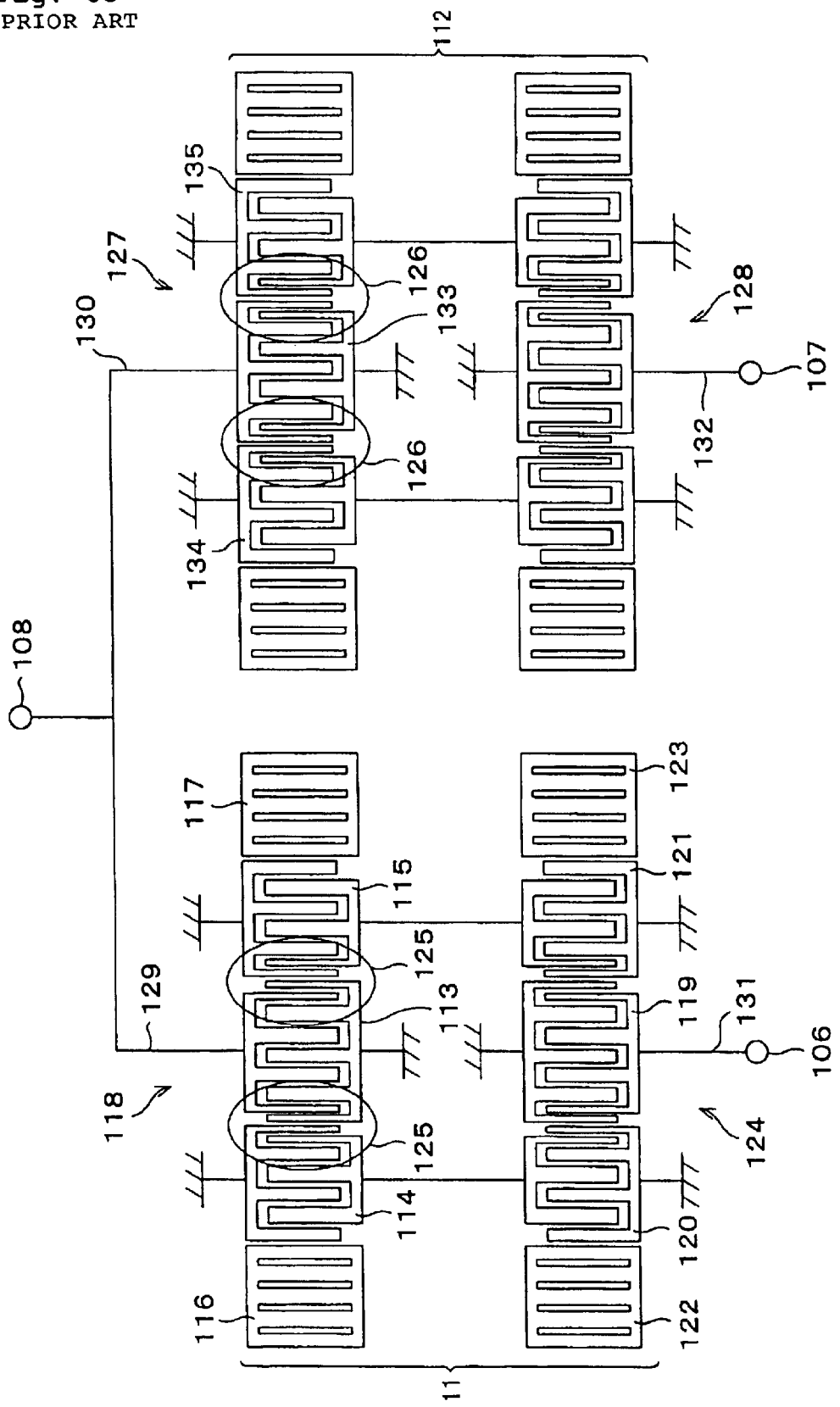
FIG. 68 is a schematic diagram illustrating the SAW apparatus of the second comparative example.
Figure 69:
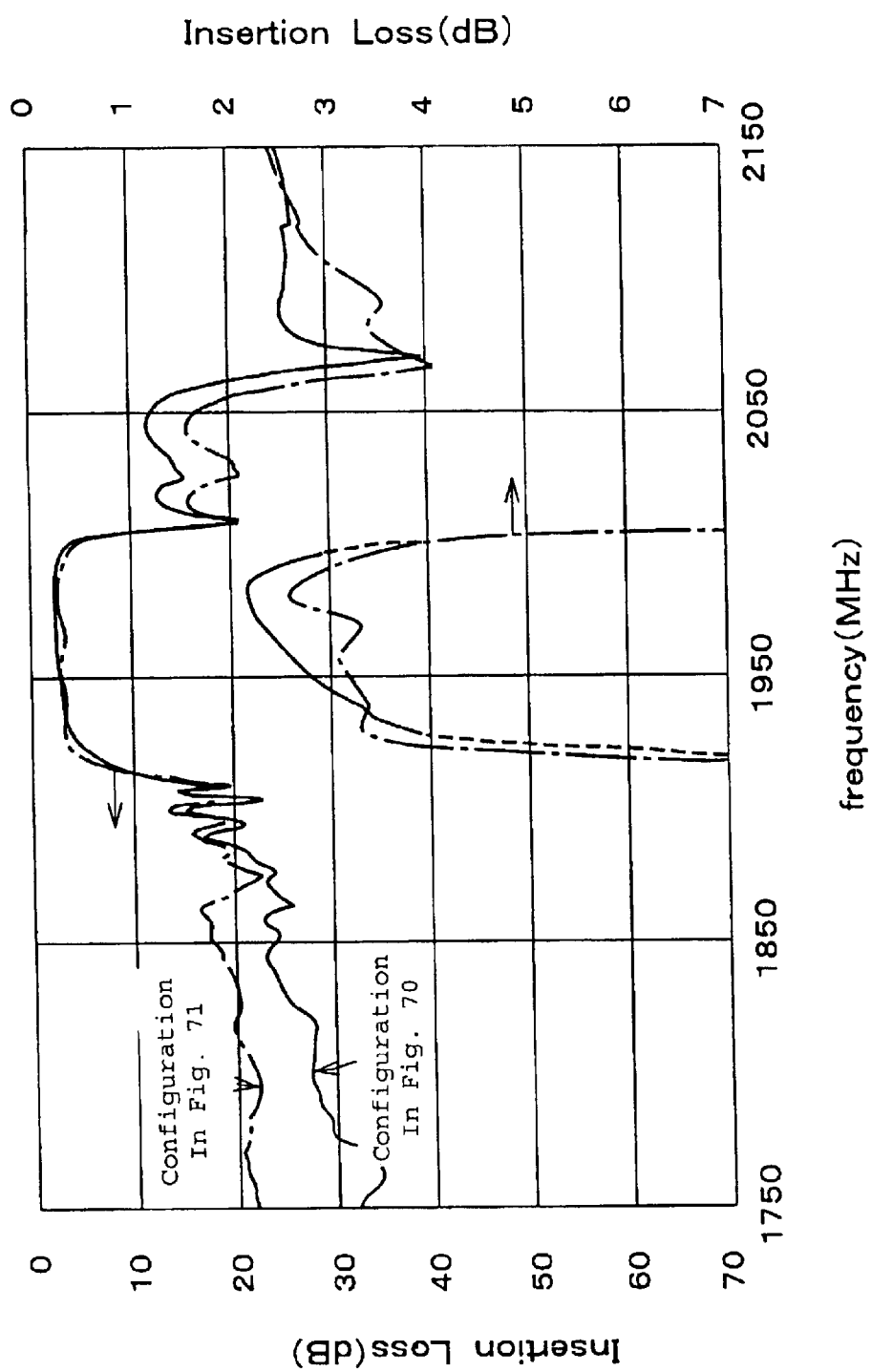
FIG. 69 is a graph illustrating a difference in insertion loss between balanced signal terminals of a known SAW apparatus.
Figure 70:
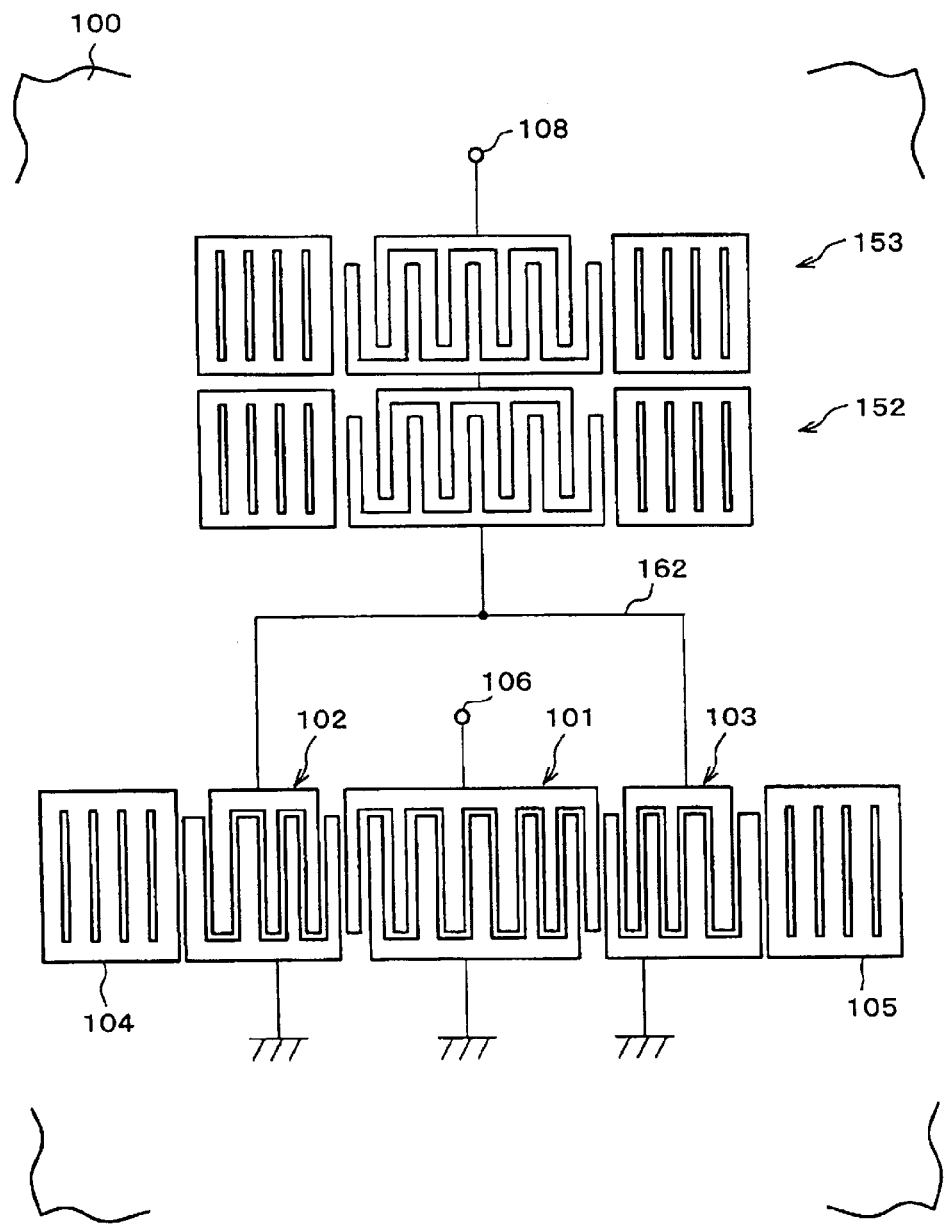
FIGS. 70 and 71 are schematic diagrams illustrating a difference in insertion loss between the balanced signal terminals of the known SAW apparatus.
Figure 71:
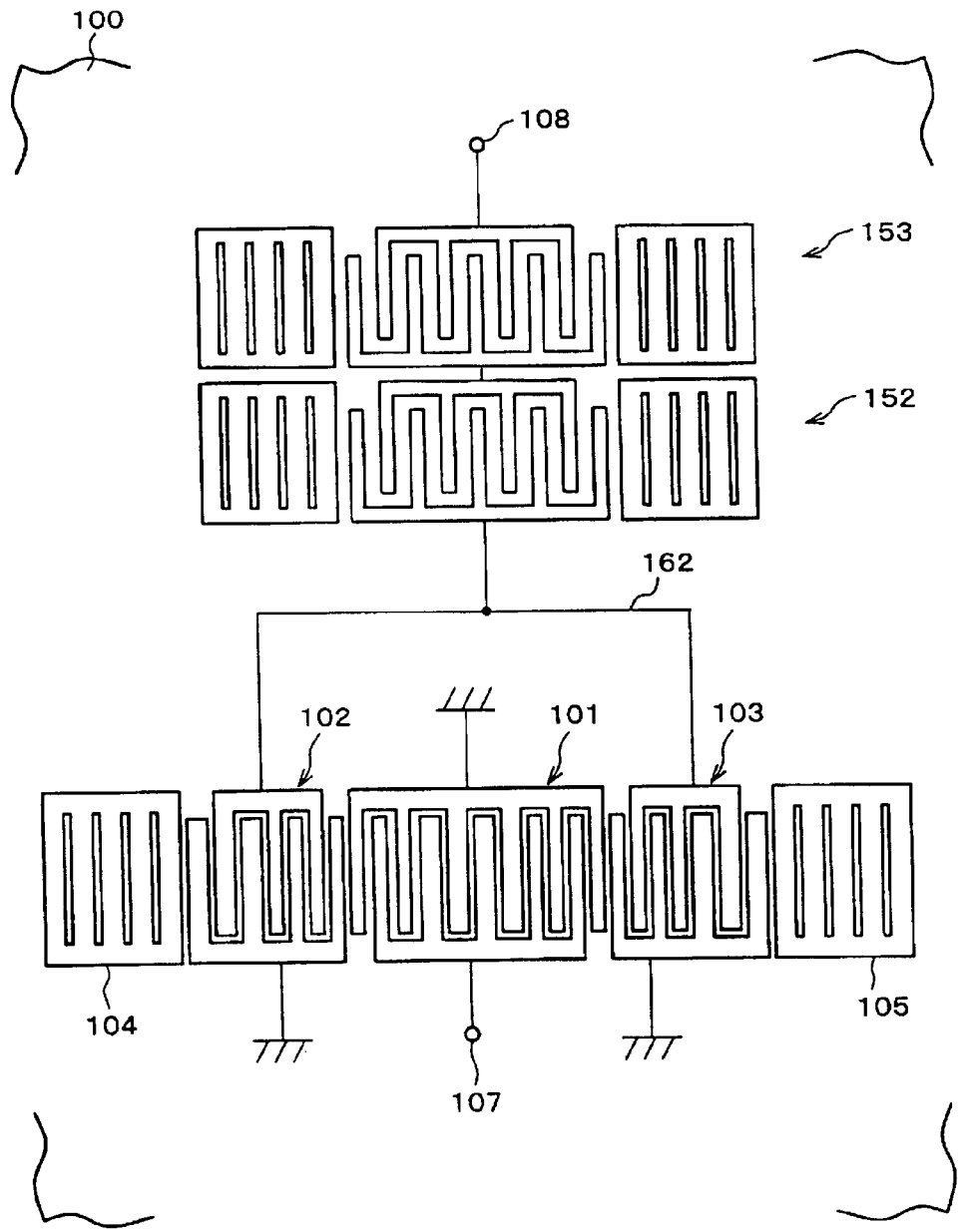

The amplitude balance level between balanced signal terminals 1906 and 1907 with respect to the frequency obtained by the fourth preferred embodiment is shown in FIG. 34. For comparison, the amplitude balance level between the balanced signal terminals with respect to the frequency in the second comparative example shown in FIG. 68 is also shown in FIG. 34. The configuration of the second comparative example is the same as that of the fourth preferred embodiment, except that withdrawal-weighting is not applied to the second comparative example. The frequency range in the pass band used for EGSM receiving filters is 925 MHz to 960 MHz.

The amplitude balance level between the balanced signal terminals in the second comparative example ranges from −0.2 dB to +1.3 dB (having a deviation of 1.5 dB). In contrast, the amplitude balance level obtained by the fourth preferred embodiment ranges from −0.7 dB to +0.2 dB (having a deviation of 0.9 dB). Accordingly, the amplitude balance level is improved by about 0.6 dB.

The reason for this is as follows. A SAW is excited between adjacent electrode fingers having different polarities. The excitation state of SAWs in the portions between adjacent IDTs of the SAW filters 118 and 127 (indicated by 125 and 126 in FIG. 68) shown in FIG. 68 is shown in FIG. 35.

Figure 35:
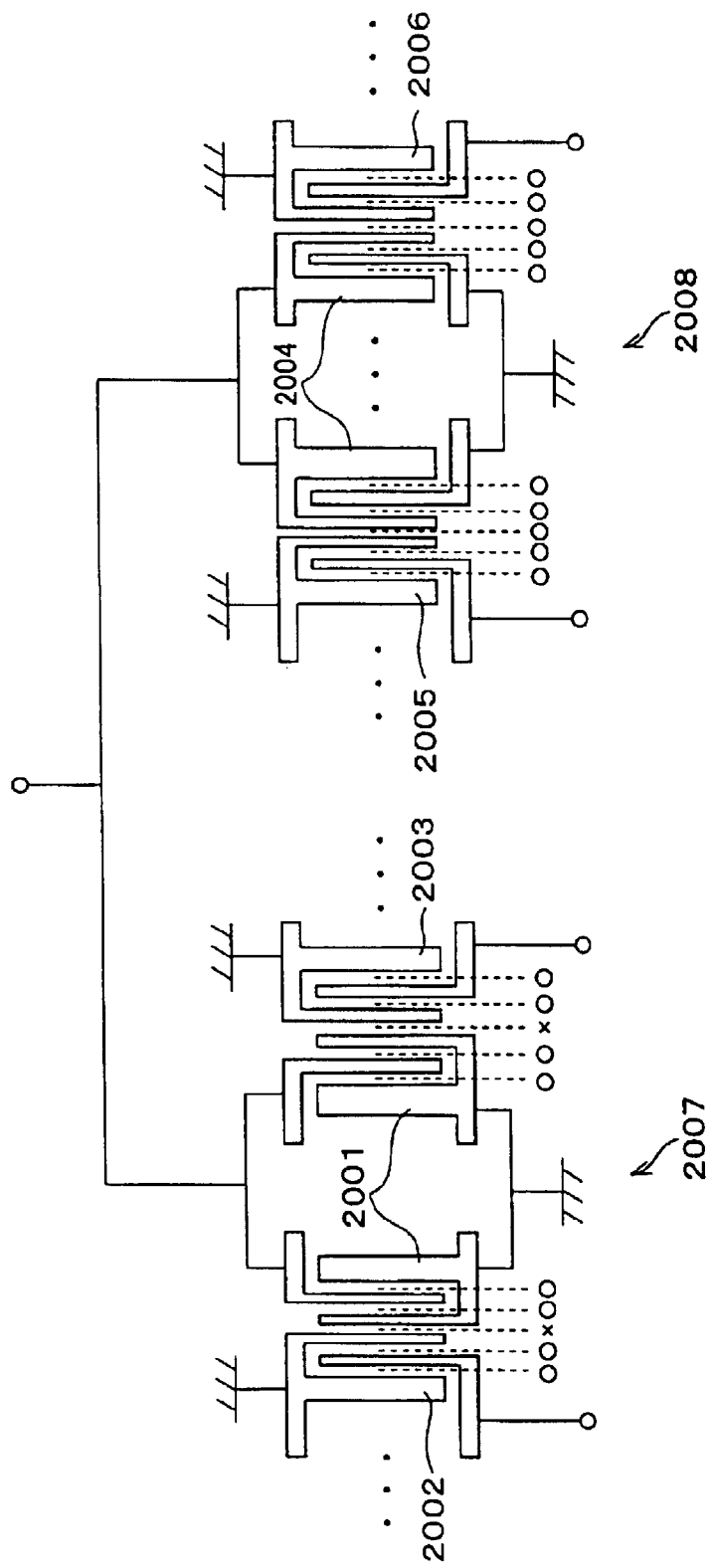
FIG. 35 is a schematic diagram illustrating the reduced balance levels in the second comparative example.

In FIG. 35, only three electrode fingers of each IDT adjacent to another IDT are shown, and other electrode fingers are omitted. The SAW filters 118 and 127 shown in FIG. 68 correspond to longitudinally-coupled-resonator-type SAW filters 2007 and 2008, respectively, shown in FIG. 35. The IDTs 113, 114, and 115 shown in FIG. 68 correspond to IDTs 2001, 2002, and 2003, respectively, shown in FIG. 35. The IDTs 133, 134, and 135 shown in FIG. 68 correspond to IDTs 2004, 2005, and 2006, respectively, shown in FIG. 35. In FIG. 35, a SAW is excited in portions indicated by the circle, and a SAW is not excited in portions indicated by the cross (x).

In the second comparative example, in the longitudinally-coupled-resonator-type SAW filter 2007, since the outermost electrode fingers of the IDTs 2001, 2002, and 2003 are ground electrodes, a SAW is not excited between adjacent electrode fingers.

In contrast, in the longitudinally-coupled-resonator-type SAW filter 2008, since an output signal of the IDT 2004 is about 180° out of phase with that of the IDT 2001 by inverting the direction of the IDT 2001, the outermost electrode fingers of the IDT 2004 are signal electrode fingers, and the outermost electrode fingers of the IDTs 2005 and 2006 are ground electrodes.

Accordingly, unlike the SAW filter 2007, in the SAW filter 2008, a SAW is excited between adjacent electrode fingers of the IDTs 2004, 2005, and 2006, and thus, a SAW is excited in two additional portions of the SAW filter 2008 than those of the SAW filter 2007.

In the second comparative example, therefore, the intensity distribution of the effective current of a SAW between adjacent electrode fingers is different between the SAW filters 2007 and 2008. As a result, in the three resonance modes shown in FIG. 72A, the period between the central resonance mode B and the highest-frequency resonance mode C is different between the SAW filters 2007 and 2008, thereby reducing the balance level between the balanced signal terminals.

Figure 36:
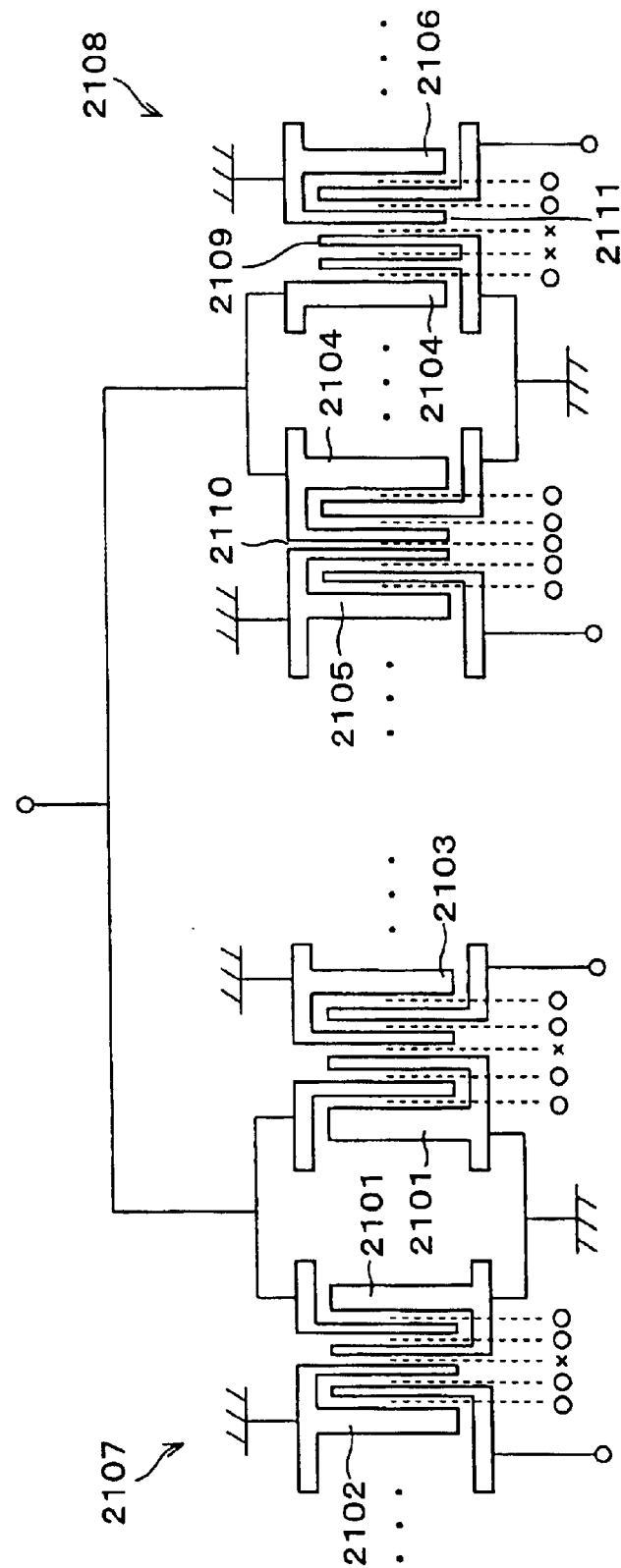
FIG. 36 is a schematic diagram illustrating the improved balance levels in the fourth preferred embodiment of the present invention.

FIG. 36 illustrates the SAW excitation state in the portions between adjacent IDTs (indicated by elliptic shapes in FIG. 33) in the SAW filters 1918 and 1920 shown in FIG. 33. As in FIG. 35, in FIG. 36, only three electrode fingers from the edge of each IDT adjacent to another IDT are shown, and the other electrode fingers are omitted.

The SAW filters 1918 and 1920 shown in FIG. 33 correspond to SAW filters 2107 and 2108, respectively. The IDTs 1902, 1901, and 1903 of the SAW filter 1918 shown in FIG. 33 correspond to IDTs 2102, 2101, and 2103, respectively, shown in FIG. 36. The IDTs 1901a, 1902, and 1903 shown in FIG. 33 correspond to IDTs 2104, 2105, and 2106, respectively, shown in FIG. 36.

In the fourth preferred embodiment, by inverting the direction the IDT of the SAW filter 2108 connected to the input side from that of the SAW filter 2107 connected to the input side, an output signal from the SAW filter 2107 is about 180° out of phase with that from the SAW filter 2108. The outermost electrode finger of the IDT 2104 is withdrawal-weighted, and a dummy electrode finger 2109 (the dummy electrode 1901b in FIG. 33) is then disposed in the weighted portion and is grounded.

Accordingly, in the SAW filter 2108, signal electrode fingers and ground electrode fingers are alternately provided in a portion 2110 between the IDTs 2104 and 2105, and thus, a SAW is excited. In contrast, three ground electrode fingers are sequentially disposed in a portion 2111 between two adjacent IDTs 2104 and 2106, and thus, a SAW is not excited in two portions.

As a result, the total number of portions in which a SAW is not excited in the SAW filter 2107 is the same as that in the SAW filter 2108. In other words, the total number of portions in which a SAW is excited in the SAW filter 2107 is equal to that in the SAW filter 2108. Thus, the period of appearance of the resonance modes is less than that of the second comparative example, thereby improving the amplitude balance level between the balanced signal terminals.

Figure 37:
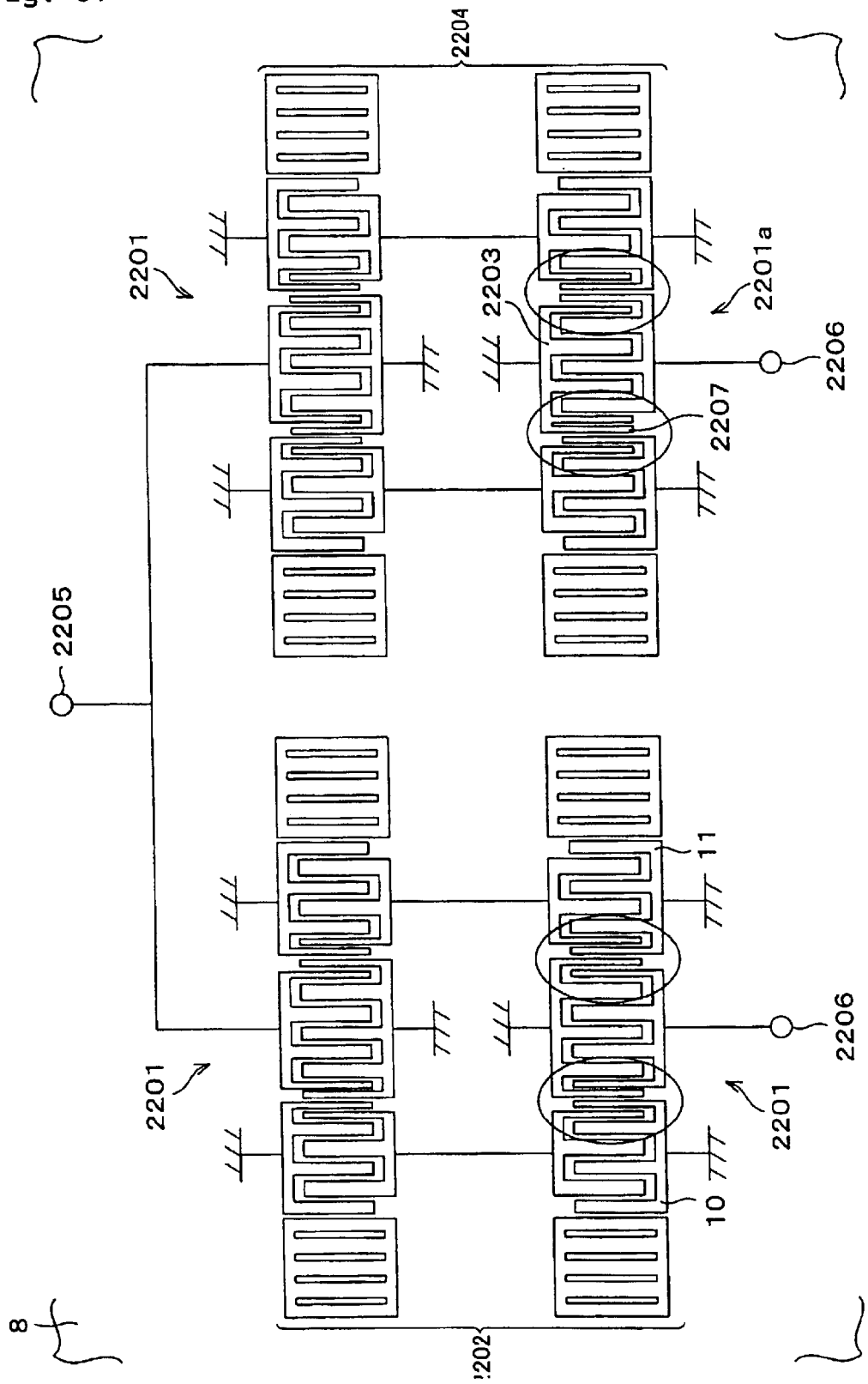
FIG. 37 is a schematic diagram illustrating a modification made to the fourth preferred embodiment of the present invention.

For example, a SAW apparatus shown in FIG. 37 includes a first longitudinally-coupled-resonator-type SAW filter unit 2202 and a second longitudinally-coupled-resonator-type SAW filter unit 2204. The first SAW filter unit 2202 is preferably defined by cascade-connecting two longitudinally-coupled-resonator-type SAW filters 2201. The second SAW filter unit 2202 is preferably defined by cascade-connecting the longitudinally-coupled-resonator-type SAW filter 2201 and a longitudinally-coupled-resonator-type SAW filter 2201a. The direction of an IDT 2203 of the SAW filter 2201a is inverted with respect to that of the corresponding IDT of the SAW filter 2201. Accordingly, an output signal from the SAW filter unit 2202 is about 180° out of phase with an output signal from the SAW filter unit 2204. The central IDTs of the first stage of SAW filters 2201 are connected in parallel to each other to define an unbalanced signal terminal 2205. The central IDTs of the second stage of the SAW filters 2201 and 2201a are connected in series to each other so as to define balanced signal terminals 2206.

Figure 38:
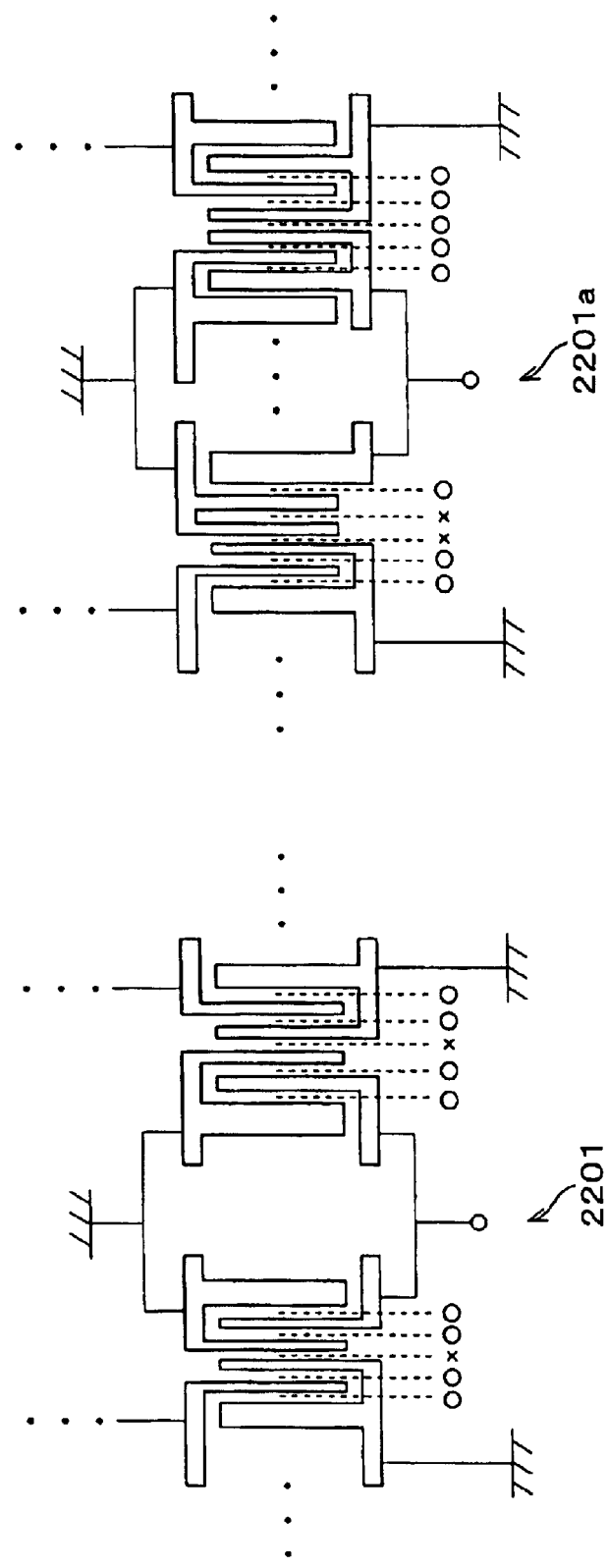
FIG. 38 is a schematic diagram illustrating the improved balance levels in the modification shown in FIG. 37.

As in the fourth preferred embodiment, with this modification, the outermost electrode finger of the IDT 2203 is withdrawal-weighted, and a dummy electrode 2207 is provided in the weighted portion and is grounded. The SAW excitation state in the portion between two adjacent IDTs (indicated by the elliptical shapes in FIG. 37) in the first and second SAW filter units 2202 and 2204 connected to the balanced signal terminals 2206 is shown in FIG. 38. The total number of portions between electrode fingers in which a SAW is not excited in the SAW filter unit 2202 is equal to that in the SAW filter unit 2204. Thus, the amplitude balance level between the balanced signal terminals 2206 is improved.

Figure 39:
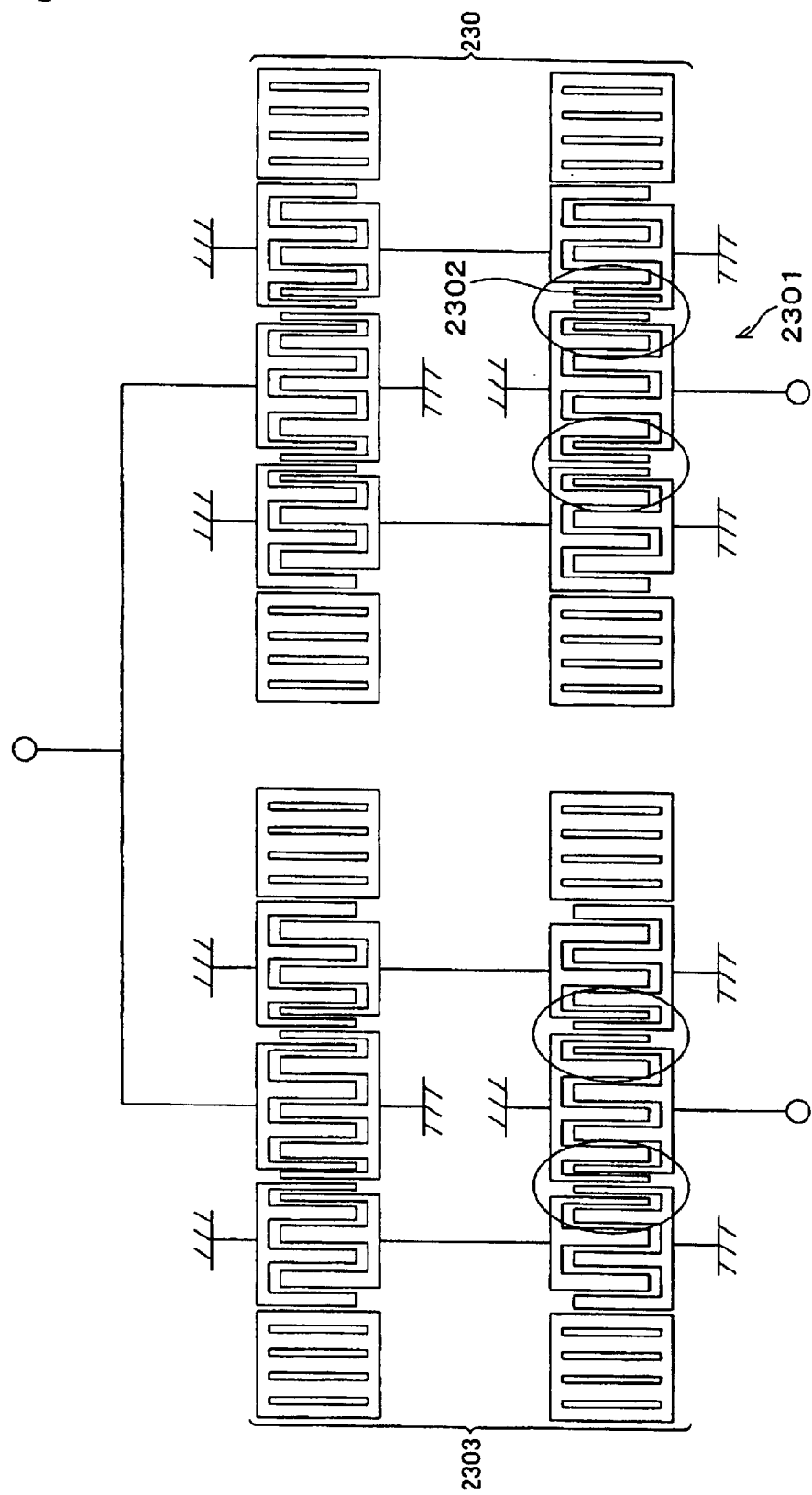
FIG. 39 is a schematic diagram illustrating another modification made to the fourth preferred embodiment of the present invention.

As shown in FIG. 39, instead of inverting the central IDT of the second stage of the SAW filter, the direction of the external IDTs may be inverted, and thus, an output signal from a first SAW filter unit 2303 is about 180° out of phase with an output signal from a second SAW filter unit 2304.

Figure 40:
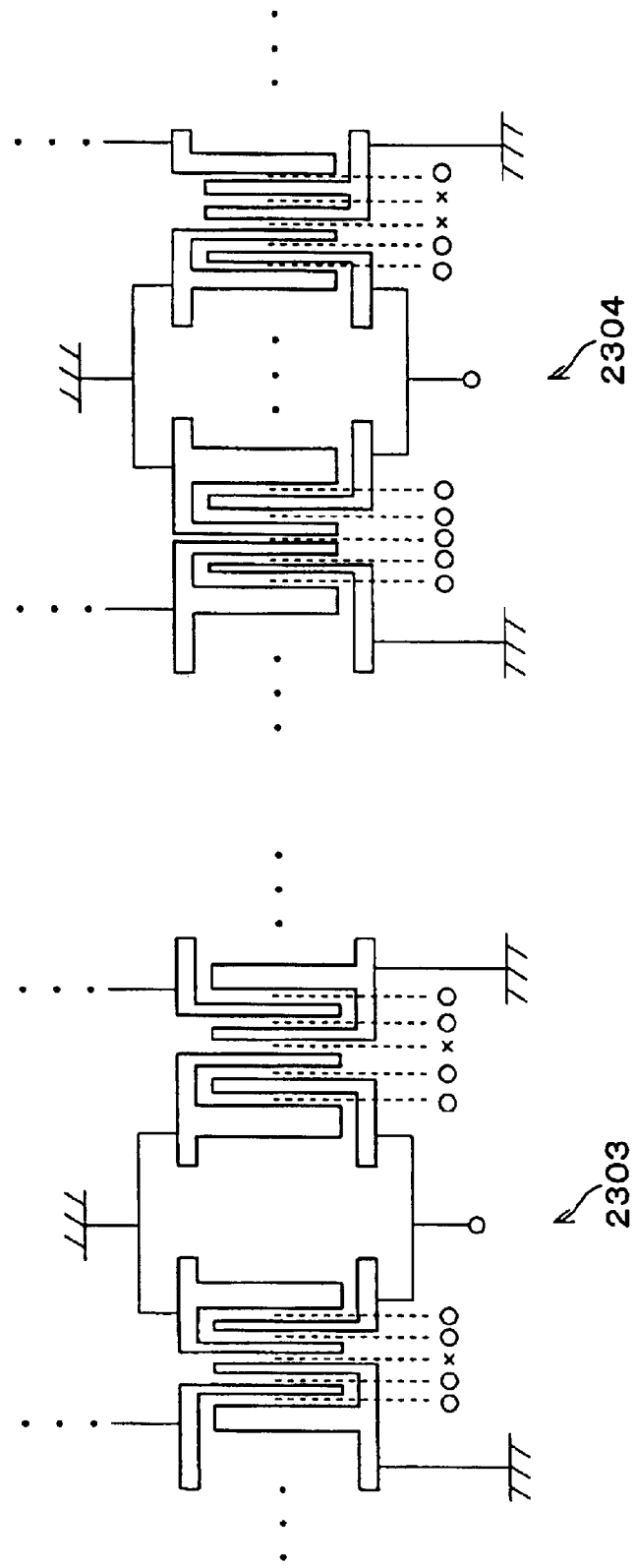
FIG. 40 is a schematic diagram illustrating the improved balance levels in the modification shown in FIG. 39.

As in the fourth preferred embodiment, with this modification, the outermost electrode finger of an inverted IDT 2301 is withdrawal-weighted, and a dummy electrode 2302 is provided in the weighted portion and is grounded. In this case, the SAW excitation state of the portions between two adjacent IDTs (indicated by the elliptical shapes in FIG. 39) in the SAW filter connected to the balanced signal terminals is shown in FIG. 40. As shown in FIG. 40, the total number of portions between electrode fingers in which a SAW is not excited in the first SAW filter unit 2303 is equal to that in the second SAW filter unit 2304. As a result, the amplitude balance level between the balanced signal terminals is greatly improved.

Figure 41:
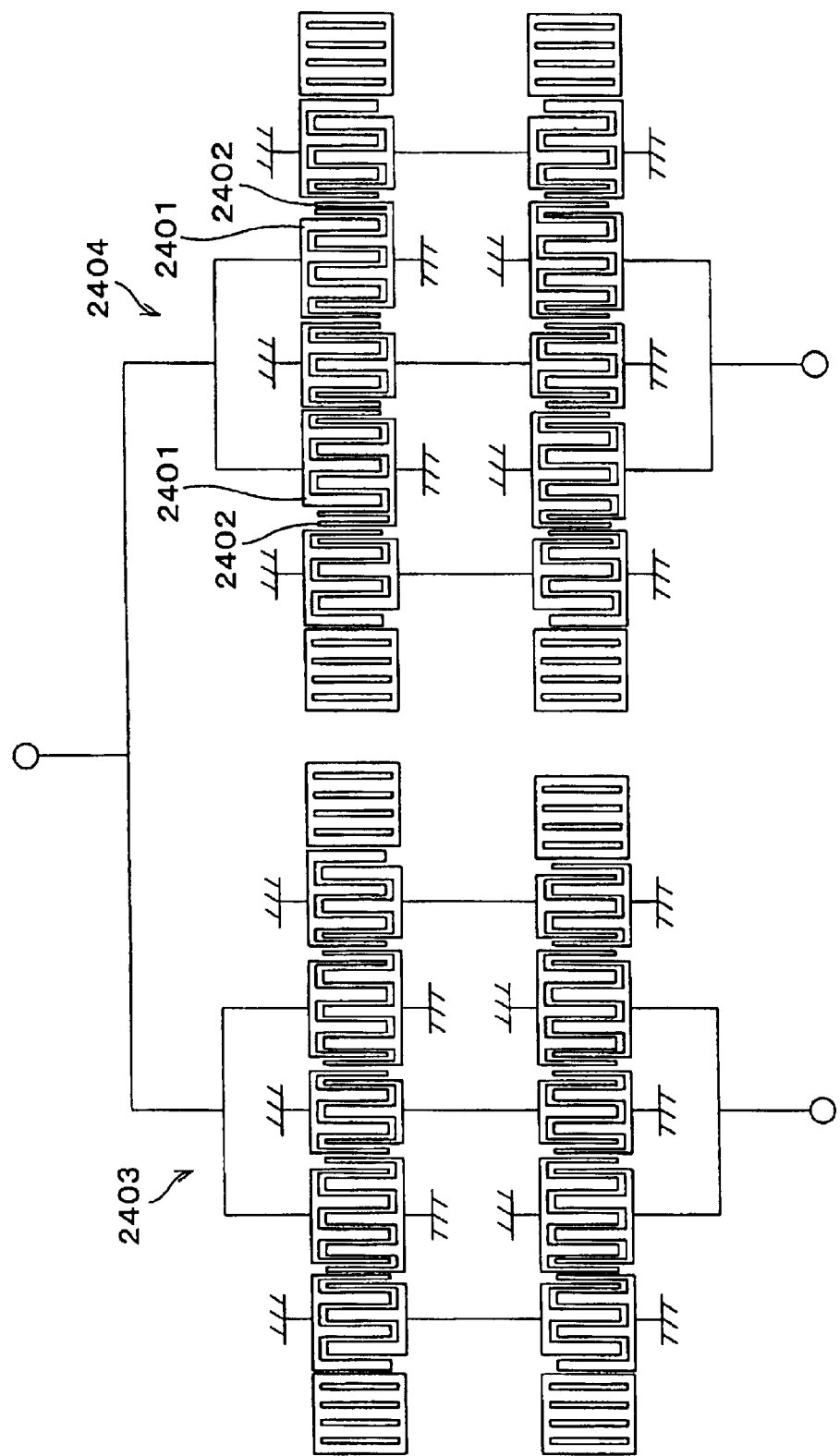
FIG. 41 is a schematic diagram illustrating still another modification made to the fourth preferred embodiment of the present invention.

Instead of the three-IDT-type longitudinally-coupled-resonator-type filters shown in FIG. 33, five-IDT-type longitudinally-coupled-resonator-type filters may be used, as shown in FIG. 41. In this case, one of the outermost electrode fingers of an inverted IDT 2401 is withdrawal-weighted, and a dummy electrode finger 2402 is provided in the weighted portion and is grounded. Thus, the total number of portions between electrode fingers in which a SAW is not excited in a first SAW filter unit 2403 is the same as that in a second SAW filter unit 2404. Thus, the amplitude balance level between the balanced signal terminals is greatly improved.

As described above, according to the SAW apparatus of the fourth preferred embodiment, two SAW filters having output signals that are about 180° out of phase with each other, and one signal terminal of one SAW filter and one signal terminal of the other SAW filter are connected in series to each other to define balanced signal terminals, while the other signal terminals of the two SAW filters are connected in parallel to each other to define an unbalanced signal terminal. With this arrangement, the SAW apparatus is provided with a balanced-to-unbalanced conversion function. Moreover, an additional SAW filter is cascade-connected to each of the two SAW filters, and then, withdrawal-weighting is applied to the cascade-connected SAW filter. As a result, a SAW apparatus having improved balance levels between balanced signal terminals over known SAW apparatuses is provided.

A fifth preferred embodiment of the present invention is discussed below with reference to FIGS. 42 through 46. In the fifth preferred embodiment, the present invention is described in the context of a Digital Cellular System (DCS) receiving filter.

Figure 42:
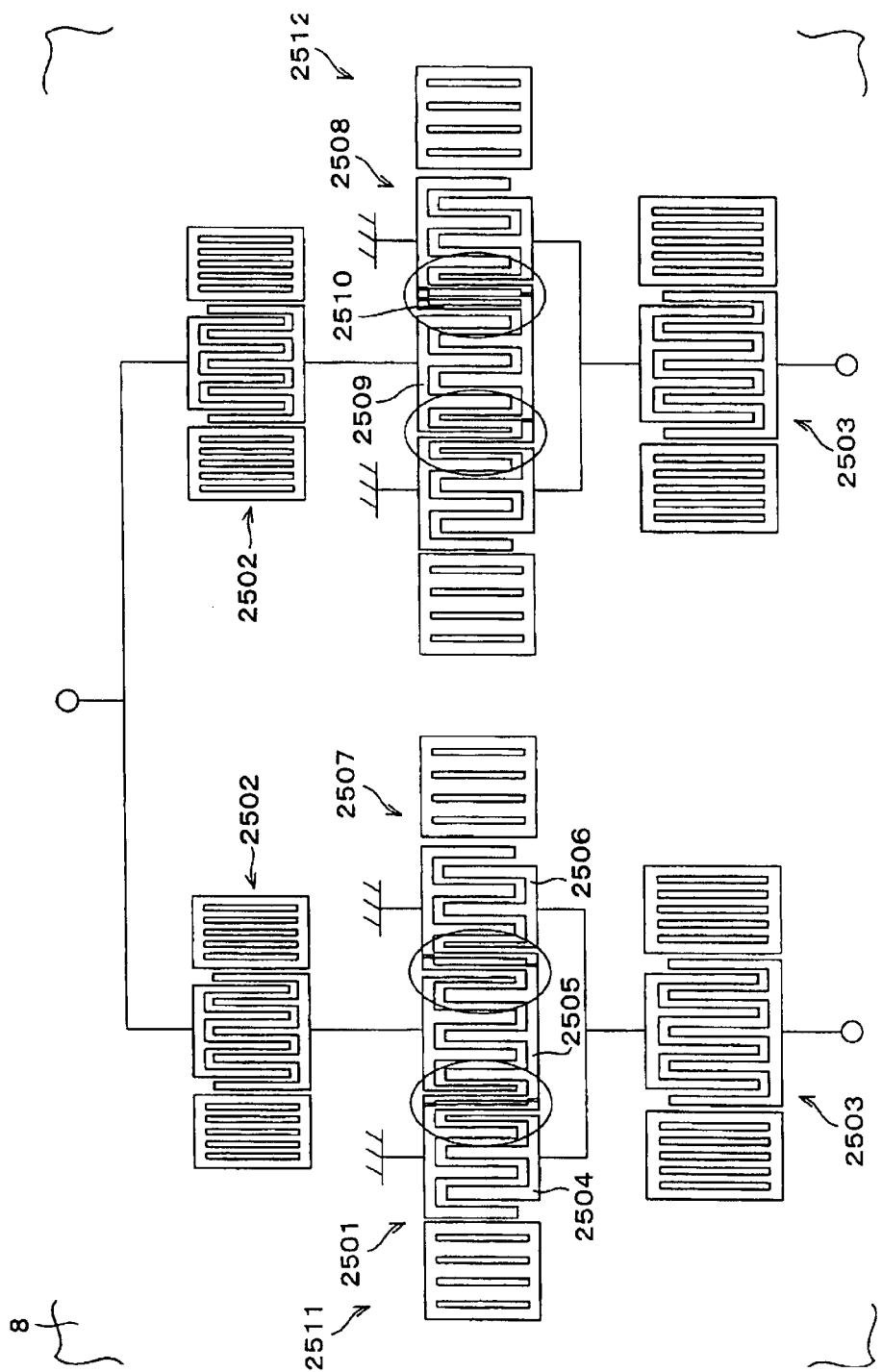
FIG. 42 is a schematic diagram illustrating a SAW apparatus according to a fifth preferred embodiment of the present invention.

A SAW apparatus according to the fifth preferred embodiment of the present invention is shown in FIG. 42. Two longitudinally-coupled-resonator-type SAW filters having output signals that are about 180° out of phase with each other are provided. One terminal of one SAW filter and one terminal of the other SAW filter are connected in series to each other so as to define balanced signal terminals, while the other terminals of the SAW filters are connected in parallel to each other so as to define an unbalanced signal terminal. Accordingly, the SAW apparatus is provided with a balanced-to-unbalanced conversion function. Weighting is applied to this configuration.

In the fifth preferred embodiment, longitudinally-coupled-resonator-type SAW filters 2501 and 2508 and SAW resonators 2502 and 2503 are preferably formed by Al electrodes on the above-described piezoelectric substrate 8. The SAW resonators 2502 and 2503 are connected in series to each of the SAW filters 2501 and 2508. The two SAW filters 2501 and 2508 are similar, except that an output signal from the SAW filter 2501 is about 180° out of phase with that from the SAW filter 2508. As in the third preferred embodiment, in the fifth preferred embodiment, a few narrower-pitch electrode fingers are provided between two IDTs.

When the wavelength determined by the narrower pitch of the electrode fingers is indicated by $\lambda I_2$, and when the wavelength determined by the pitch of the other electrode fingers is indicated by $\lambda I_1$, detailed designs of the SAW filters 2501 and 2508 are as follows (the number in parentheses indicates the number of narrower-pitch electrode fingers):

interdigital length W: 37.12 $\lambda I_1$;
number of pairs of electrode fingers of IDT 2504: (4)19;
number of pairs of electrode fingers of IDT 2505: (4)31 (4);
number of pairs of electrode fingers of IDT 2506: 19(4);
IDT wavelength $\lambda I_1$: 2.156 $\mu$m;
IDT wavelength $\lambda I_2$: 1.926 $\mu$m;
reflector wavelength $\lambda R$: 2.177 $\mu$m;
number of electrode fingers of reflector: 150;
IDT pitch:
pitch between wider-pitch electrode finger ($\lambda I_1$) and narrower-pitch electrode
finger ($\lambda I_2$): 0.25 $\lambda I_1$+0.25 $\lambda_2$;
pitch between narrower-pitch electrode fingers ($\lambda I_2$): 0.50 $\lambda I_2$;
pitch between IDT and reflector: 0.50 $\lambda R$;
IDT duty: 0.63;
reflector duty: 0.60; and
electrode thickness: 0.09 $\lambda I_1$.

Detailed designs of the SAW resonator 2502 are as follows:

interdigital length W: 14.3 $\lambda I$;
number of pairs of electrode fingers of IDT: 241;
wavelength $\lambda$ (for IDT and reflectors): 2.102 $\mu$m;
number of electrode fingers of reflectors: 30; and
pitch between IDT and reflector: 0.50 $\lambda R$.

Detailed designs of the SAW resonator 2503 are as follows:

interdigital length W: 37.1 $\lambda I$;
number of pairs of electrode fingers of IDT: 241;
wavelength $\lambda$ (for IDT and reflectors): 2.023 $\mu$m;

number of electrode fingers of reflector: 30; and
pitch between IDT and reflector: 0.50 $\lambda$R.

The features of the fifth preferred embodiment are as follows. In order to invert the phase of an output signal from the SAW filter 2508 with respect to that from the SAW filter 2501, the direction of an IDT 2509 of the SAW filter 2508 is inverted, and one of the outermost signal electrode fingers of the IDT 2509 is withdrawal-weighted, and a dummy electrode 2510 is provided in the weighted portion and is grounded. Additionally, the three IDTs are grounded via the dummy electrode 2510.

Figure 43:
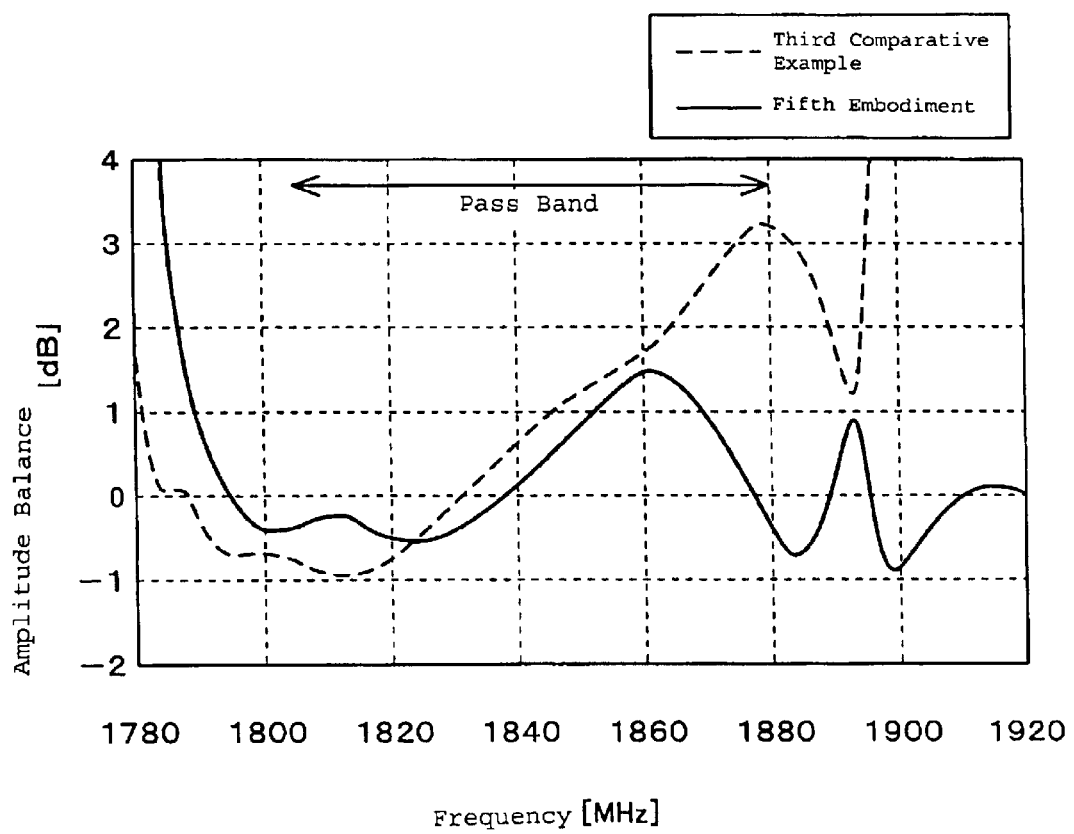
FIG. 43 is a graph illustrating the amplitude balance level (amplitude balance) of the fifth preferred embodiment of the present invention and that of a third comparative example.
Figure 44:
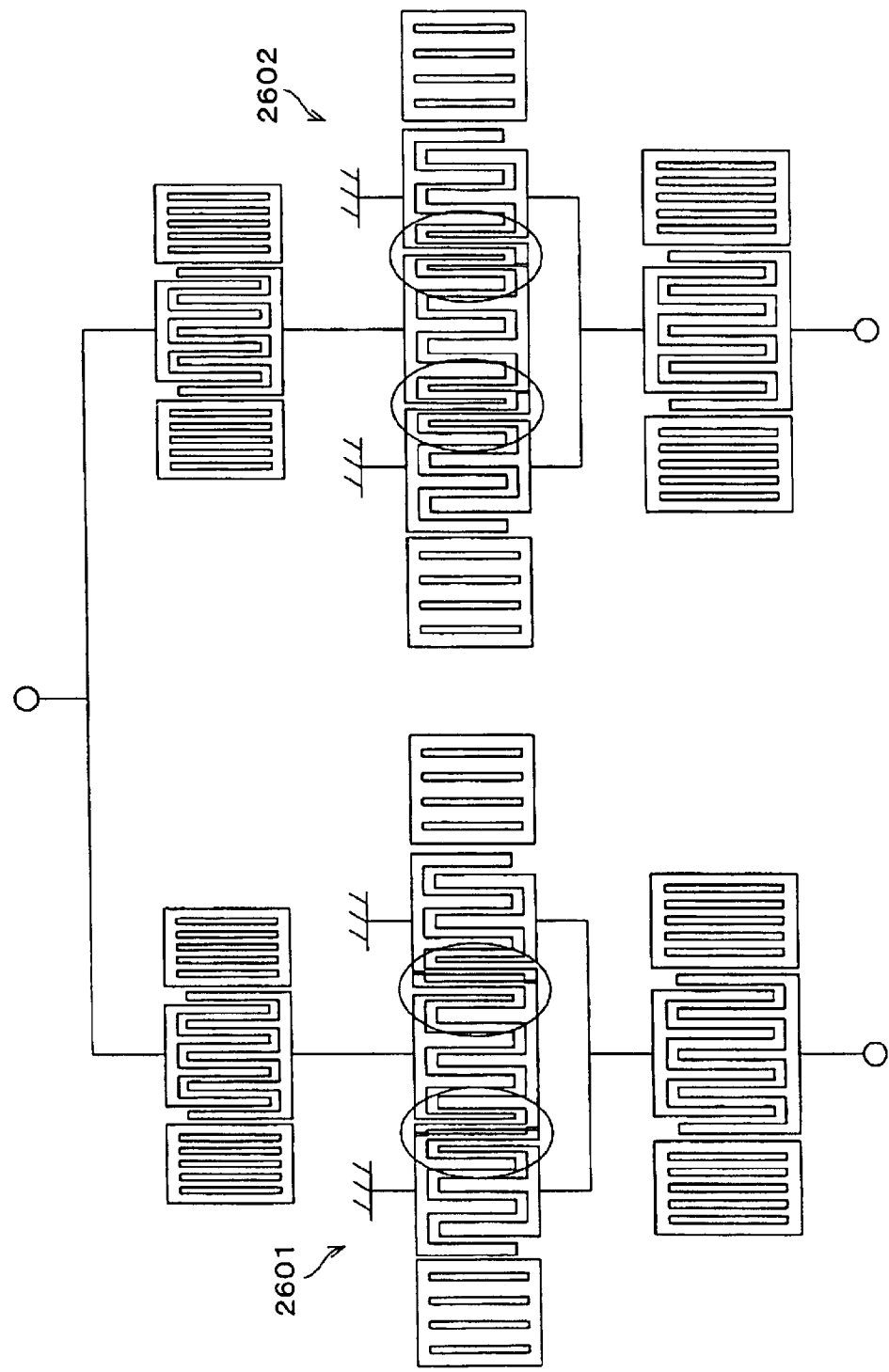
FIG. 44 is a schematic diagram illustrating a SAW apparatus of the third comparative example.

FIG. 43 illustrates the amplitude balance level between the balanced signal terminals with respect to the frequency obtained by the fifth preferred embodiment. For comparison, the amplitude balance level between balanced signal terminals in a third comparative example shown in FIG. 44 is also shown in FIG. 43. The configuration of the third comparative example shown in FIG. 44 is the same as that of the fifth preferred embodiment, except that withdrawal-weighting is not applied to the third comparative example.

The frequency range of the pass band used for DCS receiving filters is 1805 MHz to 1880 MHz. The amplitude balance level between the balanced signal terminals in this range in the third comparative example ranges from −1.0 dB to +3.2 dB (having a deviation of 4.2 dB), while the corresponding amplitude balance level obtained by the fifth preferred embodiment ranges from −0.5 dB to +1.5 dB (having a deviation of 2.0 dB). Thus, the amplitude balance level is improved by about 2.2 dB.

Figure 45:
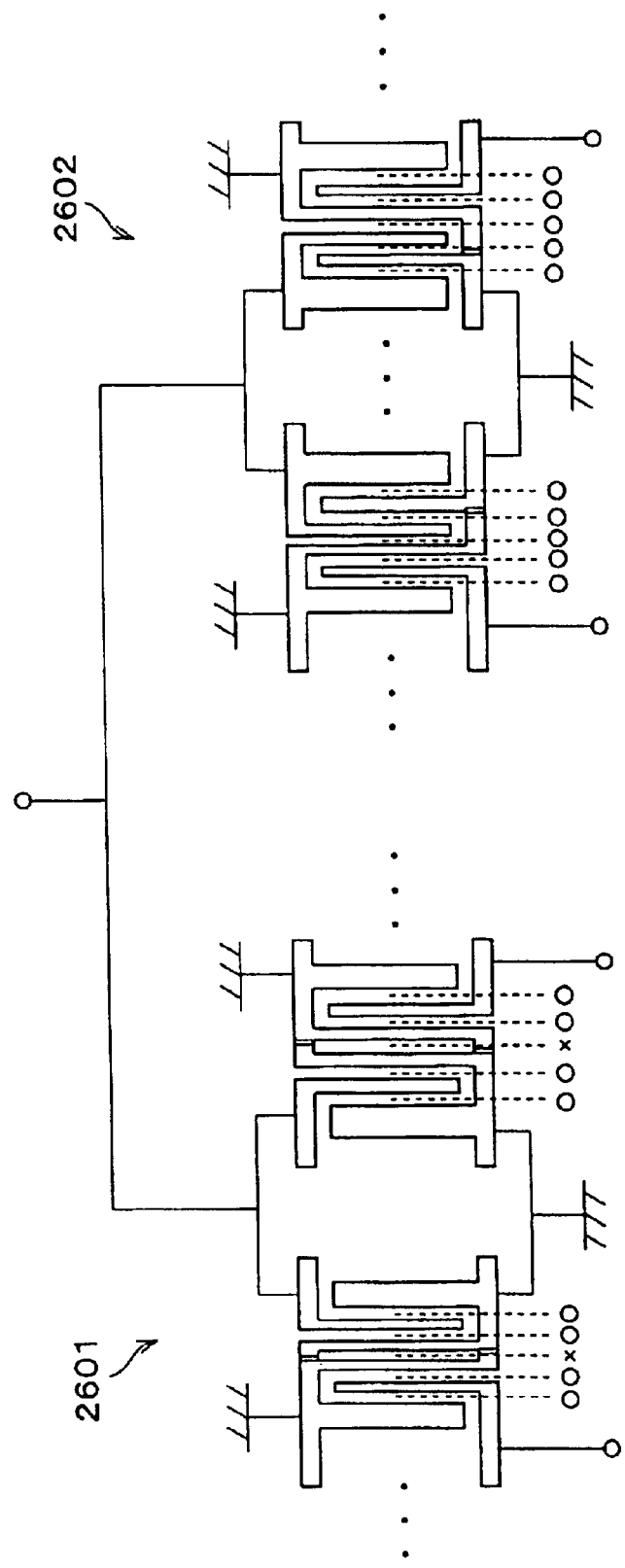
FIG. 45 is a schematic diagram illustrating the reduced balance levels in the third comparative example.
Figure 46:
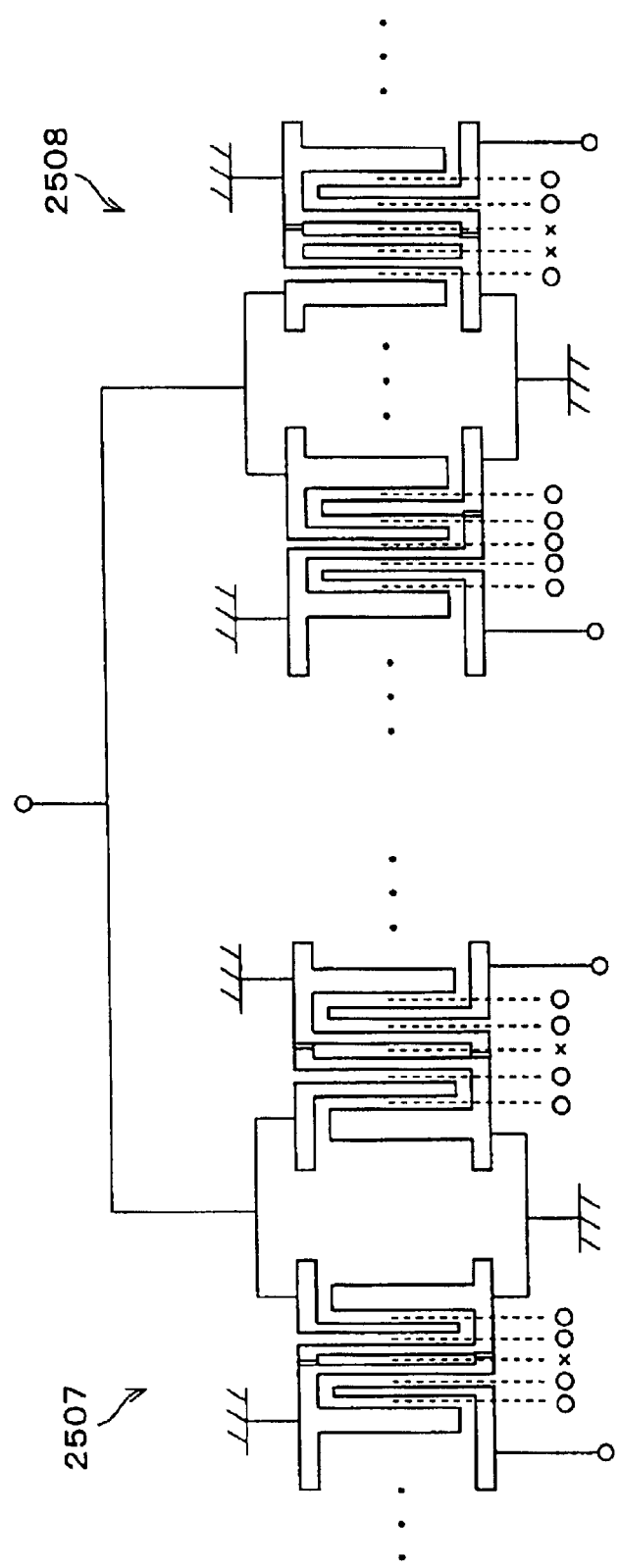
FIG. 46 is a schematic diagram illustrating the improved balance levels in the fifth preferred embodiment of the present invention.

The reason for this is as follows. The number of portions between adjacent IDTs in which a SAW is excited (indicated by the elliptical shapes in FIG. 44) in the third comparative example shown in FIG. 44 is different between a first SAW filter 2601 and a second SAW filter 2602, as shown in FIG. 45. In contrast, as shown in FIG. 46, the number of portions between adjacent IDTs in which a SAW is excited (indicated by the elliptical shapes in FIG. 42) is the same between first and second longitudinally-coupled-resonator-type SAW filter unit 2511 and 2512. Thus, in the three resonance modes shown in FIG. 72A, the period between the central resonance mode B and the highest-frequency resonance mode C between the signals output from the two balanced signal terminals is less than the third comparative example.

As described above, in the fifth preferred embodiment, the SAW apparatus includes two longitudinally-coupled-resonator-type SAW filters having output signals that are about 180° out of phase with each other. One signal terminal of one SAW filter and one signal terminal of the other SAW filter are connected in series to each other to define balanced signal terminals, and the other signal terminals of the two SAW filters are connected in parallel to each other to define an unbalanced signal terminal. With this configuration, the SAW apparatus is provided with a balanced-to-unbalanced conversion function. Withdrawal-weighting is applied to this configuration. Thus, a SAW apparatus having improved balanced levels between the balanced signal terminals over known SAW apparatuses is obtained.

The three IDTs including the dummy electrode 2510 are grounded, thereby strengthening the grounding force of the SAW apparatus. Accordingly, the insertion loss within the pass band is decreased, and the attenuation outside the pass band is greatly improved. It is noted that the ground terminal of the central IDT may be omitted.

A sixth preferred embodiment of the present invention is described below with reference to FIGS. 47 through 54. In the sixth preferred embodiment, the present invention is discussed in the context of a DCS receiving filter.

As in the third preferred embodiment, in the sixth preferred embodiment, balanced signal terminals 2711 and 2712 are connected to comb-like electrodes of an IDT 2704 of a single longitudinally-coupled-resonator-type SAW filter 2701. Weighting is then applied to the configuration of a SAW apparatus without an electrical neutral point.

In the sixth preferred embodiment, the longitudinally-coupled-resonator-type SAW filter 2701, and SAW resonators 2702 and 2703, which are connected in series to the SAW filter 2701, are formed by Al electrodes on the above-described piezoelectric substrate 8.

The configuration of the SAW filter 2701 is as follows. IDTs 2705 and 2706 are provided on the left and right sides of the IDT 2704, and reflectors 2707 and 2708 are provided such that they sandwich the IDTs 2705, 2704, and 2706 therebetween.

Figure 47:
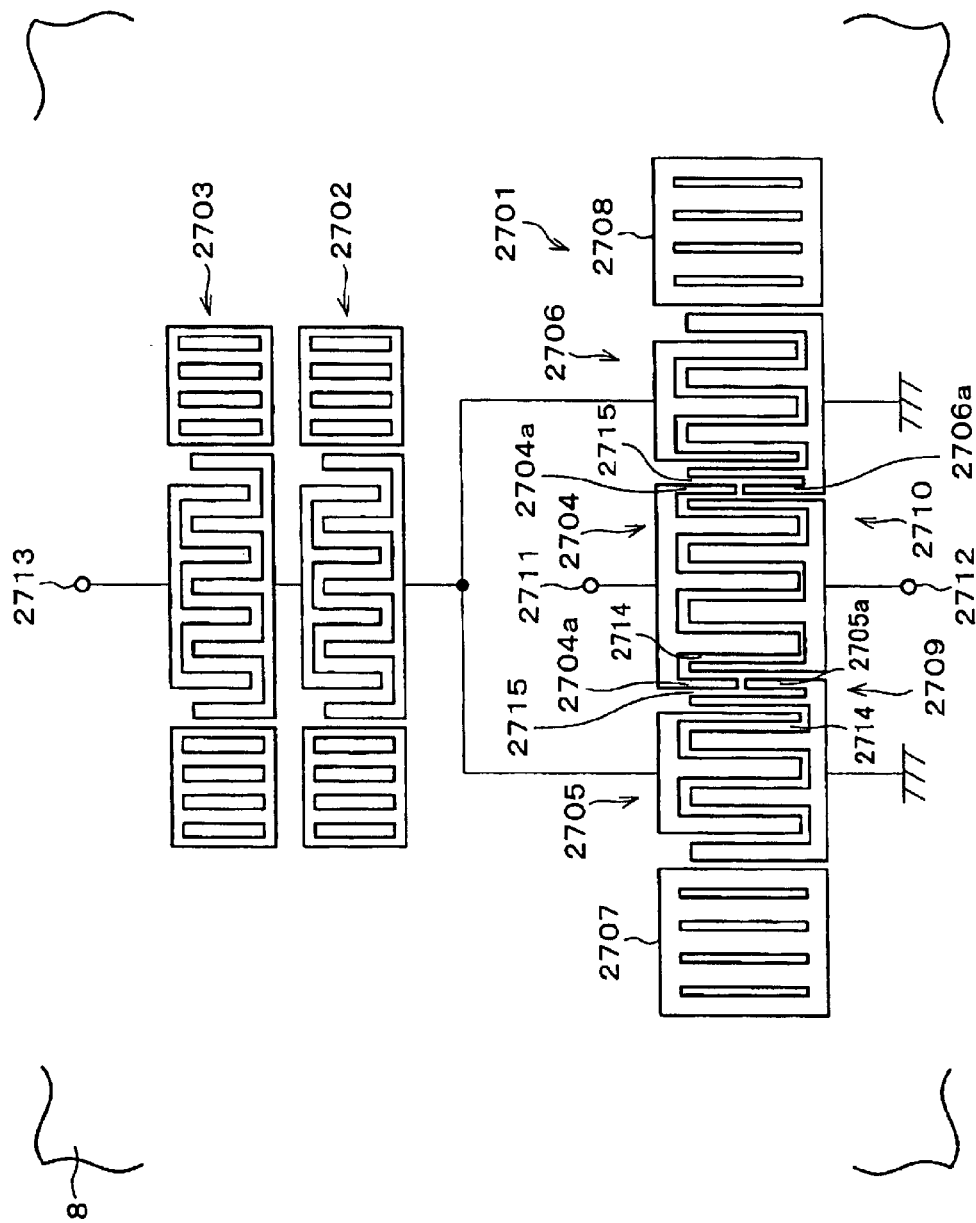
FIG. 47 is a schematic diagram illustrating a SAW apparatus according to a sixth preferred embodiment of the present invention.

As in the third preferred embodiment, in the sixth preferred embodiment, a few narrower-pitch electrode fingers are provided in portions between two adjacent IDTs (indicated by 2709 and 2710 in FIG. 47). Reference numeral 2713 designates an unbalanced signal terminal. The enlarged portion between the IDTs 2704 and 2705 is shown in FIG. 48.

An outer electrode finger 2704a of the IDT 2704 connected to the balanced signal terminal 2711 is apodization-weighted, a dummy electrode 2705a is provided in the weighted portion and is grounded.

Figure 48:
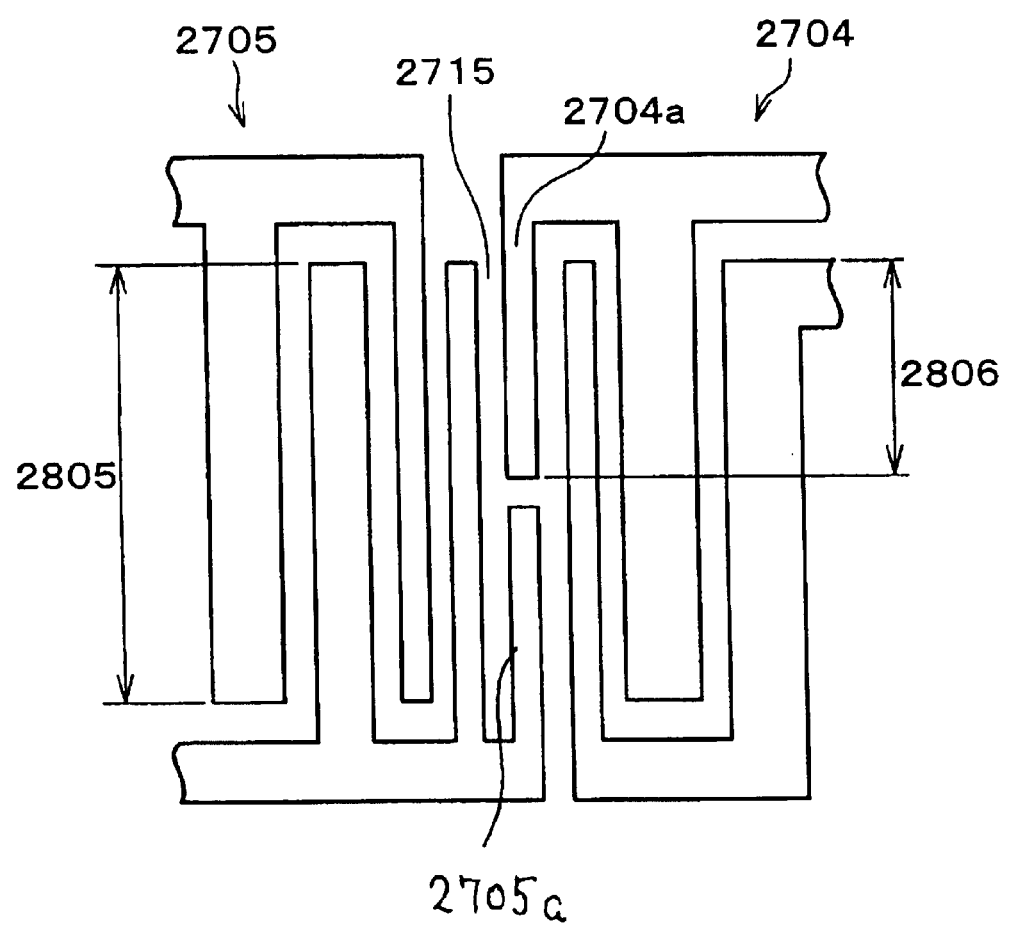
FIG. 48 is an enlarged diagram illustrating the SAW apparatus shown in FIG. 47.

When the wavelength determined by the narrower pitch of the electrode fingers is indicated by $\lambda I_2$, and when the wavelength determined by the pitch of the other electrode fingers is indicated by $\lambda I_1$, detailed designs of the SAW filter 2701 are as follows (the number in parentheses indicates the number of narrower-pitch electrode fingers):

interdigital length:
no-apodization-weighted portion (indicated by 2805 in FIG. 48): 71.2 $\lambda I_1$;
apodization-weighted portion (indicated by 2806 in FIG. 48: 35.6 $\lambda I_1$;
number of pairs of electrode fingers of IDT 2705: 21(4);
number of pairs of electrode fingers of IDT 2704: (4)35(4);
number of pairs of electrode fingers of IDT 2706: (4)21;
IDT wavelength $\lambda I_1$: 2.18 $\mu$m;
IDT wavelength $\lambda I_2$: 1.96 $\mu$m;
reflector wavelength $\lambda$R; 2.18 $\mu$m;
number of electrode fingers of reflector: 150;
IDT pitch:
pitch between wider-pitch electrode finger ($\lambda I_1$) and narrower-pitch
electrode finger ($\lambda I_2$) (indicated by 2714 in FIG. 47): 0.25 $\lambda I_1$+0.25 $\lambda I_2$;
pitch between narrower-pitch electrode fingers ($\lambda I_2$) (indicated by 2715 in FIG. 47): 0.50 $\lambda I_2$;
pitch between IDT and reflector: 0.460 $\lambda$R;
IDT duty:
wider-pitch portion: 0.63;
narrower-pitch portion: 0.60;
reflector duty: 0.57; and
electrode thickness: 0.09 $\lambda I_1$.

Detailed designs of the SAW resonator 2702 are as follows:
interdigital length W:23.6 $\lambda$I;
number of pairs of electrode fingers of IDT: 241;
wavelength (for IDT and reflectors): 2.12 $\mu$m;
number of electrode fingers of reflectors: 30; and
pitch between IDT and reflector: 0.50 $\lambda$R.

Detailed designs of the SAW resonator 2703 are as follows:
- interdigital length W:58.5 λI;
- number of pairs of electrode fingers of IDT: 241;
- wavelength (for IDT and reflectors): 2.04 μm;
- number of electrode fingers of reflector: 30; and
- pitch between IDT and reflector: 0.50 λR.

The features of the sixth preferred embodiment are as follows. Apodization weighting is applied to the outermost electrode finger of the central IDT 2704 which is adjacent to the ground electrode fingers and which is connected to the balanced signal terminals 2711 so as to define the apodization-weighted electrode fingers 2704a. The dummy electrode 2705a and a dummy electrode 2706a are then provided in the apodization-weighted portions, and are grounded.

Figure 49:
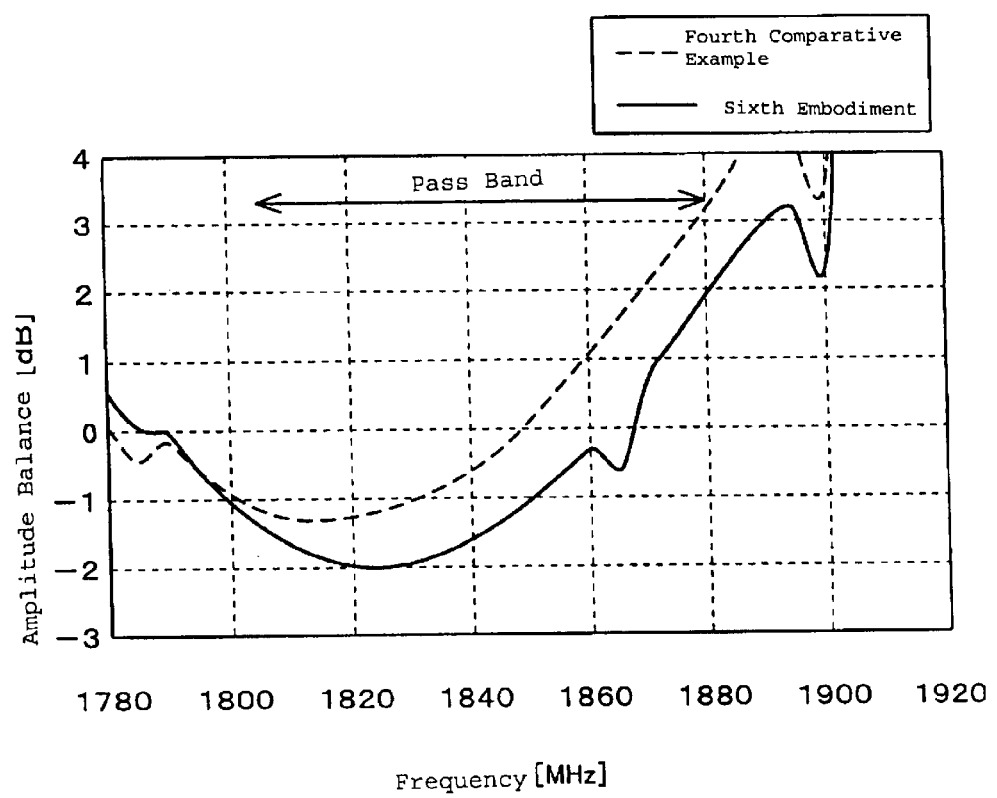
FIG. 49 is a graph illustrating the amplitude balance level (amplitude balance) of the sixth preferred embodiment of the present invention and that of a fourth comparative example.
Figure 50:
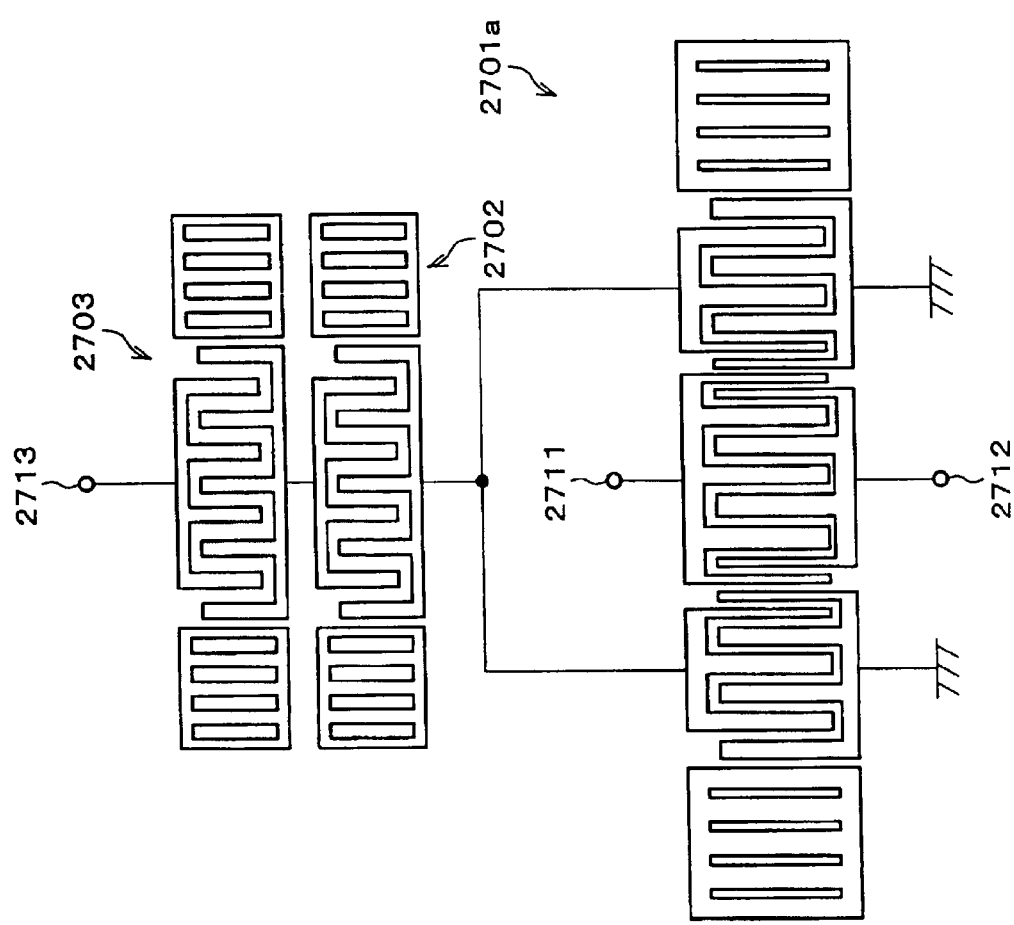
FIG. 50 is a schematic diagram illustrating a SAW apparatus of the fourth comparative example.

The operations and advantages of the sixth preferred embodiment are as follows. The amplitude balance level between the balanced signal terminals 2711 and 2712 with respect to the frequency obtained by the sixth preferred embodiment is shown in FIG. 49. For comparison, the amplitude balance level between balanced signal terminals with respect to the frequency in a fourth comparative example shown in FIG. 50 is also shown in FIG. 49. The configuration of the fourth comparative example is the same as that of the sixth preferred embodiment, except in the configuration of a longitudinally-coupled-resonator-type SAW filter 2701a, and more specifically, apodization weighting is not applied to outermost electrode fingers of a central IDT. The frequency range of the pass band used for DCS receiving filters is 1805 MHz to 1880 MHz.

The amplitude balance level in this range in the fourth comparative example ranges from −1.3 dB to +3.3 dB (having a deviation of 4.6 dB), while the corresponding amplitude balance level obtained by the sixth preferred embodiment ranges from −2.0 dB to +1.9 dB (having a deviation of 3.9 dB). Thus, the amplitude balance level is improved by about 0.7 dB.

In the fourth comparative example, the amplitude balance level deviates considerably toward the positive side, while the deviation of the sixth preferred embodiment is almost equal between the positive side and the negative side. If the amplitude balance level deviates approximately equally between the positive side and the negative side, as in the sixth preferred embodiment, the noise level of an in-phase signal is advantageously reduced. Thus, the sixth preferred embodiment exhibits excellent characteristics as compared to the third comparative example in this respect.

The above-described advantages are achieved by the sixth preferred embodiment due to the following reason. Apodization weighting is applied to the outermost electrode fingers of the central IDT 2704, the dummy electrodes 2705a and 2706a are then provided in the weighted portions and are grounded. With this arrangement, the outermost electrode fingers of the IDT 2704 connected to the balanced signal terminals 2711 and 2712 are adjacent to the ground electrode fingers, and thus, the polarities of the outermost electrode fingers between adjacent IDTs are equal in the left and right sides of the SAW apparatus.

The apodization-weighting optimal value was measured, and the results are given below. In these measurements, in the configuration shown in FIGS. 47 and 48, the ratio of the interdigital length 2806 to which apodization weighting is applied to the interdigital length 2805 to which apodization weighting is not applied (hereinafter this ratio is referred to as the "apodization-weighting ratio") was varied, and the a change in the amplitude balance level between the balanced signal terminals within the pass band was determined.

Figure 51:
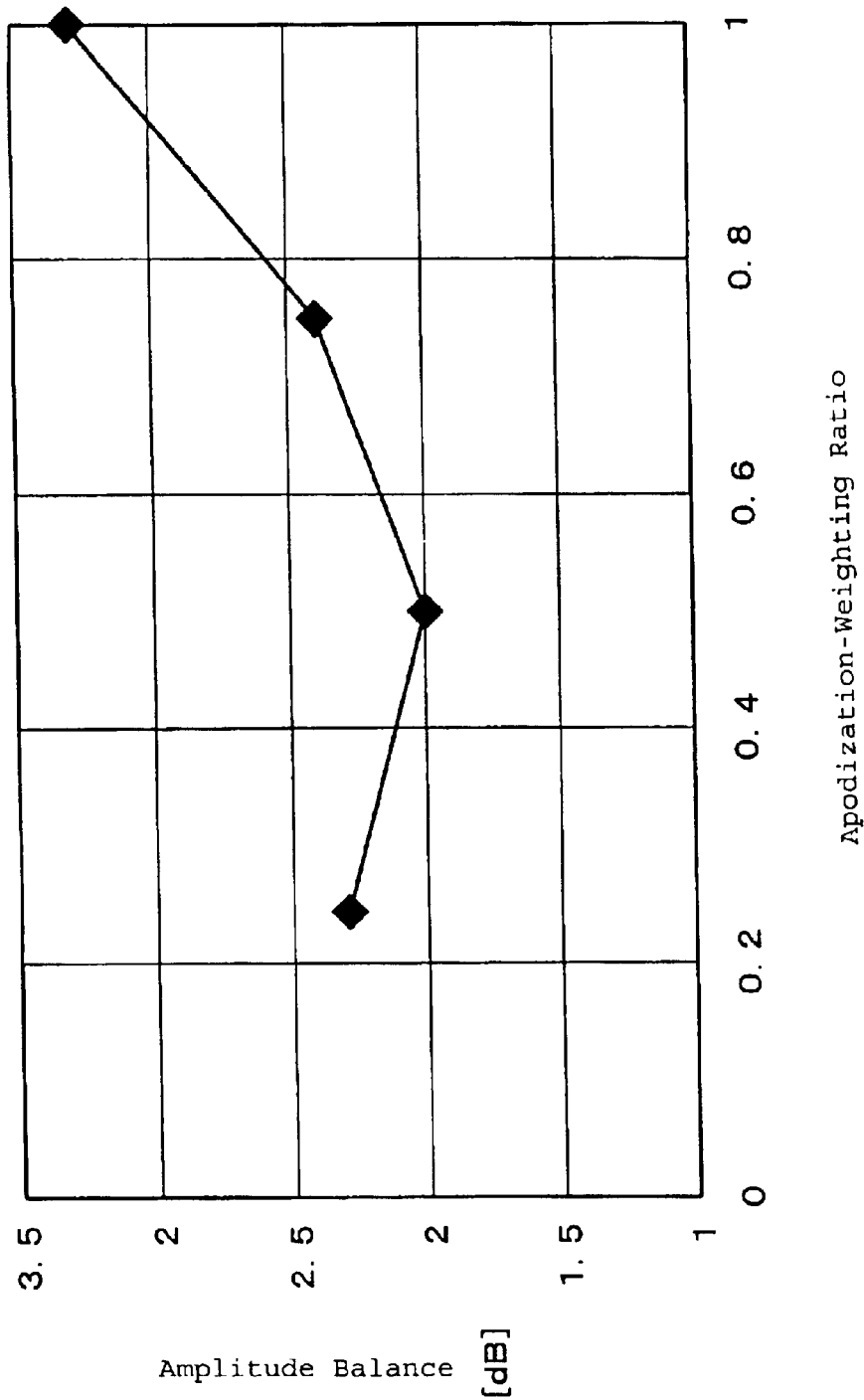
FIG. 51 is a graph illustrating a change in the amplitude balance level (amplitude balance) by varying the interdigital length in the SAW apparatus of the sixth preferred embodiment of the present invention.

In this case, the apodization-weighting ratio in the configuration shown in FIG. 50 to which apodization weighting is not applied was about 1, and the apodization-weighting ratio in the configuration shown in FIG. 47 was about ½. Then, the amplitude balance level between the balanced signal terminals was checked by varying the apodization-weighting ratio to about ¼, about ½, and about ¾. The results are shown in FIG. 51. In FIG. 51, the amplitude balance level is shown only in the positive side.

FIG. 51 reveals that the amplitude balance level within the pass band is minimized when the apodization-weighting ratio is about 0.5, i.e., when apodization weighting is applied at the approximate center of the electrode finger. The reason for this is as follows. The outermost electrode fingers of the central IDT are weighted at the approximate center of the interdigital length, and the weighted electrode fingers are grounded. Thus, the outermost electrode fingers of the IDT connected to the balanced signal terminals 2711 and 2712 are located adjacent to the ground electrodes by half the interdigital length. Thus, the polarities of the electrode fingers between adjacent IDTs are equal between the left and right sides of the SAW apparatus.

As described above, the configuration of the sixth preferred embodiment is as follows. Balanced signal terminals are connected to comb-like electrodes of an IDT (preferably, the central IDT) of a single longitudinally-coupled-resonator-type SAW filter, and thus, this configuration does not include an electrical neutral point. In this configuration, apodization-weighting is applied to the outermost electrode fingers of the central IDT at the approximate center of the interdigital length, and dummy electrodes are then provided in the weighted portions and are grounded. As a result, a SAW apparatus having a greatly improved amplitude balance level between balanced signal terminals over known SAW apparatuses is obtained.

Figure 52:
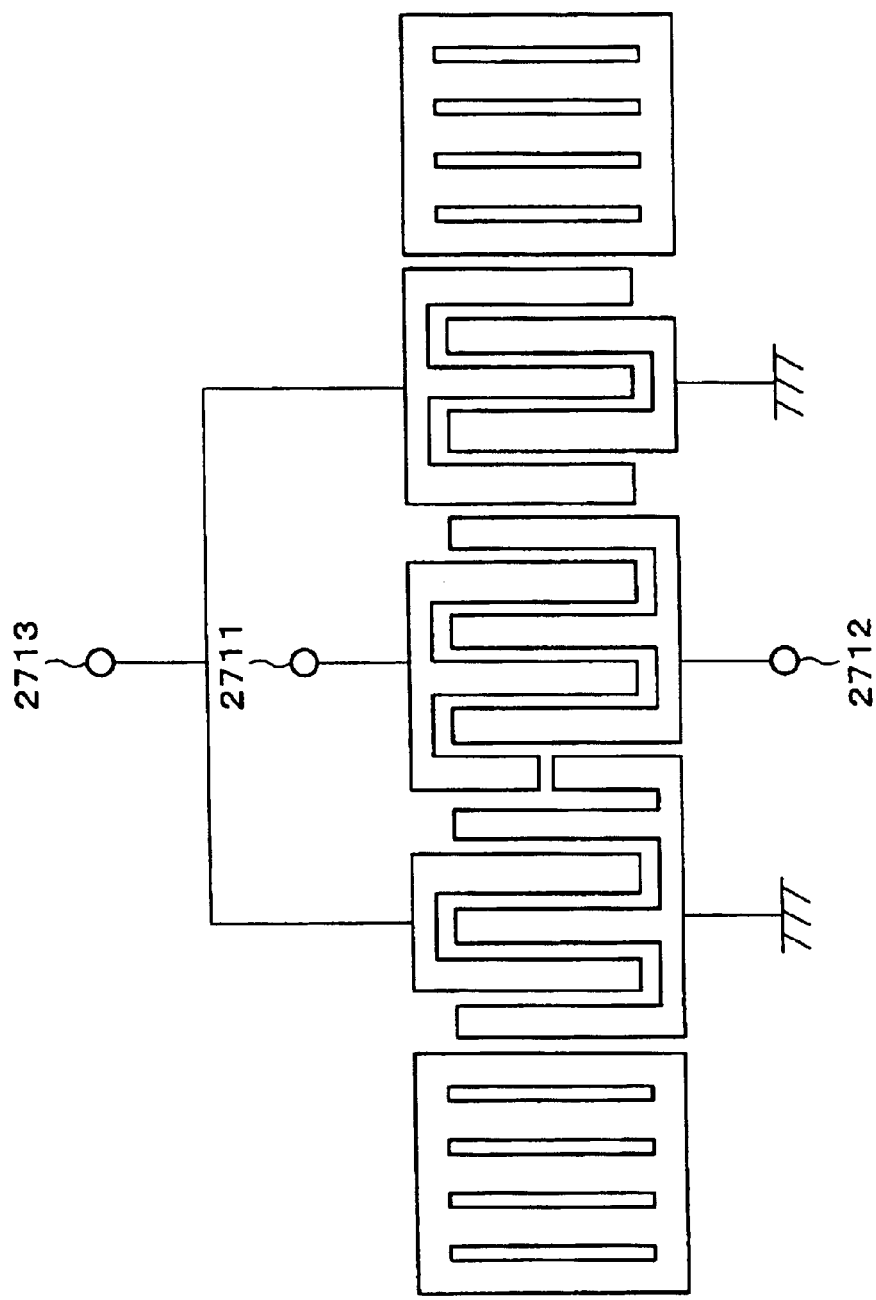
FIG. 52 is a schematic diagram illustrating a SAW apparatus of a modification made to the sixth preferred embodiment of the present invention.

In the sixth preferred embodiment, the outermost electrode fingers of the central IDT connected to the balanced signal terminals are adjacent to ground electrode fingers. Alternatively, as shown in FIG. 52, one outermost electrode finger of the central IDT may be connected to a ground electrode finger, and the other outermost electrode finger of the central IDT may be connected to a signal electrode finger. In this case, apodization weighting is applied to only the signal electrode finger adjacent to the ground electrode finger, and a dummy electrode is then provided in the weighted portion and is grounded via the IDT. With this modification, as in the sixth preferred embodiment, a SAW apparatus having an improved amplitude balance level between balanced signal terminals is obtained.

Figure 53:
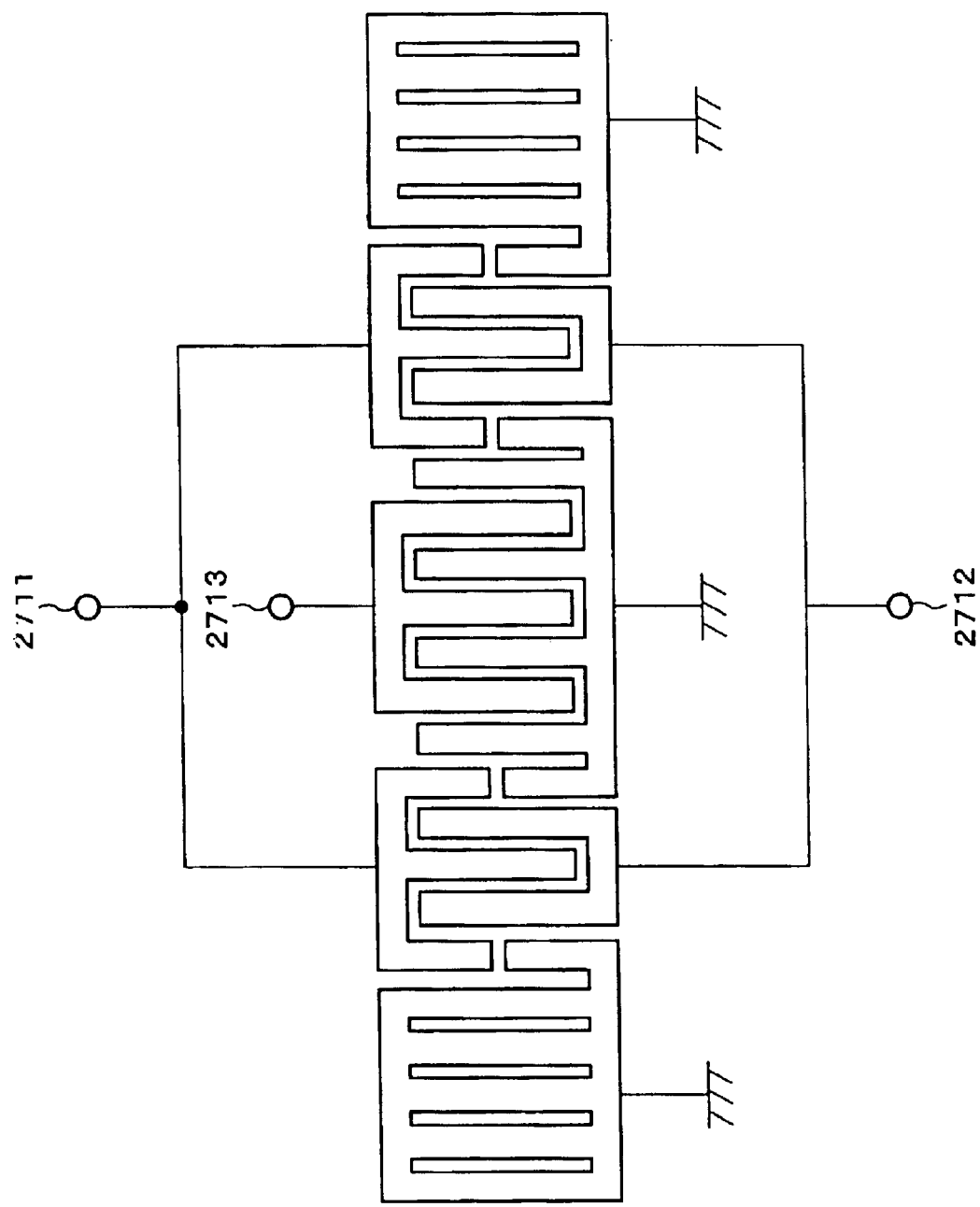
FIG. 53 is a schematic diagram illustrating a SAW apparatus of another modification made to the sixth preferred embodiment of the present invention.
Figure 54:
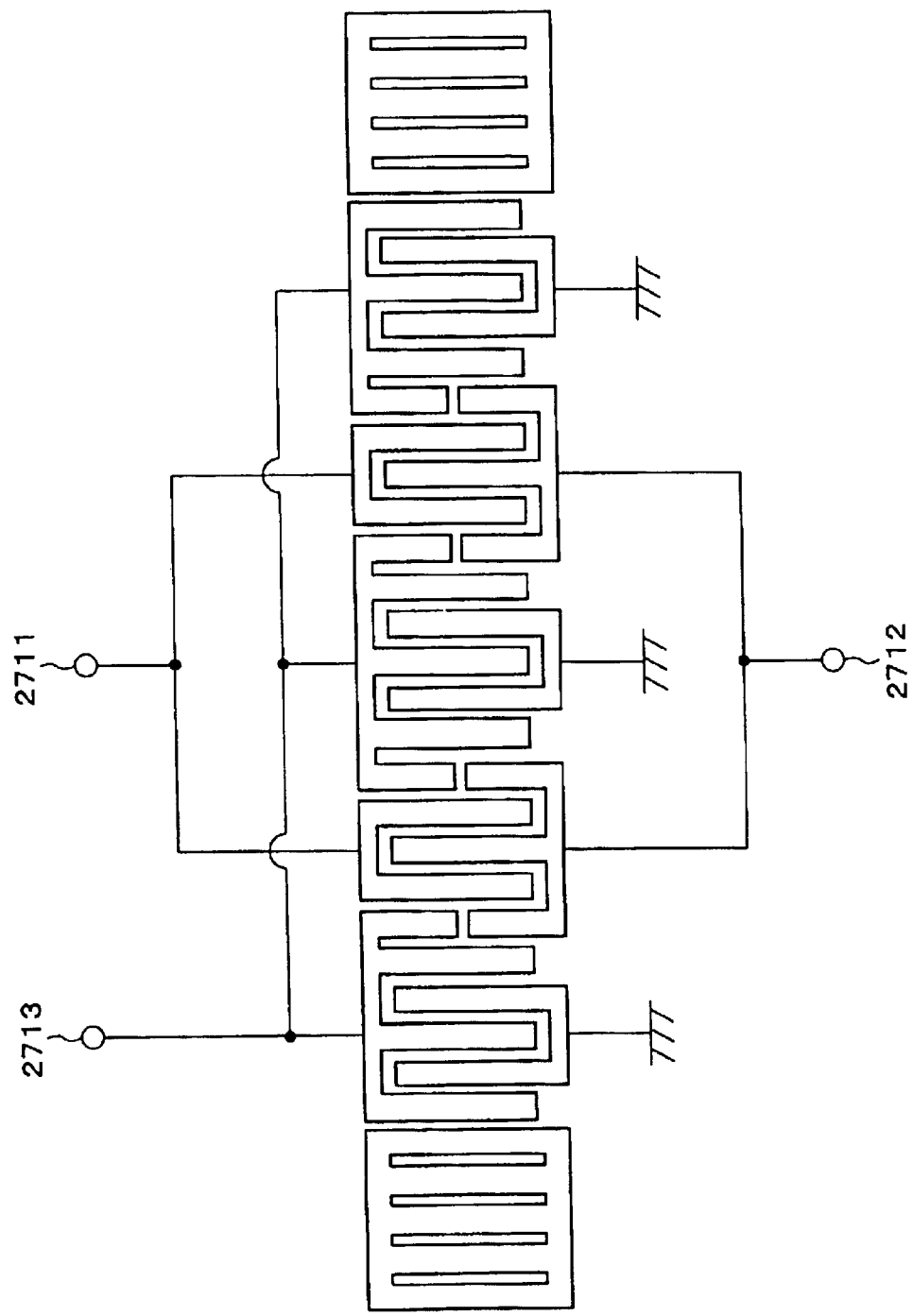
FIG. 54 is a schematic diagram illustrating a SAW apparatus of still another modification made to the sixth preferred embodiment of the present invention.

Alternatively, as shown in FIG. 53, in the configuration in which balanced signal terminals 2711 and 2712 are connected to two IDTs, apodization weighting is applied to the outermost electrode fingers of each IDT, and the weighted electrode fingers are grounded via the corresponding IDT and reflectors. With this modification, as in the sixth preferred embodiment, the amplitude balance level between the balanced signal terminals 2711 and 2712 is greatly improved.

Although in the sixth preferred embodiment a three-DT-type longitudinally-coupled-resonator-type SAW filter is used, a longitudinally-coupled-resonator-type SAW filter having four or more IDTs may be used. For example, in the configuration shown in FIG. 54, apodization weighting is applied to the electrode fingers of IDTs connected to balanced signal terminals 2711 and 2712, and dummy electrodes are provided and grounded via the corresponding IDTs. With this modification, as in the sixth preferred embodiment, the amplitude balance levels between the balanced signal terminals 2711 and 2712 is greatly improved.

A seventh preferred embodiment of the present invention is described below with reference to FIGS. 55 through 61. In the seventh preferred embodiment, the present invention is discussed in the context of a PCS receiving filter.

As in the third preferred embodiment, in the seventh preferred embodiment, balanced signal terminals 2910 and 2911 are connected to comb-like electrodes of an IDT 2905 of a single longitudinally-coupled-resonator-type SAW filter 2901. Weighting is then applied to the configuration of a SAW apparatus which does not include an electrical neutral point.

In the seventh preferred embodiment, the longitudinally-coupled-resonator-type SAW filter 2901, and SAW resonators 2902 and 2903, which are connected in series to the SAW filter 2901, are preferably defined by Al electrodes disposed on the above-described piezoelectric substrate 8. The configuration of the seventh preferred embodiment is similar to that of the third preferred embodiment shown in FIG. 29.

The features of the seventh preferred embodiment are as follows. The duty of electrode fingers 2919 and 2920 is about 0.40. Additionally, a grounded shield line 2921 is inserted between a signal line 2912 and the balanced signal terminal 2910. By inserting a grounded shield line between adjacent signal electrode fingers, the bridge capacitance between the signal electrodes fingers is reduced. Thus, a SAW apparatus having further improved balance levels is obtained.

Figure 55:
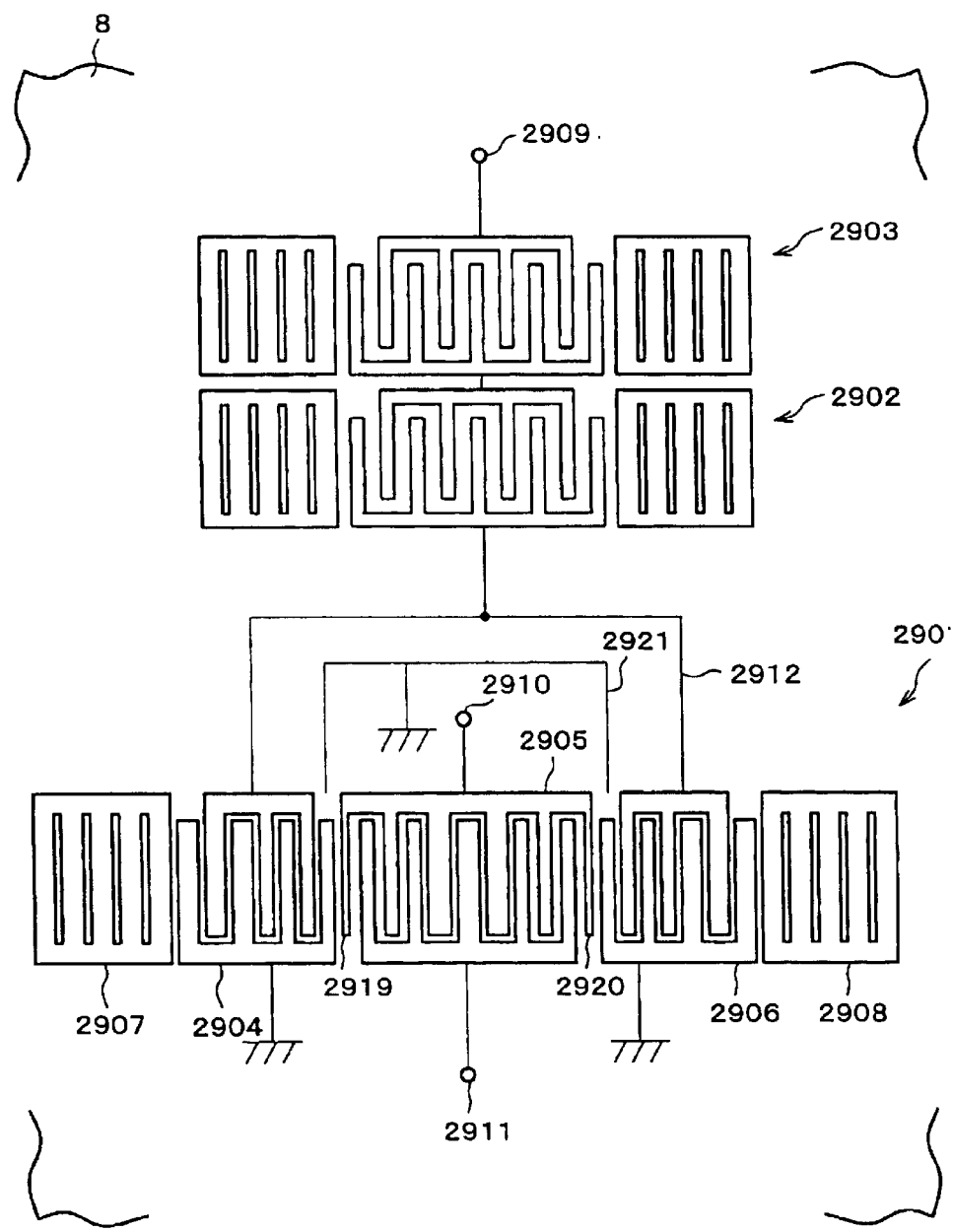
FIG. 55 is a schematic diagram illustrating a SAW apparatus according to a seventh preferred embodiment of the present invention.
Figure 56:
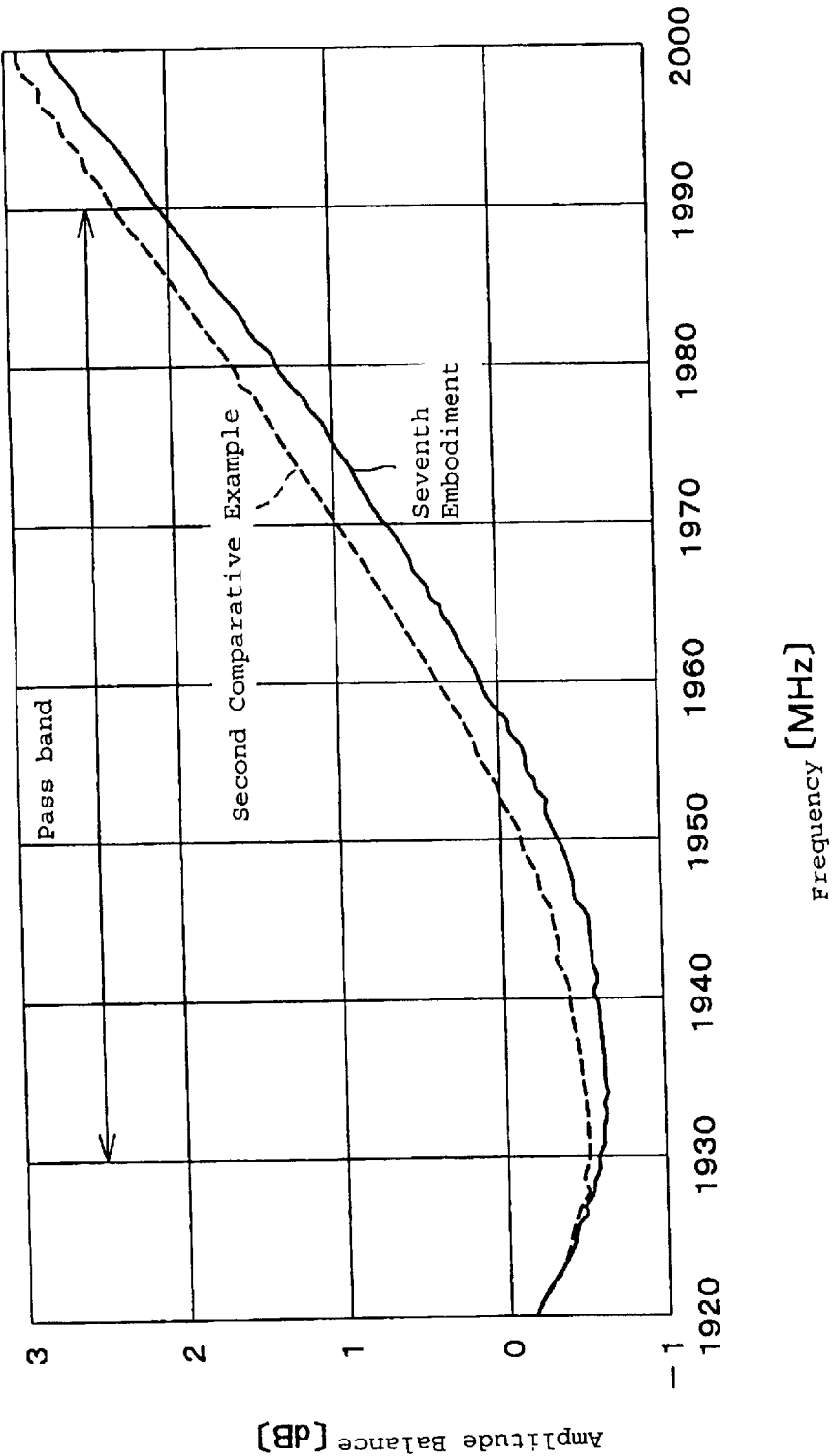
FIG. 56 is a graph illustrating the amplitude balance level (amplitude balance) of the seventh preferred embodiment of the present invention and that of the second comparative example.
Figure 57:
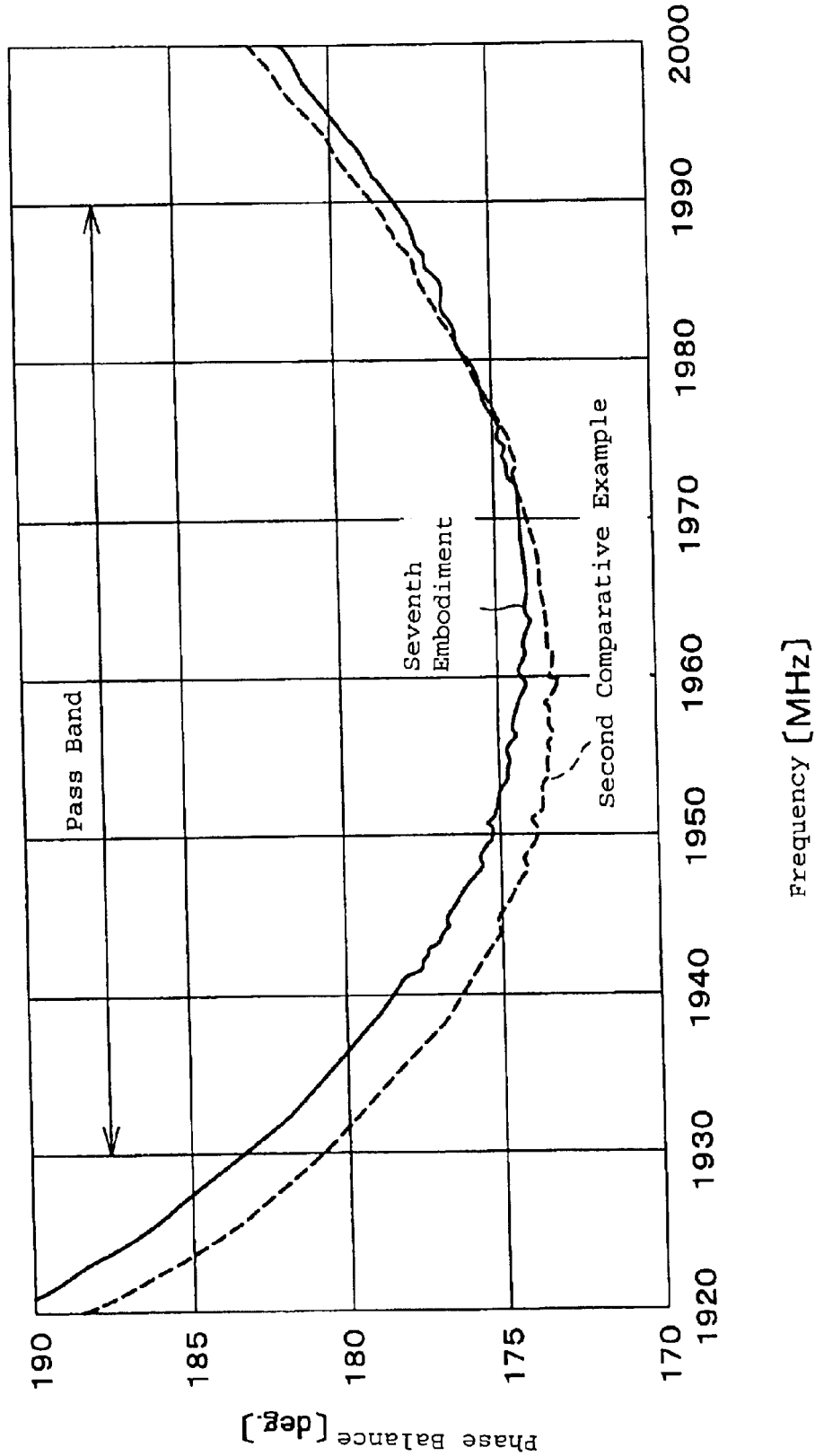
FIG. 57 is a graph illustrating the phase balance level (phase balance) of the seventh preferred embodiment of the present invention and that of the second comparative example.

The operations and advantages of the seventh preferred embodiment are as follows. FIGS. 56 and 57 illustrate the amplitude balance level and the phase balance level, respectively, between the balanced signal terminals 2910 and 2911 obtained by the seventh preferred embodiment. For comparison, the amplitude balance level and the phase balance level between the balanced signal terminals in the second comparative example shown in FIG. 32 are also shown in FIGS. 56 and 57, respectively. The configuration of the second comparative example shown in FIG. 32 is the same as that of the seventh preferred embodiment, except that the duty of the outermost electrode fingers of the central IDT (corresponding to 2919 and 2920 in FIG. 55) is not changed. The frequency range in the pass band used for PCS receiving filters is 1930 MHz to 1990 MHz.

No substantial difference is observed in the deviation in the phase balance level in this range between the seventh preferred embodiment and the second comparative example. However, the amplitude balance level in the second comparative example ranges from −0.5 dB to +2.3 dB (having a deviation of 2.8 dB), while the amplitude balance level in the seventh preferred embodiment ranges from −0.6 dB to +2.0 dB (having a deviation of 2.6 dB). Thus, the amplitude balance level is improved by about 0.2 dB.

Additionally, the amplitude balance level deviates considerably toward the positive side in the second comparative example, while a difference in the deviation between the positive side and the negative side is greatly reduced in the seventh preferred embodiment. With a reduced difference in the deviation between the positive side and the negative side, as in the seventh preferred embodiment, the noise level of an in-phase signal is advantageously reduced. Thus, the seventh preferred embodiment exhibits greatly improved characteristics as compared to the second comparative example in this respect.

The above-described advantages are achieved by the seventh preferred embodiment due to the following reason. The duty of the electrode fingers 2919 and 2920 of the IDT 2905 adjacent to IDTs 2904 and 2906, respectively, is less than that of the other electrode fingers. Accordingly, a difference in the total capacitance of the electrode fingers connected to the balanced signal terminals 2910 and 2911, and a difference in the conversion efficiency between an electrical signal and a SAW between the left and right sides of the SAW apparatus are offset.

Figure 58:
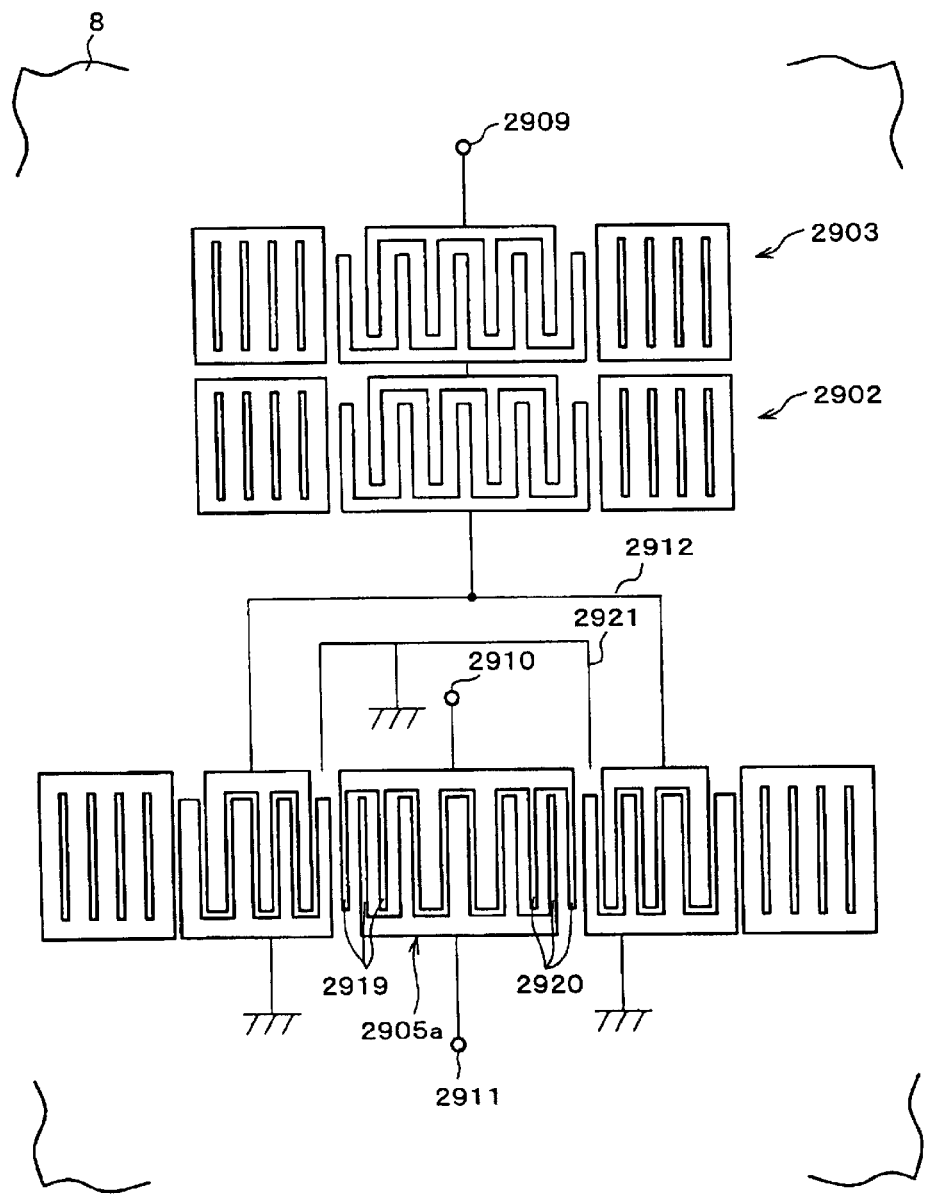
FIG. 58 is a schematic diagram illustrating a modification made to the seventh preferred embodiment of the present invention.

The difference in the total capacitance of the electrode fingers on the left and right sides is particularly noticeable in the portions between adjacent IDTs. Thus, by adjusting the duty of these portions, the difference in the total capacitance is reduced. To further enhance this effect, as shown in FIG. 58, the duty of a few electrode fingers 2919 and 2920 located adjacent to the portions between two IDTs are adjusted.

Figure 59:
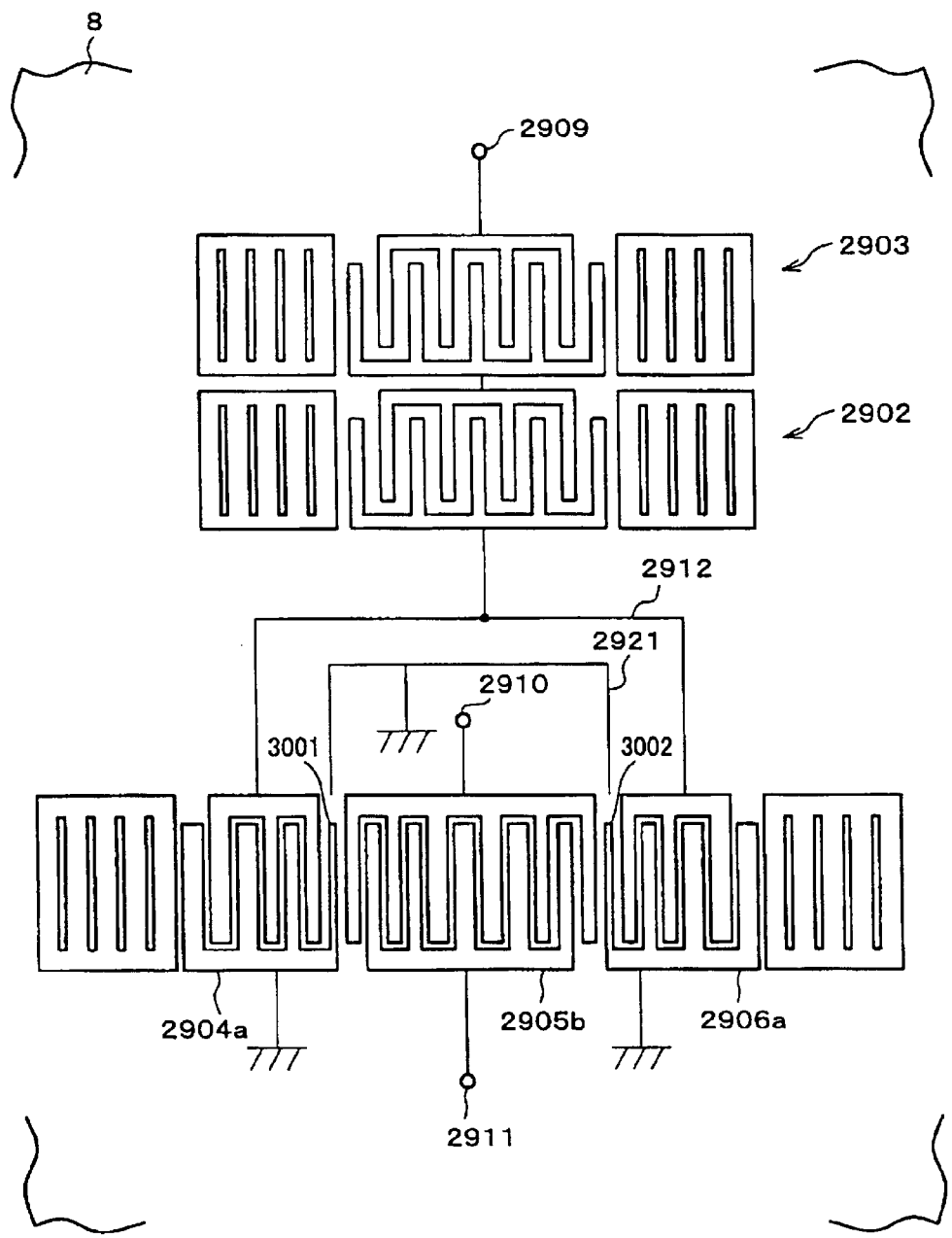
FIG. 59 is a schematic diagram illustrating another modification made to the seventh preferred embodiment of the present invention.
Figure 60:
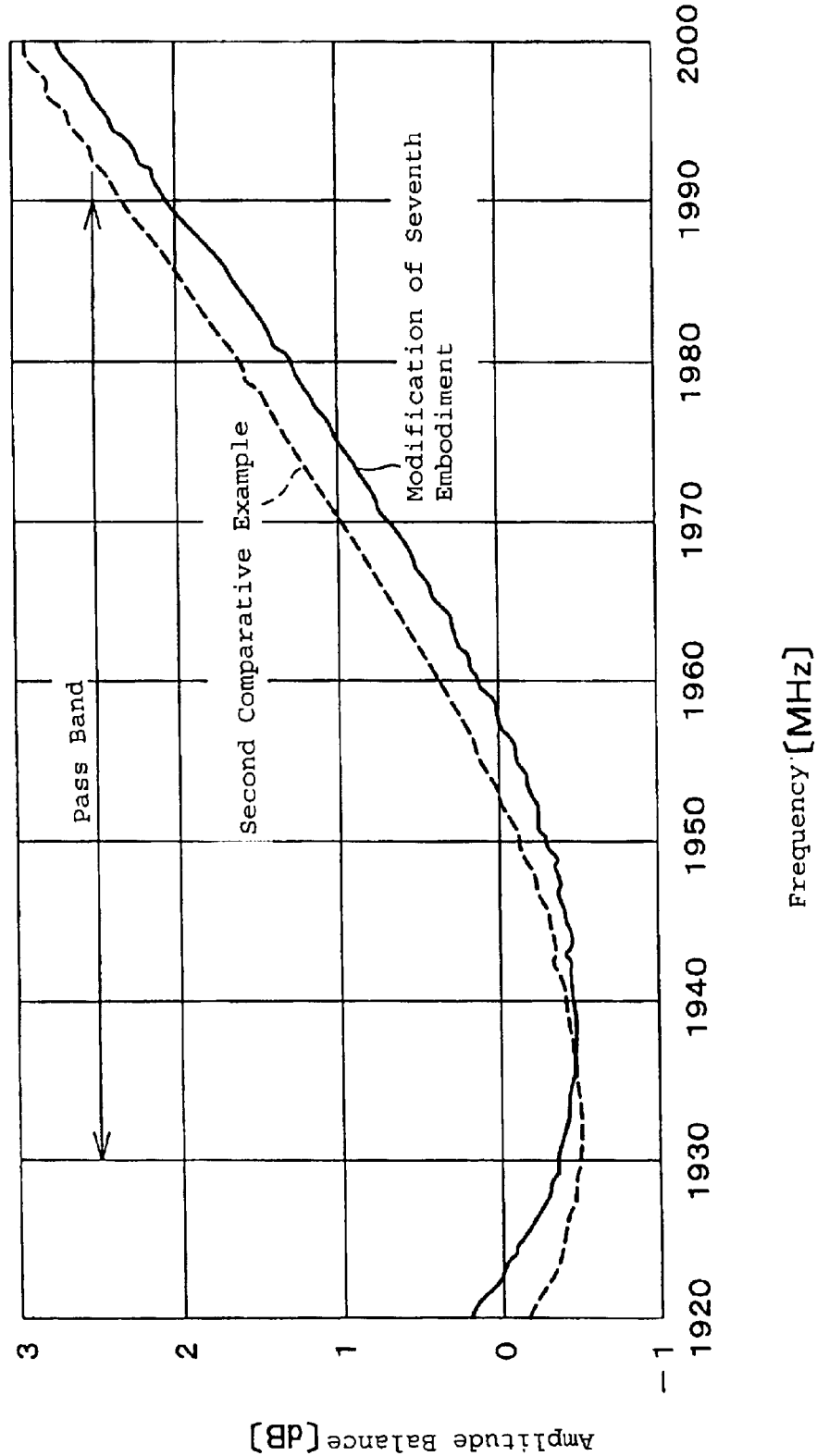
FIG. 60 is a graph illustrating the amplitude balance level (amplitude balance) of the modification shown in FIG. 59 and that of the second comparative example.
Figure 61:
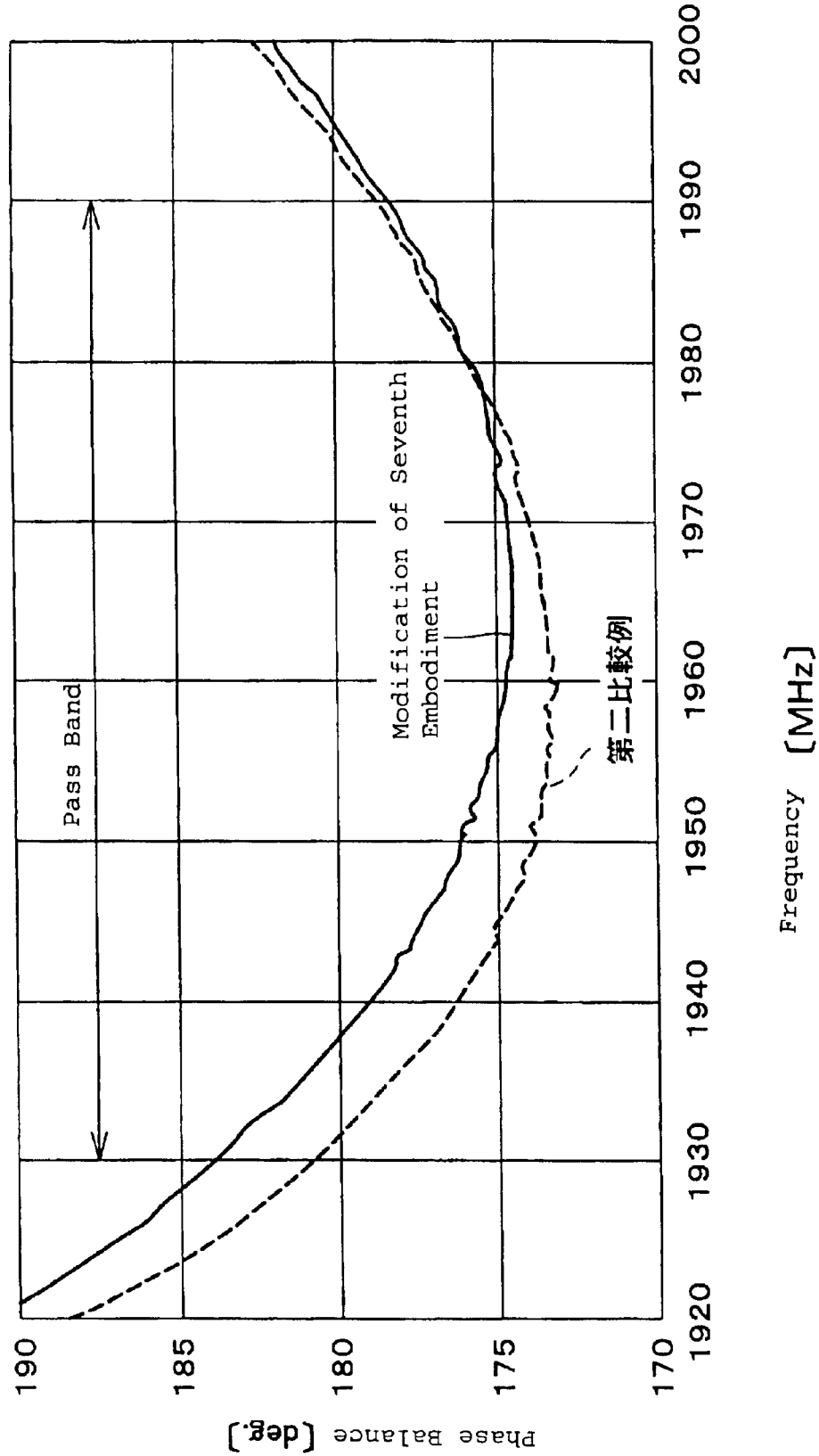
FIG. 61 is a graph illustrating the phase balance level (phase balance) of the modification shown in FIG. 59 and that of the second comparative example.

A modification of the seventh preferred embodiment is shown in FIG. 59, the duty of an electrode finger 3001 of an IDT 2904a adjacent to an IDT 2905b and the duty of an electrode finger 3002 of an IDT 2906b adjacent to the IDT 2905b are less than that of the other electrode fingers. Then, the amplitude balance level and the phase balance level between balanced signal terminals 2910 and 2911 with respect to the frequency are shown in FIGS. 60 and 61, respectively. In this case, the duty of the electrode fingers 3001 and 3002 is about 0.40.

For comparison, the amplitude balance level and the phase balance level between the balanced signal terminals in the second comparative example shown in FIG. 32 are also shown in FIGS. 60 and 61, respectively. No substantial difference is observed in the deviation of the phase balance level in this range between the second comparative example and this modification. However, the amplitude balance level of the second comparative example ranges from −0.5 dB to +2.3 dB (having a deviation of 2.8 dB), while the amplitude balance level of the modification of the seventh preferred embodiment ranges from −0.5 dB to +2.0 dB (having a deviation of 2.5 dB). Thus, the amplitude balance level is improved by about 0.3 dB.

As discussed above, by adjusting the duty of electrode fingers of the IDTs connected to an unbalanced signal terminal, such as the configuration shown in FIG. 59, the advantages of the present invention are obtained. In addition to the electrode fingers 3001 and 3002, the duty of the IDT 2905b may also be adjusted, in which case, the advantages of the present invention are achieved.

According to the foregoing description, in the seventh preferred embodiment, the balanced signal terminals are connected to the comb-like electrodes of an IDT of a single longitudinally-coupled-resonator-type SAW filter. Accordingly, this configuration does not include an electrical neutral point. Then, duty weighting is applied to a portion of the IDT, in particular, to the portions between two adjacent IDTs. Thus, a SAW apparatus having improved amplitude balance levels between balanced signal terminals over known SAW apparatuses is obtained.

Figure 63:
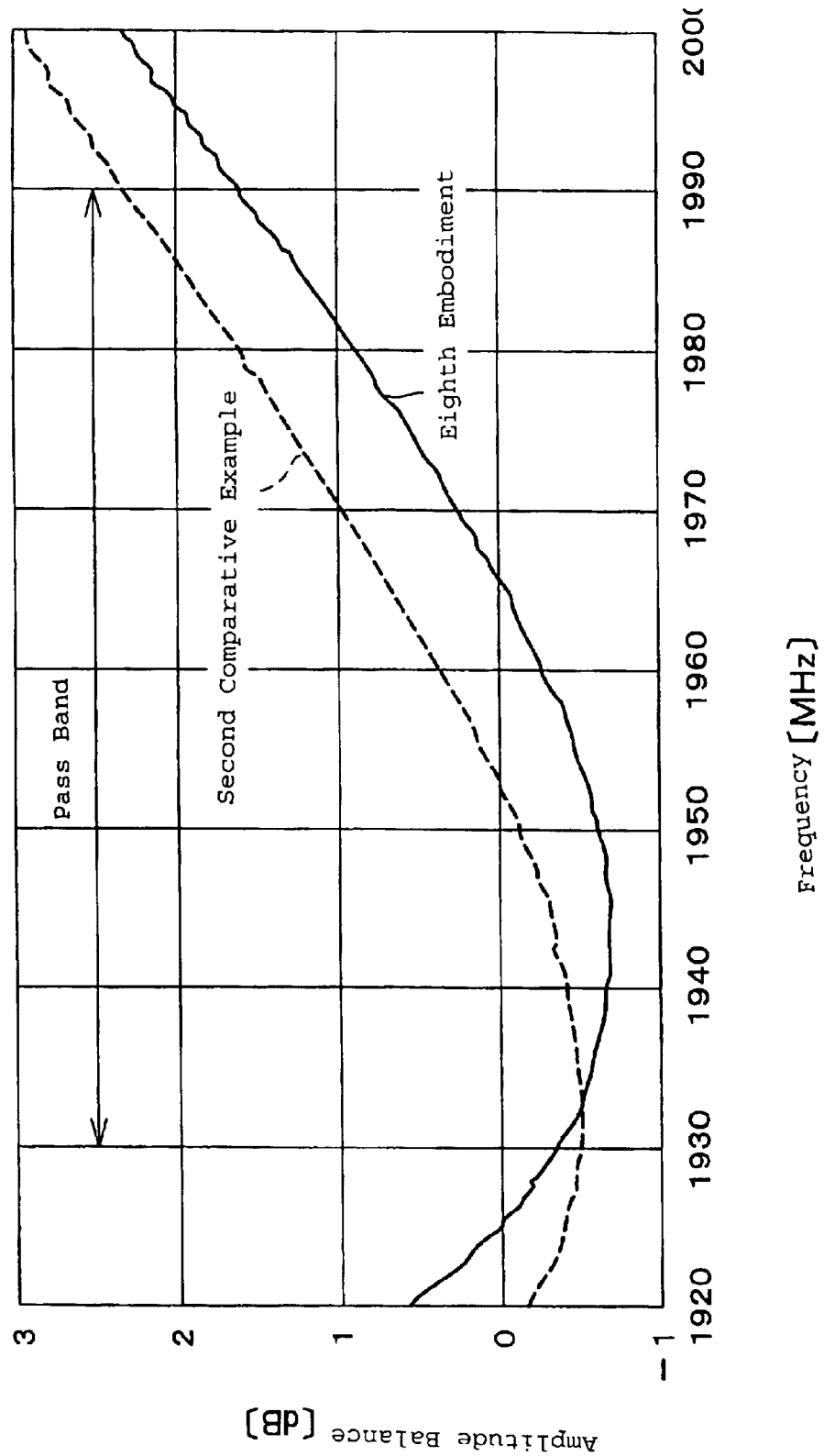
FIG. 63 is a graph illustrating the amplitude balance level (amplitude balance) of the eighth preferred embodiment of the present invention and that of the second comparative example.
Figure 64:
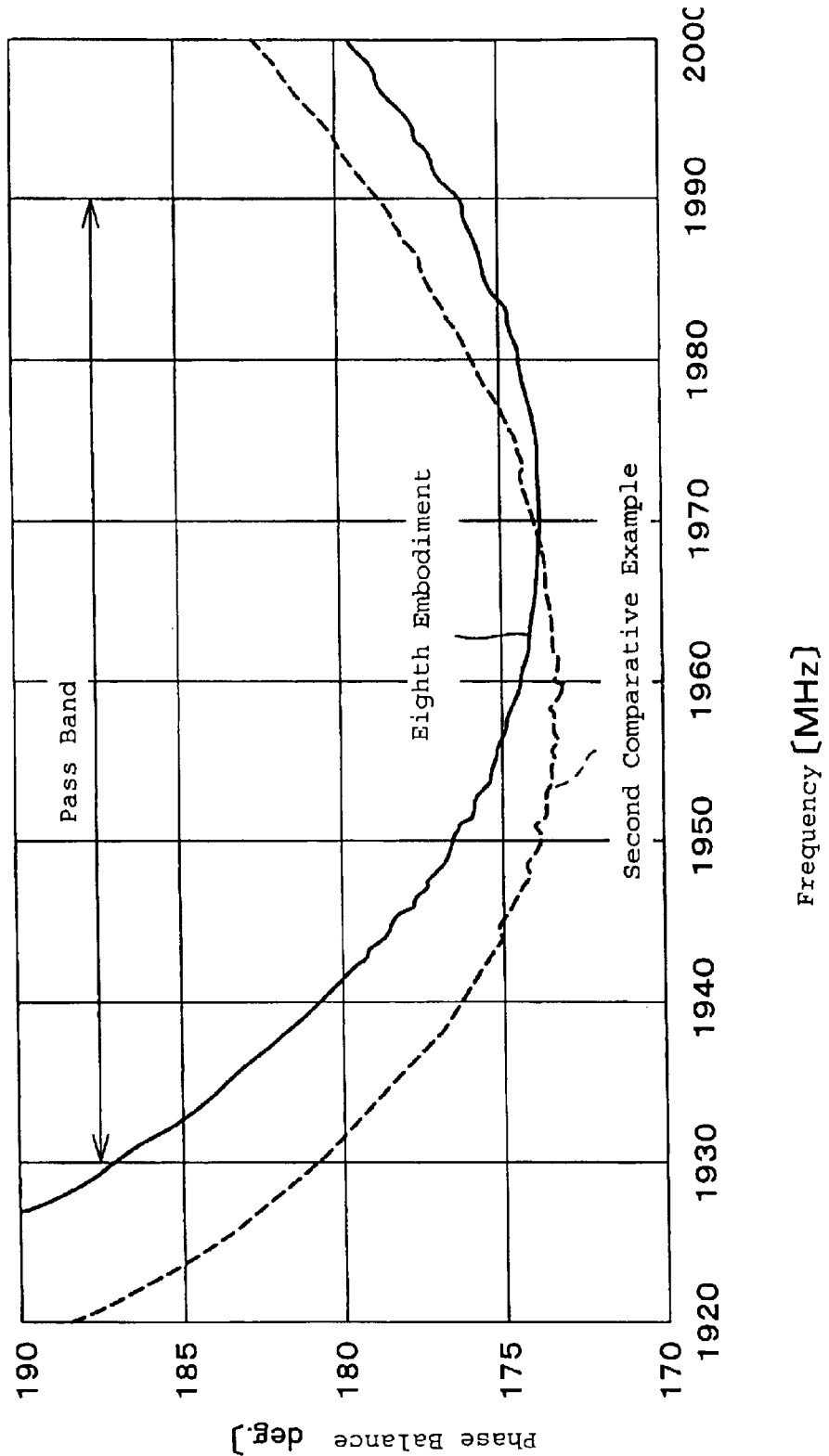
FIG. 64 is a graph illustrating the phase balance level (phase balance) of the eighth preferred embodiment of the present invention and that of the second comparative example.

An eighth preferred embodiment of the present invention is described below with reference to FIGS. 62 through 64. In the configuration of the eighth preferred embodiment shown in FIG. 62, not only the duty of the outermost electrode fingers of an IDT 2905c adjacent to IDTs 2904 and 2906, but also the duty of all the electrode fingers of the IDT 2905c connected to a balanced signal terminal 2910 is less than the other electrode fingers, for example, about 0.40. The configuration of the eighth preferred embodiment is the same as that of the seventh preferred embodiment, except for this feature.

The operations and advantages of the eighth preferred embodiment are as follows. The amplitude balance level and the phase balance level between balanced signal terminals 2910 and 2911 with respect to the frequency obtained by the eighth preferred embodiment are shown in FIGS. 63 and 64, respectively. For comparison, the amplitude balance level and the phase balance level between the balanced signal terminals in the second comparative example shown in FIG. 32 are also shown in FIGS. 63 and 64, respectively. The phase balance level in the frequency range of the pass band for PCS receiving filters in the eighth preferred embodiment is slightly reduced as compared to the second comparative example. However, the amplitude balance level of the eighth preferred embodiment is improved as compared to the second comparative example by about 0.5 dB.

Additionally, in the second comparative example, the amplitude balance level deviates toward the positive side. In the eighth preferred embodiment, however, the difference in the deviation in the phase balance level between the positive side and the negative side is reduced. With a smaller difference in the deviation between the positive side and the negative side, as in the eighth preferred embodiment, the noise level of an in-phase signal is advantageously reduced. Thus, the eight embodiment exhibits excellent characteristics as compared to the second comparative example.

According to the foregoing description, in the eighth preferred embodiment, balanced signal terminals 2910 and 2911 are connected to the comb-like electrodes of the IDT 2905c of a single longitudinally-coupled-resonator-type SAW filter. Accordingly, this configuration does not include an electrical neutral point. Then, duty weighting is applied to all the electrode fingers connected to one of the balanced signal terminals. Thus, a SAW apparatus having improved amplitude balance levels between balanced signal terminals over known SAW apparatuses is obtained.

Figure 62:
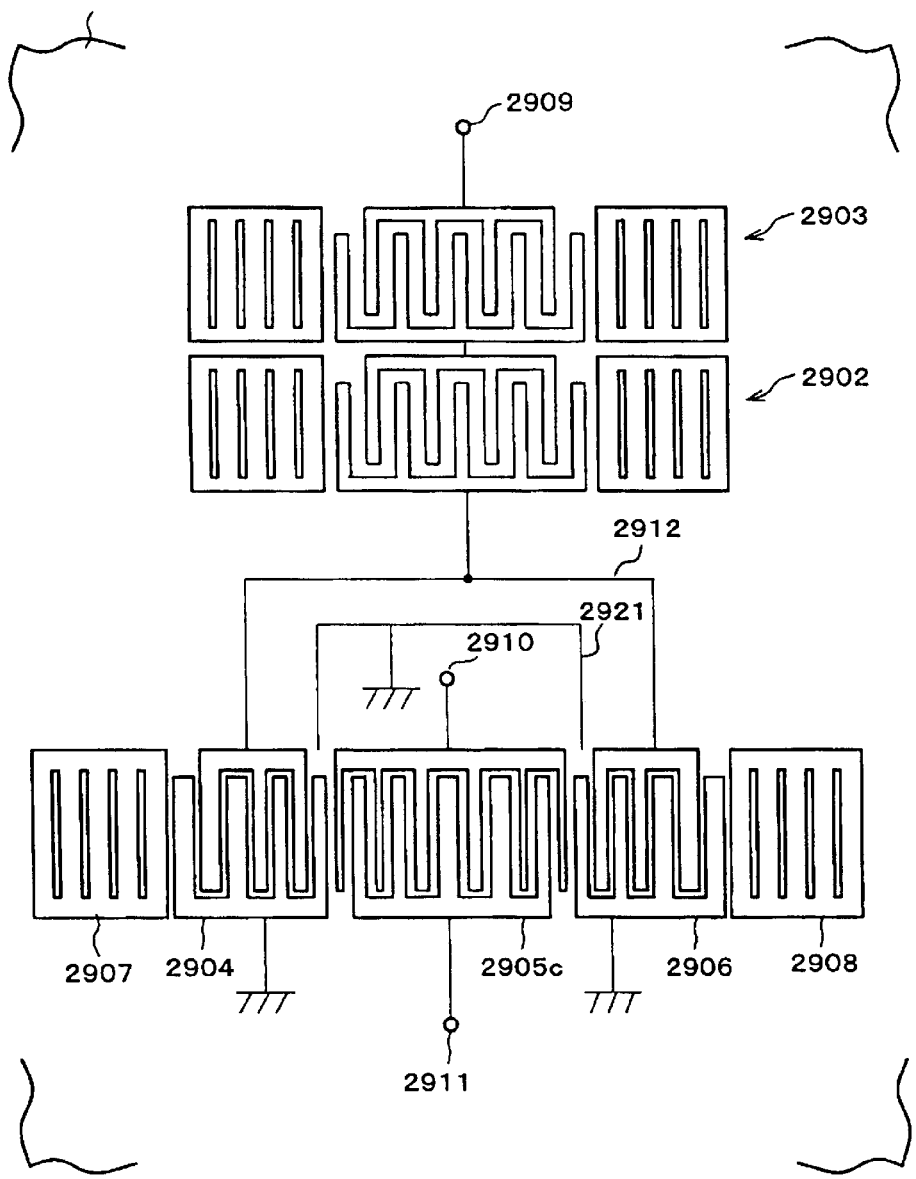
FIG. 62 is a schematic diagram illustrating a SAW apparatus according to an eighth preferred embodiment of the present invention.

When the duty of all the electrode fingers of the IDT 2905c connected to the balanced signal terminal 2910 is adjusted, as shown in FIG. 62, the amplitude balance level is further improved, but the phase balance level is reduced. However, by adjusting the duty of the required number of electrode fingers, as shown in FIGS. 55 and 58, or by changing the duty among the electrode fingers, the amplitude balance level is improved without reducing the phase balance level.

Figure 65:
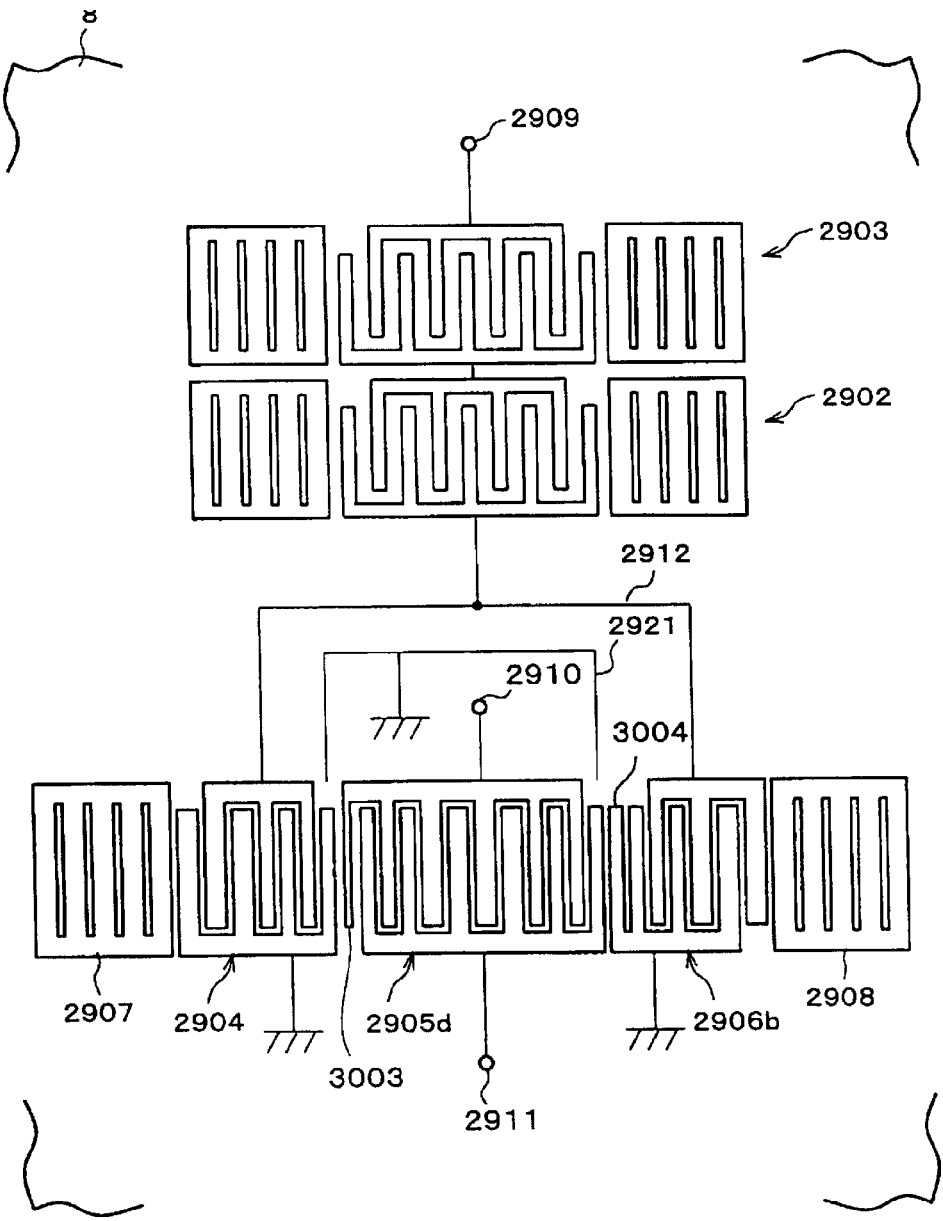
FIG. 65 is a schematic diagram illustrating a SAW apparatus according to a ninth preferred embodiment of the present invention.

A ninth preferred embodiment of the present invention is described below with reference to FIG. 65. The configuration of the ninth preferred embodiment is similar to that of the seventh preferred embodiment. In the ninth preferred embodiment, however, the duty of an electrode finger 3003 of an IDT 2905d adjacent to an IDT 2904 is less, and the outermost signal electrode finger of an IDT 2906b adjacent to the IDT 2905d is withdrawal-weighted, and a grounded dummy electrode 3004 is then provided in the weighted portion.

The operations and advantages of the ninth preferred embodiment are as follows. As discussed above, by applying two or more types of weighting methods to a single longitudinally-coupled-resonator-type SAW filter, the flexibility in adjusting the balance levels between balanced signal terminals is increased. Thus, a SAW apparatus having a desired balance level is obtained.

In the foregoing preferred embodiments, a 40±5° Y-cut X-propagating LiTaO$_3$ substrate is preferably used as the piezoelectric substrate. However, as is seen from the principle of the present invention, another type of substrate, such as a 64–72° Y-cut X-propagating LiNbO$_3$ substrate or a 41° Y-cut X-propagating LiNbO$_3$ substrate, may be used, in which case, advantages similar to those obtained by the above-described preferred embodiments are achieved.

In a SAW apparatus including two SAW filters, each having three or more IDTs, weighting is preferably applied to the electrode fingers of the SAW filters so as to strengthen the excitation of a SAW. With this arrangement, the amplitude balance level within the pass band is improved without decreasing the pass bandwidth.

Weighting may be applied, for example, as follows, so as to strengthen the excitation of a SAW. Withdrawal weighting, apodization weighting (including the formation of a dummy electrode), or more preferably, series weighting, is applied to the outermost electrode fingers (more preferably, to signal electrode fingers) of a central IDT of one SAW filter without applying weighting to the other SAW filter.

Various types of weighting have been discussed in the foregoing preferred embodiments, and each type of weighting provides individual functions and advantages. Thus, the advantages of the present invention can be achieved by any combination of two or more weighting types.

Figure 66:
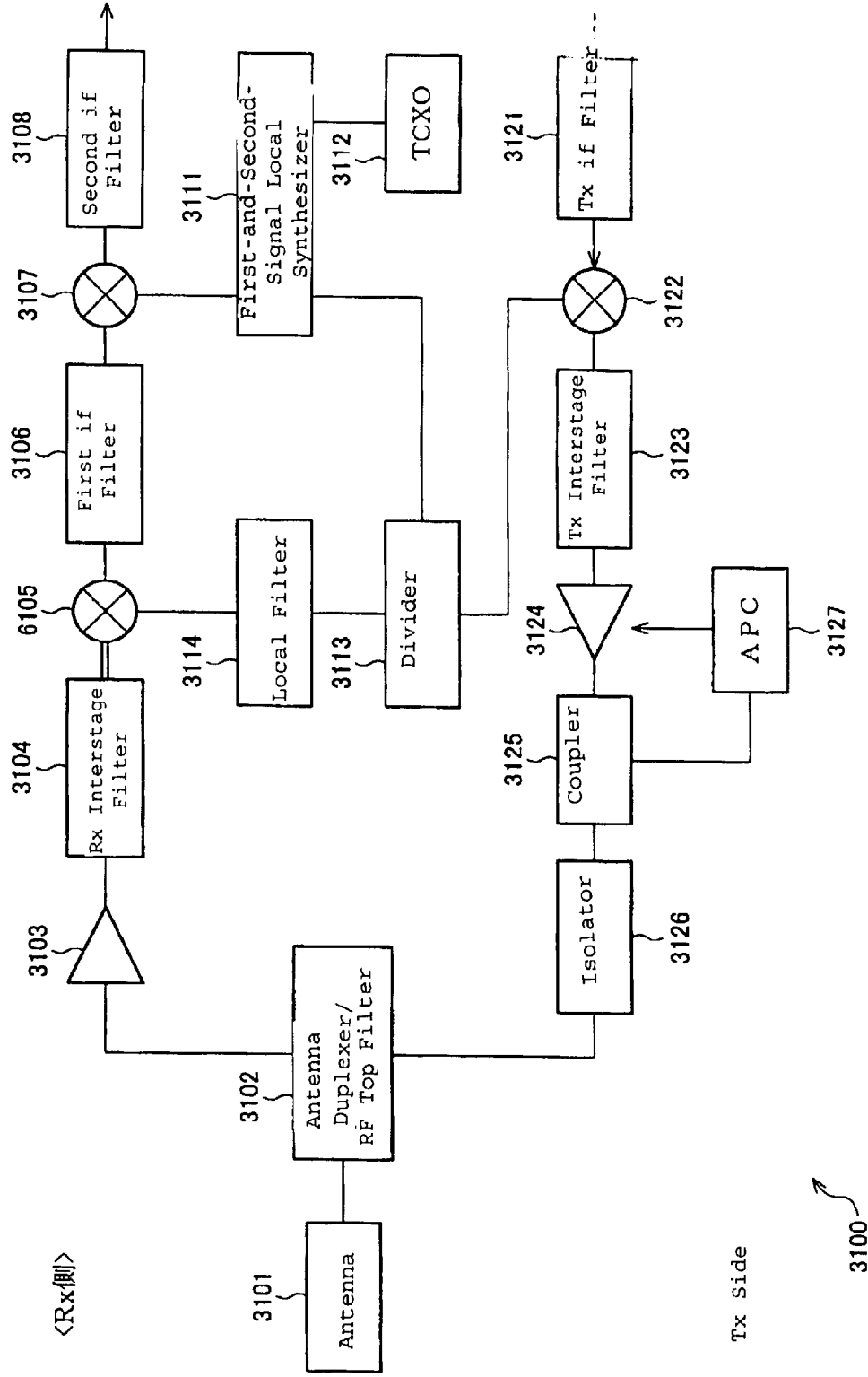
FIG. 66 is a schematic block diagram illustrating a communication unit according to a preferred embodiment of the present invention.
Figure 67:
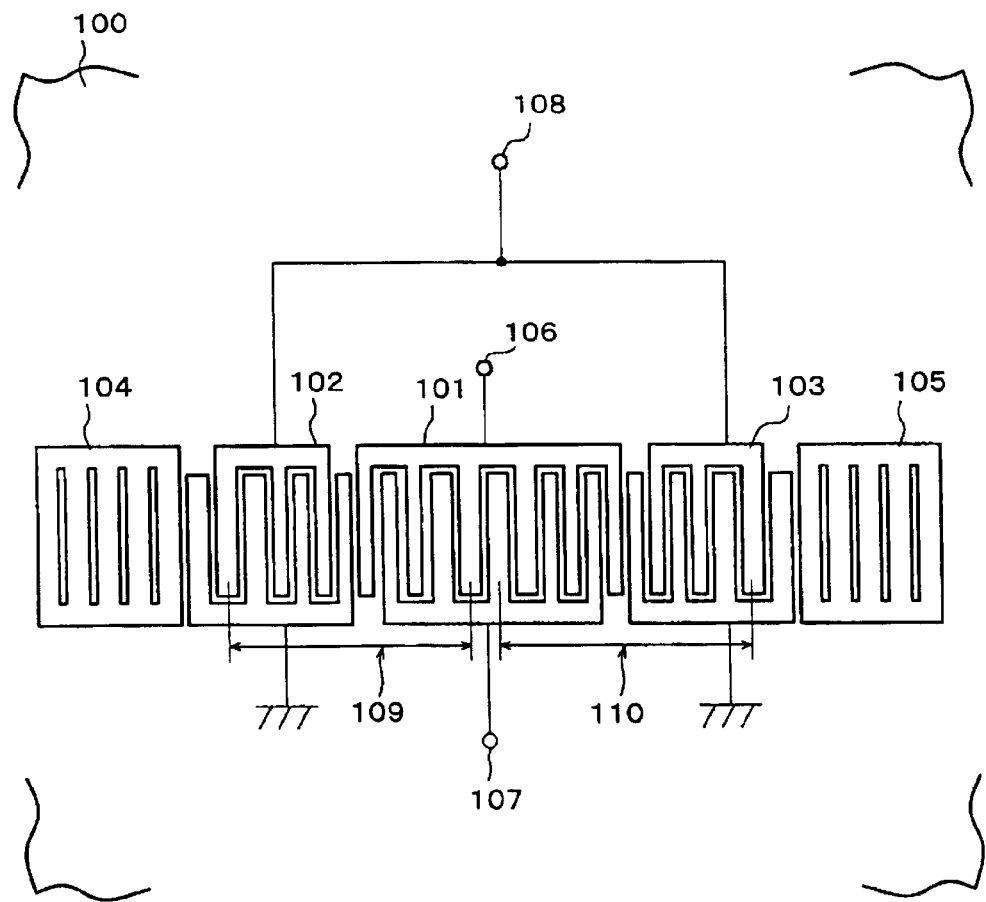
FIG. 67 is a schematic diagram illustrating the SAW apparatus of the first comparative example.

A description is now given, with reference to FIG. 66, of a communication unit including the SAW filter apparatus of one of the first through ninth preferred embodiments of the present invention.

In a communication unit 3100, as shown in FIG. 66, in which the SAW apparatus of one of the foregoing embodiments is provided, a receiver (Rx) includes an antenna 3101, an antenna duplexer/RF top filter 3102, an amplifier 3103, an Rx interstage filter 3104, a mixer 3105, a first IF filter 3106, a mixer 3107, a second IF filter 3108, a first-and-second-signal local synthesizer 3111, a temperature compensated crystal oscillator (TCXO) 3112, a divider 3113, and a local filter 3114. As indicated by two lines between the Rx interstage filter 3104 and the mixer 3105 shown in FIG. 66, two balanced signals are preferably transmitted from the Rx interstage filter 3104 to the mixer 3105 in order to maintain the balance levels.

In the communication unit 3100, a transmitter (Tx) includes the antenna 3101, the antenna duplexer/RF top filter 3102, a Tx IF filter 3121, a mixer 3122, a Tx interstage filter 3123, an amplifier 3124, a coupler 3125, an isolator 3126, and an automatic power control (APC) device 3127. The antenna 3101 and the antenna duplexer/RF top filter 3102 are shared by the receiver (Rx) and the transmitter (Tx).

The SAW filter apparatus of one of the first through ninth preferred embodiments is suitably used as the Rx interstage filter 3104.

The communication unit 3100 uses the smaller SAW apparatus exhibiting outstanding transmission characteristics. Accordingly, the size of the communication unit 3100 is reduced, particularly in a GHz band or higher, while providing outstanding transmission characteristics.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave apparatus comprising:
a piezoelectric substrate;
at least one surface acoustic wave filter including at least a first interdigital transducer and second and third interdigital transducers on opposing sides of the first interdigital transducer, each of the first, second, and third interdigital transducers have electrode fingers, and the first, second and third interdigital transducers are arranged on the piezoelectric substrate in a direction in which a surface acoustic wave propagates; and an input signal terminal and an output signal terminal for said at least one surface acoustic wave filter; wherein at least one of said input signal terminal and said output signal terminal is connected to a balanced signal terminal; and weighting applied to the second interdigital transducer is different from weighting applied to the third interdigital transducer.

2. A surface acoustic wave apparatus according to claim 1, wherein the weighting applied to the second interdigital transducer and the third interdigital transducer improves at least one of an amplitude balance level and a phase balance level between a pair of the balanced signal terminals.

3. A surface acoustic wave apparatus according to claim 1, wherein the weighting is applied to at least two of the electrode fingers counted from an outermost electrode finger of at least one of the second interdigital transducer and the third interdigital transducer.

4. A surface acoustic wave apparatus according to claim 1, wherein the weighting is applied to at least two of the electrode fingers in the vicinity of an outermost electrode finger of at least one of the second interdigital transducer and the third interdigital transducer.

5. A surface acoustic wave apparatus according to claim 1, wherein the weighting is applied to the electrode fingers located within about ½ length of at least one of the first interdigital transducer and the second interdigital transducer in the propagating direction of the surface acoustic wave from an outermost electrode finger of the first, interdigital transducer and the second interdigital transducer located adjacent to the first interdigital transducer.

6. A surface acoustic wave apparatus according to claim 1, wherein the weighting is applied to an outermost electrode finger of at least one of the second interdigital transducer and the third interdigital transducer adjacent to the first interdigital transducer.

7. A surface acoustic wave apparatus according to claim 1, wherein the electrode fingers located in a portion between adjacent interdigital transducers are a ground electrode finger and a signal electrode finger, and the weighting is applied to at least one of the ground electrode finger and the signal electrode finger.

8. A surface acoustic wave apparatus according to claim 1, wherein the weighting is applied to a signal electrode finger of said at least one surface acoustic wave filter.

9. A surface acoustic wave apparatus according to claim 1, wherein the weighting is applied to at least a portion of the electrode fingers of the interdigital transducer connected to the balanced signal terminal of said surface acoustic wave filter.

10. A surface acoustic wave apparatus according to claim 1, wherein the phase of at least one of the first, second and third interdigital transducers is inverted with respect to the phase of another of the first second and third interdigital transducers; and the weighting is applied to at least a portion of the electrode fingers of the phase-inverted interdigital transducer.

11. A surface acoustic wave apparatus according to claim 1, wherein the weighting is withdrawal-weighting.

12. A surface acoustic wave apparatus according to claim 11, wherein a dummy electrode is provided for a bus bar which faces a bus bar connected to the withdrawal-weighted electrode fingers.

13. A surface acoustic wave apparatus according to claim 1, wherein the weighting is applied to at least two continuous ground electrode fingers including an outermost electrode finger of at least one of the interdigital transducer connected to said input signal terminal and the interdigital transducer connected to said output signal terminal, the ground electrode fingers being located such that it faces the other interdigital transducer.

14. A surface acoustic wave apparatus according to claim 12, wherein a ground connecting portion is arranged for connecting the electrode fingers of adjacent interdigital transducers which are connected to a ground via the dummy electrode.

15. A surface acoustic wave apparatus according to claim 1, wherein the weighting is apodization weighting in which an interdigital length of at least one of the electrode fingers is differentiated from an interdigital length of the other electrode fingers.

16. A surface acoustic wave apparatus according to claim 1, wherein the weighting is applied to at least one of the electrode fingers such that they are shorter than the other electrode fingers.

17. A surface acoustic wave apparatus according to claim 15, wherein the apodization weighting is applied at the approximate center of the interdigital length.

18. A surface acoustic wave apparatus according to claim 15, wherein the apodization weighting is further applied to the electrode finger adjacent to the apodization-weighted electrode finger, and a bending floating electrode is provided such that it faces each of the two apodization-weighted electrode fingers.

19. A surface acoustic wave apparatus according to claim 15, wherein the apodization-weighted electrode finger is an outermost electrode finger of one of two adjacent interdigital transducers, and a dummy electrode is provided for another of the interdigital transducers such that the dummy electrode faces the apodization-weighted electrode finger.

20. A surface acoustic wave apparatus according to claim 19, wherein the dummy electrode is grounded.

21. A surface acoustic wave apparatus according to claim 1, wherein the weighting is duty weighting in which a duty of at least a portion of the electrode fingers is different from a duty of the other electrode fingers.

22. A surface acoustic wave apparatus according to claim 1, wherein at least one of the first, second, and third interdigital transducers is withdrawal-weighted.

23. A surface acoustic wave apparatus according to claim 1, wherein two of said surface acoustic wave filters are provided, and withdrawal-weighting is applied to each of said surface acoustic wave filters, and the weighting applied to one of the surface acoustic wave filters is different from the weighting applied to the other surface acoustic wave filter.

24. A surface acoustic wave apparatus according to claim 1, wherein apodization-weighting is applied to a few of the electrode fingers other than an outermost electrode finger of the second interdigital transducer; and withdrawal-weighting is applied to an outermost electrode finger of the third interdigital transducer, a dummy electrode connected to a bus bar which faces a bus bar connected to the withdrawal-weighted electrode finger being provided.

25. A surface acoustic wave apparatus according to claim 1, wherein duty-weighting is applied to an outermost electrode finger of second interdigital so that a duty of the outermost electrode finger is differentiated from a duty of the other electrode fingers; and withdrawal-weighting is applied to an outermost electrode finger of the third interdigital transducer, a dummy electrode connected to a bus bar which faces a bus bar connected to the withdrawal-weighted electrode finger being provided.

26. A surface acoustic wave apparatus according to claim 1, wherein first and second surface acoustic wave filters are provided;
apodization-weighting is applied to a few of the electrode fingers other than an outermost electrode finger of the second interdigital transducers of the first surface acoustic wave filters; and
withdrawal-weighting is applied to an outermost electrode finger of the third interdigital transducer of the second surface acoustic wave filter, a dummy electrode connected to a bus bar which faces a bus bar connected to the withdrawal-weighted electrode finger being provided in the withdrawal-weighted portion.

27. A surface acoustic wave apparatus according to claim 1, wherein said at least one surface acoustic wave filter is arranged such that it has a balanced-signal-input and balanced-signal-output filtering function.

28. A surface acoustic wave apparatus according to claim 1, wherein said at least one surface acoustic wave filter is arranged such that it has a balanced-signal-input and unbalanced-signal-output filtering function or an unbalanced-signal-input and balanced-signal-output filtering function.

29. A surface acoustic wave apparatus according to claim 28, wherein at least one of the first, second, and third interdigital transducers is divided into two portions in the direction of an interdigital length of the interdigital transducer.

30. A surface acoustic wave apparatus according to claim 28, wherein a pair of the balanced signal terminals are respectively connected to comb-like electrodes of one of the interdigital transducers.

31. A surface acoustic wave apparatus according to claim 28, wherein at least one of the first, second, and third interdigital transducers is divided into two portions in the direction in which the surface acoustic wave propagates.

32. A surface acoustic wave apparatus according to claim 27, wherein a grounded electrical neutral point is not provided between a pair of the balanced signal terminals.

33. A surface acoustic wave apparatus according to claim 1, wherein two of said surface acoustic wave filters are arranged such that they have a balanced-signal-input and balanced-signal output filtering function.

34. A surface acoustic wave apparatus according to claim 1, wherein two of said surface acoustic wave filters are arranged such that an output signal of one of the surface acoustic wave filters is about 180° out of phase with an output signal of the other surface acoustic wave filter, and the surface acoustic wave filters are arranged such that they have a balanced-signal-input and unbalanced-signal-output filtering function or an unbalanced-signal-input and balanced-signal-output filtering function.

35. A surface acoustic wave apparatus according to claim 34, further comprising another surface acoustic wave filter being cascade-connected to an unbalanced signal terminal.

36. A surface acoustic wave apparatus according to claim 1, wherein said at least one surface acoustic wave filter is a longitudinally-coupled-resonator-type surface acoustic wave filter.

37. A surface acoustic wave apparatus according to claim 36, wherein said longitudinally-coupled-resonator-type surface acoustic wave filter comprises an odd number of the interdigital transducers.

38. A surface acoustic wave apparatus according to claim 36, wherein the total number of electrode fingers of at least one of the first, second, and third interdigital transducers of said longitudinally-coupled-resonator-type surface acoustic wave filter is an even number.

39. A surface acoustic wave apparatus according to claim 38, wherein the total number of the electrode fingers of the interdigital transducer connected to a balanced signal terminal is an even number.

40. A surface acoustic wave apparatus according to claim 38, wherein the total number of the electrode fingers of the first interdigital transducer is an even number.

41. A surface acoustic wave apparatus according to claim 1, wherein at least one surface acoustic wave resonator is connected in series to or in parallel with said at least one surface acoustic wave filter.

42. A surface acoustic wave apparatus according to claim 1, wherein said at least one surface acoustic wave filter is defined by at least two surface acoustic wave filter portions which are cascade-connected.

43. A surface acoustic wave apparatus comprising:
a piezoelectric substrate;
a first interdigital transducer; and
second and third interdigital transducers on opposing sides of the first interdigital transducer; wherein
each of the first, second, and third interdigital transducers includes a plurality of electrode fingers; and
weighting applied to the first interdigital transducer is different from weighting applied to second and third interdigital transducers.

44. A surface acoustic wave apparatus according to claim 43, wherein one of the first, second, and third interdigital transducers is connected to a balanced side, and the one of the first, second, and third interdigital transducers connected to the balanced side includes a weighted electrode finger.

45. A surface acoustic wave apparatus according to claim 43, wherein a weighted electrode finger is located within one half of a total width of all the electrode fingers of the first interdigital transducer from the outermost electrode finger of the first interdigital transducer.

46. A surface acoustic wave apparatus according to claim 43, wherein at least two ground electrode fingers including the outermost electrode finger of the first interdigital transducer are sequentially arranged, the outermost electrode finger being located such that it faces the second or third interdigital transducer.

47. A surface acoustic wave apparatus according to claim 43, wherein a weighted electrode finger is arranged such that it forms an area of a no-electric-field portion provided between adjacent ground electrode fingers of one of the first and second interdigital transducers.

48. A surface acoustic wave apparatus according to claim 47, wherein an area of the no-electric-field portion of the other one of the first and second interdigital transducers is substantially equal to the area of the non-electric-field portion of the one of the first and second interdigital transducer.

49. A surface acoustic wave apparatus according to claim 43, wherein a weighted electrode finger is shorter than the other electrode fingers.

50. A surface acoustic wave apparatus according to claim 43, wherein a first grounded balance electrode finger is arranged to extend toward a weighted electrode finger such that a length of the first grounded balance electrode finger is substantially equal to a length of the weighted electrode finger.

51. A surface acoustic wave apparatus according to claim 43, wherein a second grounded balance electrode finger is arranged to extend in a direction different from a direction of a weighted electrode finger such that a length of the second grounded balance electrode finger is substantially equal to a length of the weighted electrode finger, and a bending dummy electrode is provided such that it faces the second grounded balance electrode finger and the weighted electrode finger.

52. A surface acoustic wave apparatus according to claim 43, wherein said surface acoustic wave apparatus is provided with an unbalanced-to-balanced conversion function.

53. A communication unit using the surface acoustic wave apparatus sat forth in claim 1.

54. A communication unit using the surface acoustic wave apparatus set forth in claim 43.

* * * * *